(12) United States Patent
Shibuki

(10) Patent No.: US 8,829,635 B2
(45) Date of Patent: Sep. 9, 2014

(54) SOLID-STATE IMAGING DEVICE, MANUFACTURING METHOD THEREOF, ELECTRONIC APPARATUS, AND SEMICONDUCTOR DEVICE

(75) Inventor: Shunichi Shibuki, Nagasaki (JP)

(73) Assignee: Sony Corporation (JP)

( * ) Notice: Subject to any disclaimer, the term of this patent is extended or adjusted under 35 U.S.C. 154(b) by 54 days.

(21) Appl. No.: 13/367,802

(22) Filed: Feb. 7, 2012

(65) Prior Publication Data

US 2012/0217604 A1    Aug. 30, 2012

(30) Foreign Application Priority Data

Feb. 24, 2011   (JP) .................................. 2011-038836

(51) Int. Cl.
*H01L 27/146* (2006.01)

(52) U.S. Cl.
USPC ........................................................ 257/443

(58) Field of Classification Search
CPC .................................................. H01L 31/0224
USPC .............................. 257/459; 348/294; 438/70
See application file for complete search history.

(56) References Cited

U.S. PATENT DOCUMENTS

| 2008/0305410 | A1* | 12/2008 | Bae ..................................... 430/5 |
| 2009/0185060 | A1* | 7/2009 | Akiyama ......................... 348/294 |
| 2009/0280596 | A1* | 11/2009 | Akiyama ........................... 438/70 |
| 2010/0096718 | A1* | 4/2010 | Hynecek et al. ............... 257/460 |
| 2010/0244175 | A1* | 9/2010 | Park .............................. 257/459 |

FOREIGN PATENT DOCUMENTS

| JP | 2005-285988 | 10/2005 |
| JP | 2009-176777 | 8/2009 |
| JP | 2009-277732 | 11/2009 |

* cited by examiner

*Primary Examiner* — Shaun Campbell
*Assistant Examiner* — Ismail Muse
(74) *Attorney, Agent, or Firm* — Sheridan Ross P.C.

(57) ABSTRACT

A solid-state imaging device includes a semiconductor layer where a pixel is formed in a pixel region and a semiconductor element is formed in a side opposite to where incident light is incident, a wiring layer provided on the semiconductor layer to cover the semiconductor element, a support substrate provided to oppose the wiring layer in a wiring layer surface opposite to the semiconductor layer, and an adhesion layer which adheres the wiring layer and the support substrate, where the wiring layer includes a pad electrode and an opening is formed so the pad electrode is exposed, a convex section is provided where the pad electrode is formed in at least a wiring layer surface opposing the support substrate or a support substrate surface opposing the wiring layer, and the adhesion layer is formed thinner at the formation portion of the pad electrode than a portion of the pixel region.

14 Claims, 38 Drawing Sheets

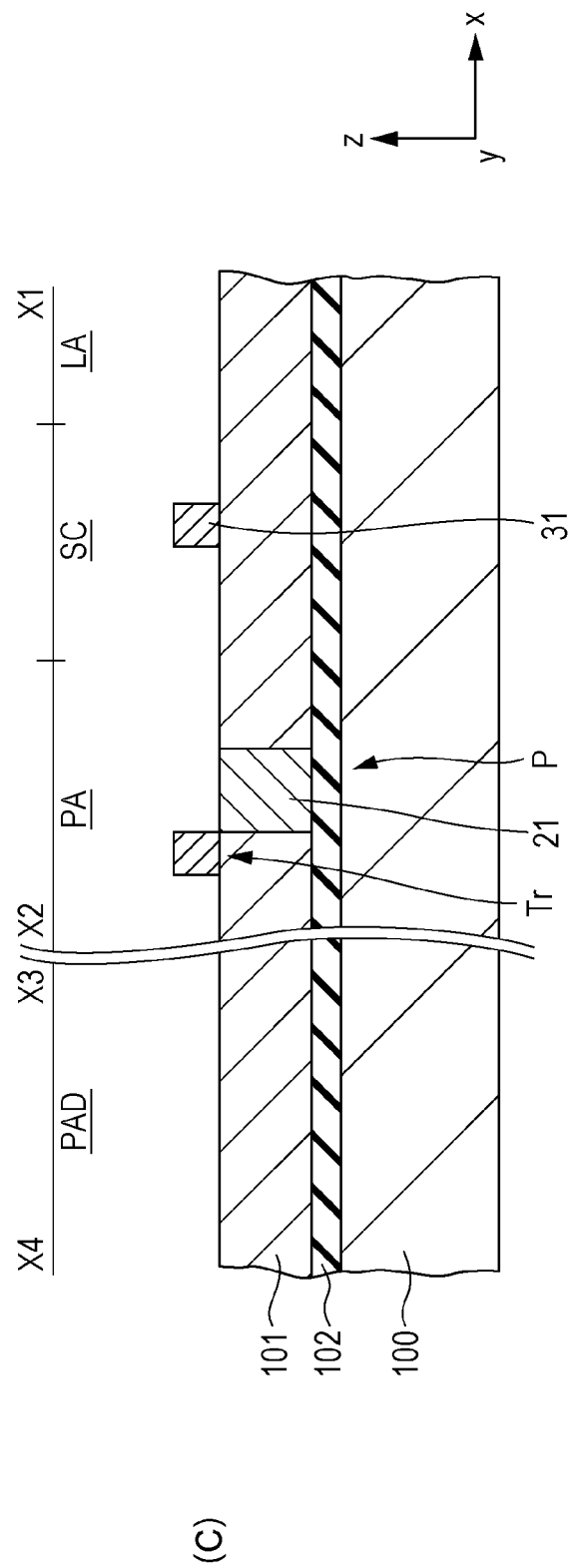

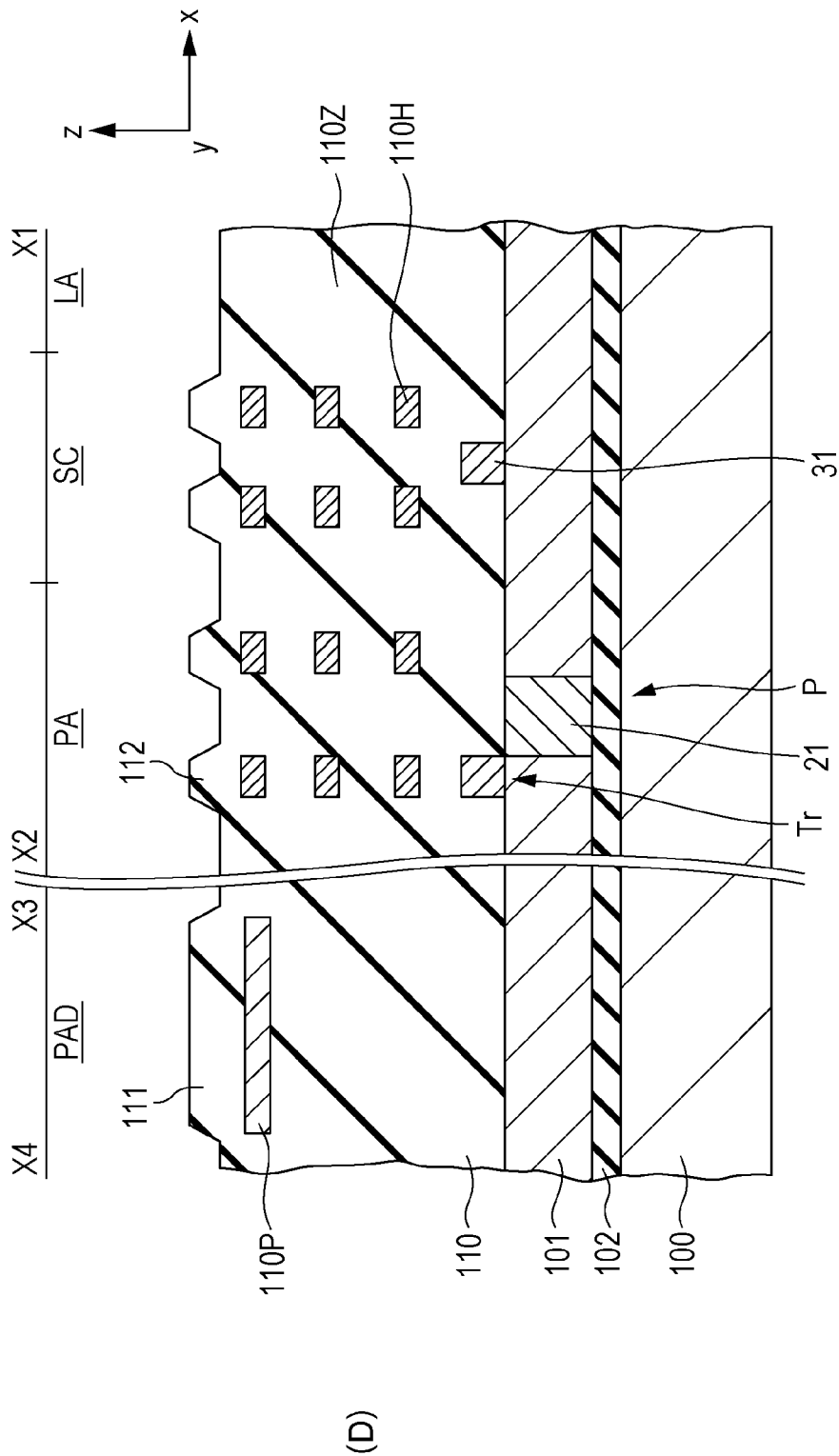

SOLID-STATE IMAGING DEVICE, MANUFACTURING METHOD THEREOF, ELECTRONIC APPARATUS, AND SEMICONDUCTOR DEVICE

BACKGROUND

The present disclosure relates to a solid-state imaging device, a manufacturing method thereof, an electronic apparatus, and a semiconductor device.

An electronic apparatus such as a digital video camera, a digital still camera, or the like includes a semiconductor device such as a solid-state imaging device. For example, the solid-state imaging device includes a CMOS (Complementary Metal Oxide Semiconductor) type image sensor and a CCD (Charge Coupled Device) type image sensor.

In the solid-state imaging device, an imaging region where a plurality of pixels is arranged is provided in a surface of the semiconductor substrate. In each of the pixels, a photoelectric conversion section is formed. The photoelectric conversion section is, for example, a photodiode and a signal charge is generated by receiving light which is incident via an optical system, which is attached to the outside, using a light receiving surface and performing photoelectric conversion.

Out of the solid-state imaging devices, in the CMOS type image sensor, the pixels are configured so that a pixel transistor is included along with the photoelectric conversion section. The pixel transistor reads out the signal charge which is generated by the photoelectric conversion section and outputs the signal charge to a signal line as an electrical signal.

In the solid-state imaging device, typically, a circuit, wiring, or the like is provided in a front surface side where the light is incident in the semiconductor substrate (semiconductor layer). That is, the photoelectric conversion section receives the light which is incident from the front surface side where the circuit, wiring, or the like is provided. As a result, there are cases where it is difficult to improve light sensitivity since the light which is incident on the circuit, wiring and the like is blocked or reflected.

In order to fix this defect, a "rear surface illumination type" is proposed where light which is incident from the rear surface side opposite to the front surface where the circuit, wiring, or the like is provided is received using the photoelectric conversion section. In the "rear surface illumination type", the photodiode is provided on the semiconductor layer which has been made to be a thin film so that the light which is incident from the rear surface side is received with high sensitivity. Then, in the front surface side of the semiconductor substrate, a support substrate is bonded using an adhesive agent to the front surface of a wiring layer which includes the wiring (refer to Japanese Unexamined Patent Application Publication No. 2005-285988, Japanese Unexamined Patent Application Publication No. 2009-176777, and Japanese Unexamined Patent Application Publication No. 2009-277732).

SUMMARY

FIG. 39 is a cross-sectional diagram illustrating main parts of a CMOS type image sensor chip of a "rear surface illumination type".

In FIG. 39, other than a pixel region PA, a peripheral circuit section SC and a pad section PAD which are provided at a periphery of the pixel region PA are shown. In addition, along with this, a scribe region LA, which is scribed when a plurality of the image sensor chips which are provided lined up on a semiconductor wafer is divided into a plurality, is shown.

In the CMOS type image sensor chip, a photodiode 21 is provided in the pixel region PA at an inner portion of a semiconductor layer 101 as shown in FIG. 39.

As shown in FIG. 39, in an upper surface side (rear surface side) of the semiconductor layer 101, a color filter CF and an on-chip lens OCL are provided in the pixel region PA via a reflection preventing film HT. In this manner, there is a configuration where light from the upper surface side (rear surface side) of the semiconductor layer 101 is incident to the photodiode 21 via the on-chip lens OCL and the color filter CF.

As shown in FIG. 39, in a lower surface side (front surface side) of the semiconductor layer 101, a pixel transistor Tr is provided in the pixel region PA and a peripheral transistor 31 which configures the peripheral circuit is provided in the peripheral circuit section SC. Then, a wiring layer 110 is formed so as to cover the entire lower surface of the semiconductor layer 101. In the wiring layer 110, a plurality of wirings 110H are provided in an insulation film 110Z. Then, a support substrate SK is bonded to the entire lower surface of the wiring layer 110 using an adhesion layer 201.

As shown in FIG. 39, in the pad section PAD, a pad electrode 110P is provided in the wiring layer 110. An opening KK is provided in the upper surface side of the pad electrode 110P and a bonding wire BW is provided on an upper surface of the pad electrode 110P which is exposed due to the opening KK.

When the bonding wire BW is formed on the pad electrode 110P in the pad section PAD, mechanical shocks are applied to the pad electrode 110P. As a result, there are cases where small cracks occur in a portion of the insulation film 110Z which is interposed between the pad electrode 110P and the adhesion layer 201 in the wiring layer 110.

Other than this, in the scribe region LA, since there are mechanical shocks when the plurality of image sensor chips which are lined-up on the semiconductor wafer are divided, there are cases where small cracks occur in the insulation film 110Z of the wiring layer 110.

In this manner, in the insulation film 110Z of the wiring layer 110, there are cases where small cracks occur in the insulation film 110Z due to the mechanical shocks since the adhesion layer 201 which is a soft substance is present between the wiring layer 110 and the support substrate SK.

In addition, in a case where the adhesion layer 201 is formed by coating, there are cases where bonding quality is reduced due to the generation of coating unevenness and voids.

Then, along with the generation of these defects, there are cases where manufacturing of the semiconductor device such as the solid-state imaging device at a high manufacturing efficiency is difficult since the yield of the products is reduced.

Accordingly, it is desirable to provide a solid-state imaging device, a method of manufacturing a solid-state imaging device, an electronic apparatus, and a semiconductor device where the reliability of the product and the yield of the product are improved and manufacturing with high manufacturing efficiency is possible.

According to an embodiment of the present disclosure, there is provided a solid-state imaging device which has a semiconductor layer including a photoelectric conversion element formed in a pixel region and a semiconductor element formed in a surface side opposite to a surface through which light enters, a wiring layer provided over a surface of the semiconductor layer so as to cover the semiconductor element, a support substrate provided over the wiring layer in an opposite side of the semiconductor layer, and an adhesion layer provided between the wiring layer and the support substrate, where the wiring layer includes a pad electrode and an opening is formed so that a surface of the pad electrode in a side of the semiconductor layer is exposed, a convex section is provided in a portion where the pad electrode is formed in at least one of a surface of the wiring layer which opposes the support substrate or a surface of the support substrate which opposes the wiring layer, and the adhesion layer is formed so that the portion where the pad electrode is formed is thinner than at least a portion of the pixel region due to the convex section.

According to another embodiment of the present disclosure, there is provided a solid-state imaging device which has a semiconductor layer including a photoelectric conversion element formed in a pixel region and a semiconductor element formed in a surface side opposite to a surface through which light enters, a wiring layer provided over a surface of the semiconductor layer so as to cover the semiconductor element, a support substrate provided over the wiring layer in an opposite side of the semiconductor layer, and an adhesion layer provided between the wiring layer and the support substrate, where a convex section is provided in a portion which is cut in a scribe region which is positioned in the periphery of the pixel region in at least one of a surface of the wiring layer which opposes the support substrate or a surface of the support substrate which opposes the wiring layer, and the adhesion layer is formed so that the portion which is cut in the scribe region is thinner than at least a portion of the pixel region due to the convex section.

According to still another embodiment of the present disclosure, there is provided a method of manufacturing a solid-state imaging device which includes forming a photoelectric conversion element in a pixel region of a semiconductor layer, forming a semiconductor element in a surface side of the semiconductor layer which is a side opposite to a surface through which light enters, forming a wiring layer which includes a pad electrode on a surface of the semiconductor layer which is a side opposite to a surface through which light enters so as to cover the semiconductor element, disposing a support substrate in a surface of the wiring layer in an opposite side of the semiconductor layer via an adhesion layer and adhering the support substrate to the wiring layer using the adhesion layer, forming an opening so that the surface of the pad electrode on the side of the semiconductor layer is exposed, and providing a bonding wire on a surface of the pad electrode which is exposed using the opening, where providing a convex section in a portion, where the pad electrode is formed in at least one of a surface of the wiring layer which opposes the support substrate or a surface of the support substrate which opposes the wiring layer, is further included before the disposing of the support substrate, and the adhesion layer is formed in the disposing of the support substrate between the wiring layer and the support substrate so that the formation portion of the pad electrode is thinner than at least a portion of the pixel region due to the convex section.

According to still another embodiment of the present disclosure, there is provided a method of manufacturing a solid-state imaging device which includes forming a photoelectric conversion element in a pixel region of a semiconductor layer, forming a semiconductor element in a surface side of the semiconductor layer which is a side opposite to a surface through which light enters, forming a wiring layer which includes a pad electrode on a surface of the semiconductor layer which is a side opposite to a surface through which light enters so as to cover the semiconductor element, disposing a support substrate in a surface of the wiring layer in an opposite side of the semiconductor layer via an adhesion layer and adhering the support substrate to the wiring layer using the adhesion layer, and cutting in a scribe region which is positioned in the periphery of the pixel region, where providing of a convex section in a portion, which is cut in a scribe region in at least one of a surface of the wiring layer which opposes the support substrate or a surface of the support substrate which opposes the wiring layer, is further included before the disposing of the support substrate, and the adhesion layer is formed in the disposing of the support substrate between the wiring layer and the support substrate so that the portion which is cut in the scribe region is thinner than at least a portion of the pixel region due to the convex section.

According to still another embodiment of the present disclosure, there is provided an electronic apparatus which has a semiconductor layer including a photoelectric conversion element formed in a pixel region and a semiconductor element formed in a surface side opposite to a surface through which light enters, a wiring layer provided over a surface of the semiconductor layer so as to cover the semiconductor element, a support substrate provided over the wiring layer in an opposite side of the semiconductor layer, and an adhesion layer provided between the wiring layer and the support substrate, where the wiring layer includes a pad electrode and an opening is formed so that a surface of the pad electrode in a side of the semiconductor layer is exposed, a convex section is provided in a portion where the pad electrode is formed in at least one of a surface of the wiring layer which opposes the support substrate or a surface of the support substrate which opposes the wiring layer, and the adhesion layer is formed so that the portion where the pad electrode is formed is thinner than at least a portion of the pixel region due to the convex section.

According to still another embodiment of the present disclosure, there is provided an electronic apparatus which has a semiconductor layer including a photoelectric conversion element formed in a pixel region and a semiconductor element formed in a surface side opposite to a surface through which light enters, a wiring layer provided over a surface of the semiconductor layer so as to cover the semiconductor element, a support substrate provided over the wiring layer in an opposite side of the semiconductor layer, and an adhesion layer provided between the wiring layer and the support substrate, where a convex section is provided in a portion which is cut in a scribe region which is positioned in the periphery of the pixel region in at least one of a surface of the wiring layer which opposes the support substrate or a surface of the support substrate which opposes the wiring layer, and the adhesion layer is formed so that the portion which is cut in the scribe region is thinner than at least a portion of the pixel region due to the convex section.

According to still another embodiment of the present disclosure, there is provided a semiconductor device which has a semiconductor layer which has a semiconductor element formed on a surface thereof, a wiring layer provided over a surface of the semiconductor layer so as to cover the semiconductor element, a support substrate provided over the wiring layer in an opposite side of the semiconductor layer, and an adhesion layer provided between the wiring layer and the support substrate, where the wiring layer includes a pad electrode and an opening is formed so that a surface of the pad electrode in a side of the semiconductor layer is exposed, a convex section is provided in a portion where the pad electrode is formed in at least one of a surface of the wiring layer which opposes the support substrate or a surface of the support substrate which opposes the wiring layer, and the adhesion layer is formed so that the portion where the pad electrode is formed is thinner than other portions due to the convex section.

According to still another embodiment of the present disclosure, there is provided a semiconductor device which has a semiconductor layer which has a semiconductor element formed on a surface thereof, a wiring layer provided over a surface of the semiconductor layer so as to cover the semiconductor element, a support substrate provided over the wiring layer in an opposite side of the semiconductor layer, and an adhesion layer provided between the wiring layer and the support substrate, a convex section is provided in a portion which is cut in a scribe region which is positioned in the periphery of the pixel region in at least one of a surface of the wiring layer which opposes the support substrate or a surface of the support substrate which opposes the wiring layer, and the adhesion layer is formed so that the portion which is cut in the scribe region is thinner than other portions due to the convex section.

In the embodiments of the present disclosure, before the support substrate is disposed, the convex section is provided in a portion where the pad electrode is formed in at least one of a surface of the wiring layer which opposes the support substrate or a surface of the support substrate which opposes the wiring layer. Due to the convex section, the adhesion layer is formed between the wiring layer and the support substrate so that the formation portion of the pad electrode is thinner than other portions.

In addition, in the embodiments of the present disclosure, before the support substrate is disposed, the convex section is provided in a portion which is cut in the scribe region in at least one of a surface of the wiring layer which opposes the support substrate or a surface of the support substrate which opposes the wiring layer. Due to the convex section, a portion which is cut in the scribe region is formed between the wiring layer and the support substrate with regard to the adhesion layer so as to be thinner than other portions.

According to the embodiments of the present disclosure, it is possible to provide a solid-state imaging device, a method of manufacturing a solid-state imaging device, an electronic apparatus, and a semiconductor device where the reliability of the product and the yield of the product are improved and manufacturing with high manufacturing efficiency is possible.

BRIEF DESCRIPTION OF THE DRAWINGS

FIG. 7 is a diagram illustrating a manufacturing method of a solid-state imaging device in the embodiment 1 of the present disclosure;

FIG. 8 is a diagram illustrating a manufacturing method of a solid-state imaging device in the embodiment 1 of the present disclosure;

DETAILED DESCRIPTION OF EMBODIMENTS

The embodiments of the present disclosure will be described with reference to the attached diagrams.

Here, the description will be performed in the order below.

1. Embodiment 1 (case where convex section is provided in a pad section of lower surface of wiring layer)

2. Embodiment 2 (case where convex section is provided in a scribe region of lower surface of wiring layer)

3. Embodiment 3 (case where convex section is provided in an upper surface of support substrate)

4. Embodiment 4 (Case where convex section is provided in each of lower surface of wiring layer and upper surface of support substrate)

5. Other

1. Embodiment 1

[1] Device Configuration (1-1) Configuration of Important Parts of Camera

Figure 1:
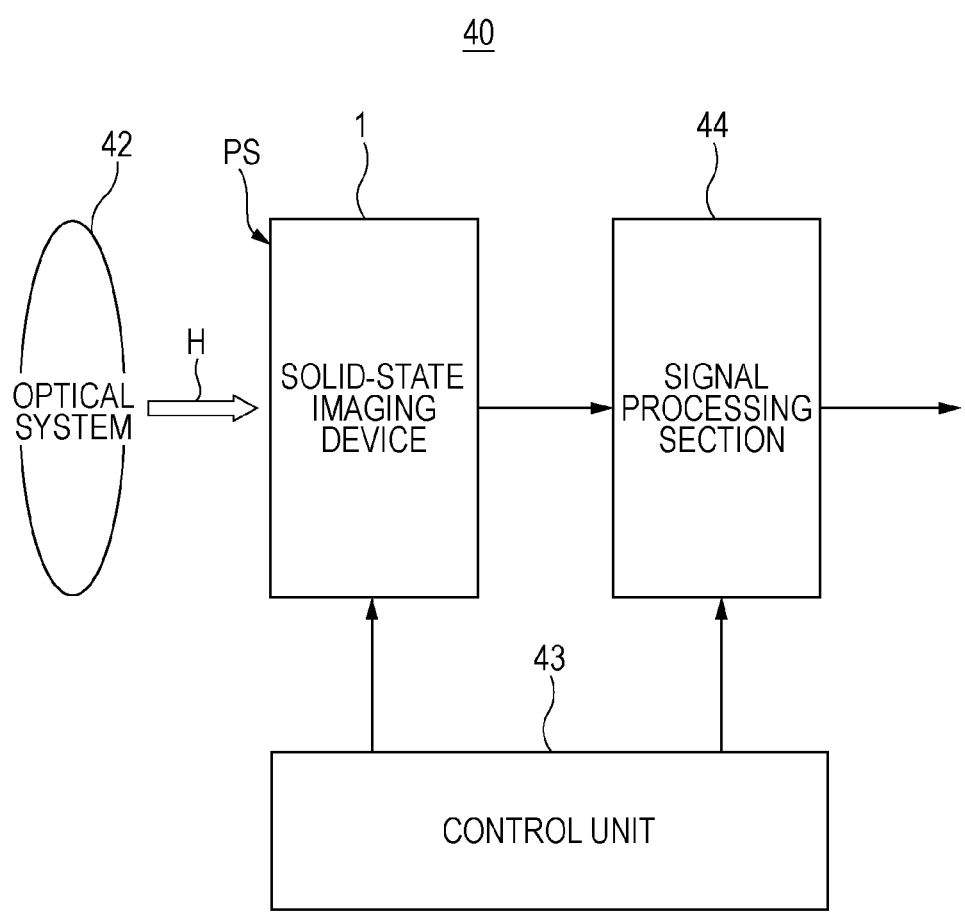
FIG. 1 is a configuration diagram illustrating a configuration of a camera in an embodiment 1 of the present disclosure.

FIG. 1 is a configuration diagram illustrating a configuration of a camera 40 in an embodiment 1 of the present disclosure.

As shown in FIG. 1, the camera 40 has a solid-state imaging device 1, an optical system 42, a control section 43, and a signal processing circuit section 44. Each section will be described as follows.

The solid-state imaging device 1 generates a signal charge due to light (subject image) which is incident via the optical system 42 is received from an imaging surface PS and photoelectric conversion is performed. Here, the solid-state imaging device 1 is driven based on a control signal which is output from the control section 43. Specifically, the signal charge is read out and output as raw data.

The optical system 42 includes optical members such as an imaging lens, aperture, or the like and is disposed so that light H due to the subject image which is incident is concentrated toward the imaging surface PS of the solid-state imaging device 1.

The control section 43 outputs various types of control signals to the solid-state imaging device 1 and the signal processing circuit section 44 and is driven to control the solid-state imaging device 1 and the signal processing circuit section 44.

The signal processing circuit section 44 is configured so that a digital image of the subject image is generated due to execution of signal processing of the electric signal which is output from the solid-state imaging device 1.

(1-2) Configuration of Solid-state Imaging Device

An outline of the configuration of the solid-state imaging device 1 will be described.

Figure 2:
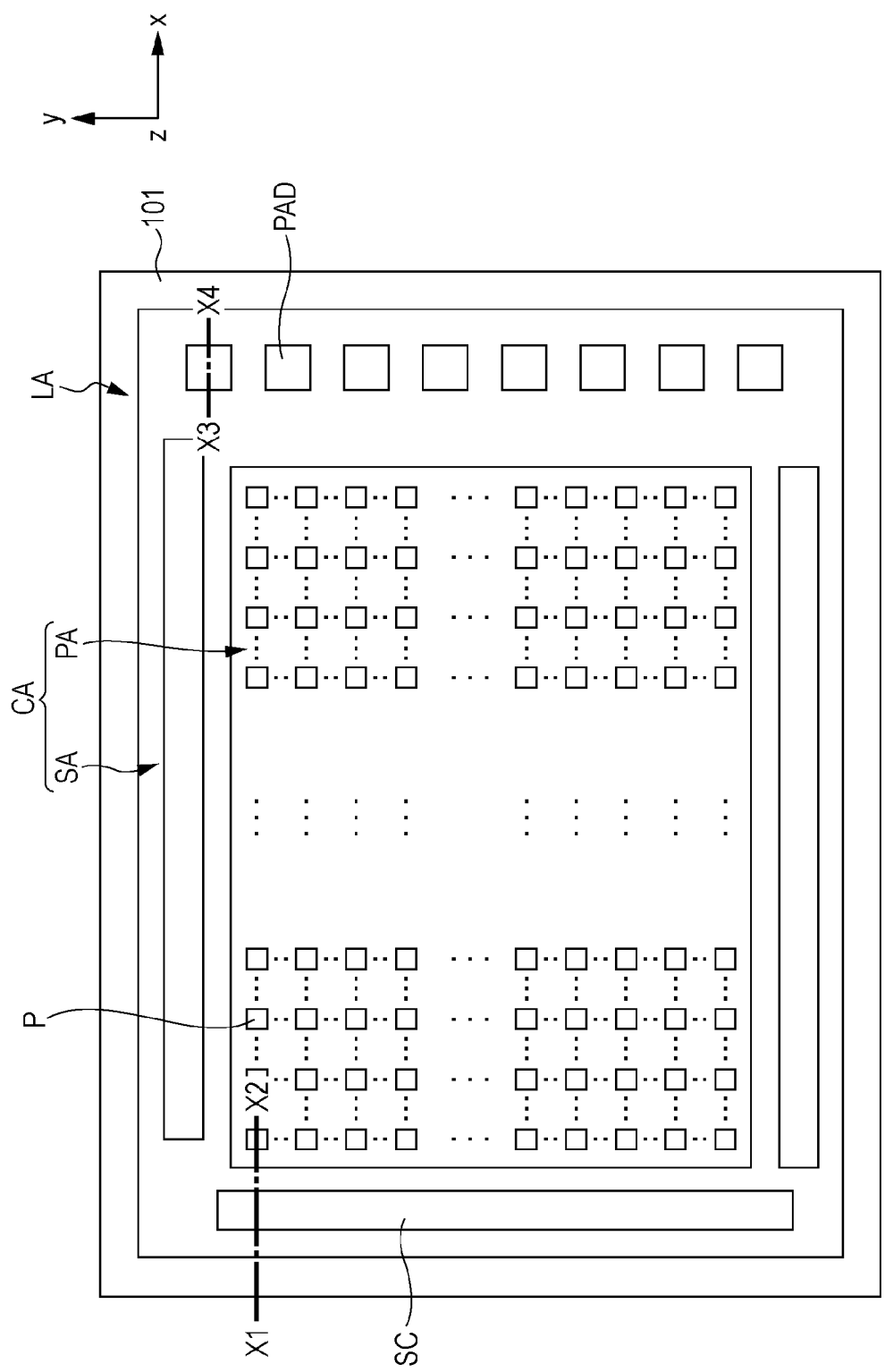
FIG. 2 is a diagram illustrating an outline of a configuration of a solid-state imaging device in the embodiment 1 of the present disclosure.

FIG. 2 is a diagram illustrating an outline of a configuration of the solid-state imaging device 1 in the embodiment 1 of the present disclosure. FIG. 2 is an upper surface diagram illustrating the entire upper surface.

The solid-state imaging device 1 is a CMOS type image sensor and includes a semiconductor layer 101 as shown in FIG. 2.

The semiconductor layer 101 is, for example, formed by a single crystal silicon plate body.

As shown in FIG. 2, a chip region CA and a scribe region LA are provided in a surface (xy surface) of the semiconductor layer 101.

As shown in FIG. 2, the chip region CA is a rectangular shape which is partitioned in the horizontal direction x and the vertical direction y and a pixel region PA and a peripheral region SA are provided.

In the chip region CA, the pixel region PA is a rectangular region as shown in FIG. 2 and a plurality of pixels P are arranged by being lined up in each of the horizontal direction x and the vertical direction y. That is, the pixels P are formed in a matrix formation.

Each of the plurality of pixels P which are provided in the pixel region PA are configured so that a signal charge is generated by incident light being received. A detailed configuration of the pixels P will be described later.

In the chip region CA, the peripheral region SA is positioned in the periphery of the pixel region PA as shown in FIG. 2.

In the peripheral region SA, a plurality of pad sections PAD are provided in, for example, a right side edge portion. Although described in detail later, a pad electrode where the front surface is exposed is provided in the pad section PAD and is electrically connected with an external component.

Other than this, a peripheral circuit section SC is provided in the peripheral region SA. In the peripheral circuit section SC, for example, electronic circuits such as a vertical driving circuit, a column circuit, a horizontal driving circuit, an external output circuit, a timing generator (TG), a shutter driving circuit, and the like are provided as peripheral circuits.

The vertical driving circuit is provided in a left side portion of the pixel region PA in the peripheral region SA and is configured so that the pixels P in the pixel region PA are driven to be selected in row units.

The column circuit is provided in a lower edge portion of the pixel region PA in the peripheral region SA and executes signal processing with regard to a signal which is output from the pixel P in column units. Here, the column circuit includes a CDS (Correlated Double Sampling) circuit (not shown) and executes signal processing which removes the fixed pattern noise.

The horizontal driving circuit is provided in a lower edge section of the column circuit in the peripheral region SA. The horizontal driving circuit is configured to include a shift register and so that signals which are held for each column of the pixels P in the column circuit are sequentially output to the external output circuit.

The external output circuit is electrically connected to the column circuit in the peripheral region SA and outputs to the outside after executing signal processing with regard to the signal which is output from the column circuit. The external output circuit includes, for example, an AGC (Automatic Gain Control) circuit and an ADC circuit and outputs to the outside by the ADC circuit converting from an analog signal to a digital signal after the AGC circuit has applied a gain to the signal.

The shutter driving circuit is configured so that the pixels P are selected in row units and the exposure time of the pixels P is adjusted.

The timing generator is electrically connected to each of the vertical driving circuit, the column circuit, the horizontal driving circuit, the external output circuit, and the shutter driving mechanism in the periphery region SA. The timing generator performs driving control to each section by generating various types of timing signals and outputting to the vertical driving circuit, the column circuit, the horizontal driving circuit, the external output circuit, and the shutter driving circuit.

The scribe region LA is positioned so as to surround the periphery of the chip region CA in the surface (xy surface) of the semiconductor layer 101 as shown in FIG. 2. Here, the scribe region LA is provided so as to include a portion which extends in each of the horizontal direction x and the vertical direction y and to trace out a rectangle in the periphery of the chip region CA.

Although described in detail later, a plurality of the chip regions CA is provided to line up on a surface of a large wafer before dicing and the scribe region LA is provided so as to extend in a line shape between the plurality of chip regions CA. In the scribe region LA, dicing is performed due to contact by a blade and partitioning into the solid-state imaging devices 1 which are provided with the chip regions CA as described above is carried out.

(1-3) Detailed Configuration of Solid-State Imaging Device

A detailed configuration of the solid-state imaging device 1 according to the embodiment will be described.

Figure 3:
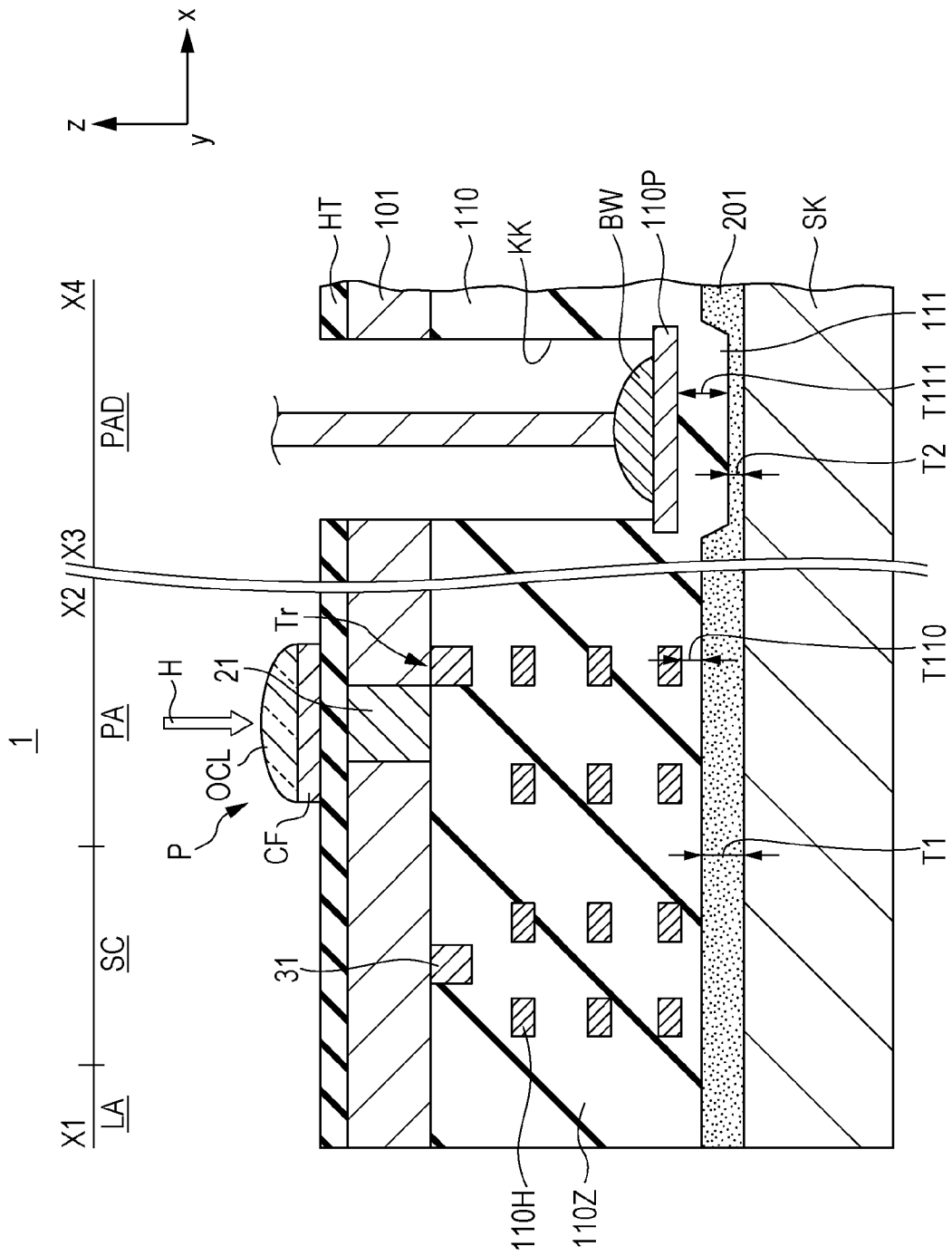
FIG. 3 is a diagram illustrating detailed configuration of a solid-state imaging device in the embodiment 1 of the present disclosure.
Figure 4:
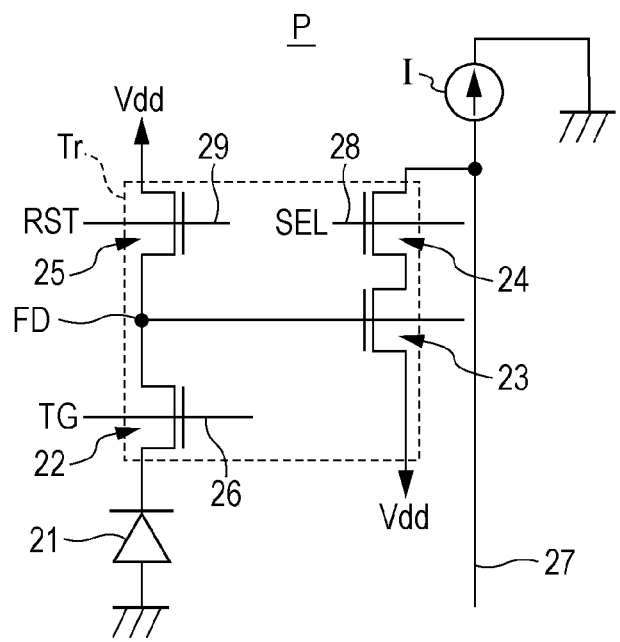
FIG. 4 is a diagram illustrating detailed configuration of a solid-state imaging device in the embodiment 1 of the present disclosure.

FIGS. 3 and 4 is a diagram illustrating detailed configuration of the solid-state imaging device in the embodiment 1 of the present disclosure.

FIG. 3 shows a cross section of an X1-X2 portion and a cross section of an X3-X4 portion shown in FIG. 2. That is, in FIG. 3, the pixel region PA, the peripheral region section SC, the pad section PAD, and the scribe region LA are shown.

In addition, FIG. 4 shows a circuit configuration of the pixel P.

As shown in FIG. 3, the solid-state imaging device 1 includes the semiconductor layer 101, a wiring layer 110, an adhesion layer 201, and a support substrate SK. In the solid-state imaging device 1, the wiring layer 110 is provided in a lower surface (front surface) side of the semiconductor layer 101. Then, the adhesion layer 201 is provided in a lower surface of the wiring layer 110 and the support substrate SK is adhered to the lower surface of the wiring layer 110 using the adhesion layer 201.

In the solid-state imaging device 1, the pixels P are provided in the pixel region PA as shown in FIG. 3. Then, a photodiode 21, a pixel transistor Tr, a color filter CF, and an on-chip lens OCL are provided in the pixel P. That is, the solid-state imaging device 1 is a "rear surface illumination type" and the pixel P receives incident light H which is incident from a side of an upper surface (rear surface) on a side opposite to the lower surface (front surface) where the wiring layer 110 is provided in the semiconductor layer 101. Then, the pixel P generates a signal charge and the signal charge which is generated is read out using a pixel transistor (not shown) and is output as a signal.

Then, in the peripheral circuit section SC, a peripheral transistor 31 which configures the peripheral circuit is provided as shown in FIG. 3.

In addition, in the pad section PAD, a pad electrode 110P and a bonding wire BW are provided as shown in FIG. 3.

Each section which configures the solid-state imaging device 1 will be sequentially described.

(A) Semiconductor Layer 101

The semiconductor layer 101 is formed by, for example, a single crystal semiconductor. The thickness of the semiconductor layer 101 is, for example, 1 to 30 μm and the photodiode 21 is provided in an inner portion thereof. Then, the semiconductor layer 101 is provided with the pixel transistor Tr and the peripheral transistor 31 at the lower surface (front surface). Then, the semiconductor layer 101 is provided with the color filter CF and the on-chip lens OCL via a reflection preventing film HT on the upper surface (rear surface). Other than this, an opening KK is provided in the pad section PAD in the semiconductor layer 101. The opening KK is formed so as to penetrate through the reflection preventing film HT which is provided on the upper surface (rear surface) of the semiconductor layer 101 and to penetrate through the semiconductor layer 101. That is, the opening KK penetrates through the reflection preventing film HT and the semiconductor layer 101 in the depth direction z.

(A-1) Photodiode 21

The photodiode 21 is provided in an inner portion of the semiconductor layer 101 as shown in FIG. 3. The photodiode 21 is provided to correspond to the pixels P in the pixel region PA. That is, the photodiode 21 is provided for each of the plurality of pixels P which are arranged in the pixel region PA.

The photodiode 21 is formed so as to generate and accumulate signal charge due to the incident light H being received and photoelectric conversion being performed.

For example, the photodiode 21 includes an n-type charge accumulation region (not shown) and the n-type charge accumulation region (not shown) is provided in a p-type semiconductor region (not shown) of the semiconductor layer 101. Then, the p-type semiconductor region (not shown) where the impurity concentration is high is provided as a hole accumulation region in the n-type charge accumulation region in the front surface side of the semiconductor layer 101.

(A-2) Pixel Transistor Tr

The pixel transistor Tr is provided in the lower surface (front surface) of the semiconductor layer 101 as shown in FIG. 3. The pixel transistor Tr is provided to correspond to the pixels P in the pixel region PA. That is, the pixel transistor Tr is provided for each of the plurality of pixels P which are arranged in the pixel region PA in the same manner as the photodiode 21.

The pixel transistor Tr includes a transfer transistor 22, an amplification transistor 23, a selection transistor 24, and a reset transistor 25 as shown in FIG. 4 and is provided so that the signal charge from the photodiode 21 is output as an electrical signal.

In each of the transistors 22 to 25, for example, a channel region (not shown) is formed in an inner portion of the semiconductor layer 101. Then, in the front surface of the semiconductor layer 101, a gate electrode is provided on the channel region (not shown) via a gate insulation film (not shown).

For example, the gate electrode is formed using polysilicon which includes an n-type impurity. Then, in the front surface of the semiconductor layer 101, a pair of source and drain regions (not shown) are provided to interpose the gate electrode.

In the pixel transistor Tr, the transfer transistor 22 is configured so that the signal charge which is generated in the photodiode 21 is output toward the gate of the amplification transistor 23 as an electrical signal. Specifically, the transfer transistor 22 is provided so as to be between the photodiode 21 and a floating diffusion FD as shown in FIG. 4. Then, the transfer transistor 22 transfers the signal charge which has accumulated in the photodiode 21 to the floating diffusion FD as an output signal due to a transfer signal being applied to the gate from a transfer line 26.

In the pixel transistor Tr, the amplification transistor 23 is configured so that the electrical signal which is output from the transfer transistor 22 is amplified and output. Specifically, the gate of the amplification transistor 23 is connected to the floating diffusion FD as shown in FIG. 4. In addition, the drain of the amplification transistor 23 is connected to a power source potential supply line Vdd and the source of the amplification transistor 23 is connected to the selection transistor 24. The amplification transistor 23 operates as a source follower by supplying a constant electric current from a constant electric current source I which is provided outside of the pixel region PA when the selection transistor 24 is selected to be in an on state. As a result, in the amplification transistor 23, the output signal which is output from the floating diffusion FD is amplified by a selection signal being supplied to the selection transistor 24.

In the pixel transistor Tr, the selection transistor 24 is configured so that the electrical signal, which is output using the amplification transistor 23 when the selection signal is input, is output toward to a vertical signal line 27. Specifically, the gate of the selection transistor 24 is connected to an address line 28 which is supplied with the selection signal as shown in FIG. 4. The selection transistor 24 is in an on state when the selection signal is supplied and outputs the output signal which is amplified using the amplification transistor 23 as described above to the vertical signal line 27.

In the pixel transistor Tr, the reset transistor 25 is configured so that a gate potential of the amplification transistor 23 is reset. Specifically, the gate of the reset transistor 25 is connected to a reset line 29 which is supplied with a reset signal as shown in FIG. 4. In addition, the drain of the reset transistor 25 is connected to the power source potential supply line Vdd and the source of the reset transistor 25 is connected to the floating diffusion FD. Then, the reset transistor 25 resets a gate potential of the amplification transistor 23 is reset to a power source potential via the floating diffusion FD when the reset signal is supplied to the gate from the reset line 29.

Each of the gates of the respective transistors of 22, 24 and 25 are connected in row units which are formed from a plurality of pixels P lined up in the horizontal direction x and are driven simultaneously with regard to the plurality of pixels lined up in row units. Specifically, sequential selection is performed in a vertical direction in horizontal line (pixel row) units using the selection signal which is supplied by the vertical driving circuit (not shown) described above. Then, the transistors of each of the pixels P are controlled using various types of timing signals which are output from the timing generator (not shown). Due to this, the output signal in each of the pixels P is read out to the column circuit (not shown) for each column of the pixels P via the vertical signal line 27. Then, the signals which are held in the column circuit are sequentially output toward the external output circuit (not shown) by being selected by the horizontal driving circuit (not shown).

(A-3) Peripheral Transistor 31

The peripheral transistor 31 is provided in the peripheral circuit section SC as shown in FIG. 3 and configures a peripheral circuit.

As shown in FIG. 3, the peripheral transistor 31 is provided in the front surface (lower surface) of the semiconductor layer 101 in the same manner as the pixel transistor Tr.

In the peripheral transistor 31, for example, a channel region (not shown) is formed in an inner portion of the semiconductor layer 101. Then, in the front surface of the semiconductor layer 101, a gate electrode is provided on the channel region (not shown) via a gate insulation film (not shown). For example, the gate electrode is formed using polysilicon which includes an n-type impurity. Then, in the front surface of the semiconductor layer 101, a pair of source and drain regions (not shown) are provided to interpose the gate electrode.

(A-4) Color Filter CF

The color filter CF is provided to correspond to the pixels P in the pixel region PA as shown in FIG. 3.

The color filter CF is provided at the upper surface (rear surface) side of the semiconductor layer 101.

Here, in the upper surface of the semiconductor layer 101, the reflection preventing film HT is formed in order to prevent the incident light H which is incident from above being reflected by the upper surface of the semiconductor layer 101. The reflection preventing film HT is formed by appropriately selecting a material and a film thickness so that a reflection preventing function is realized using an optical interference action. For example, the reflection preventing film HT is formed using an insulation material such as SiN, SiON, or the like. Other than this, the reflection preventing film HT may be formed by oxides with elements such as hafnium, zirconium, aluminum, tantalum, titanium, magnesium, yttrium, or lanthanide. Other than the reflection preventing film HT, a planarizing film may be provided.

Then, the color filter CF is provided on an upper surface of the reflection preventing film HT.

The color filter CF is formed so that the incident light H which is incident via the on-chip lens OCL from the rear surface side of the semiconductor 101 is colored and transmitted.

The color filter CF includes, for example, a red filter layer (not shown), a green filter layer (not shown), and a blue filter layer (not shown) and is disposed so that each of the three primary color filters correspond to each of the pixels P using a Bayer arrangement.

For example, the color filter CF is formed due to a coating being formed by a coating liquid which includes a colorant material and a photoresist resin being coated using a coating method such as a spin coating method and by pattern processing of the coating using a lithography technique.

(A-5) On-Chip Lens OCL

The on-chip lens OCL is provided to correspond to the pixels P in the pixel region PA as shown in FIG. 3.

The on-chip lens OCL is provided on an upper surface of the color filter CF on the rear surface (upper surface) side of the semiconductor layer 101.

The on-chip lens OCL is a convex lens which protrudes with a convex shape in an upward direction from the rear surface of the semiconductor layer 101 and the incident light H which is incident from the rear surface side of the semiconductor layer 101 is condensed toward the photodiode 21.

For example, the on-chip lens OCL is formed using an organic material such as a resin or the like.

(B) Wiring Layer 110

The wiring layer 110 is provided on the lower surface (front surface) side opposite to the upper surface (rear surface) where the color filter CF and the on-chip lens OCL are formed in the semiconductor layer 101 as shown in FIG. 3.

Here, the wiring layer 110 is provided on the lower surface of the semiconductor layer 101 so as to cover the pixel transistor Tr which is provided in the pixel region PA and the peripheral transistor 31 which is provided in the peripheral circuit section SC.

The wiring layer 110 includes a wiring 110H and an insulation film 110Z, and in the insulation film 110Z, the wiring 110H is formed so as to be electrically connected to each of the elements. The wiring layer 110 is formed by a wiring and an insulation film being repeatedly laminated.

Each of the wirings 110H are formed by, for example, being laminated so as to function as wirings such as the transfer line 26, the address line 28, the vertical signal line 27, and the reset line 29 as shown in FIG. 4. In addition, each of the wirings 110H is formed so as to be electrically connected to the peripheral transistor 31.

Other than this, as shown in FIG. 3, in the wiring layer 110, the pad electrode 110P is provided in an inner portion of the insulation film 110Z. The pad electrode 110P is formed so that the width is wider than each of the wirings 110H. In addition, the pad electrode 110P is provided so as to be the same depth as the wiring 110H which is provided at the bottom layer out of a plurality of the wirings 110H which are laminated. Here, each of the wiring 110H which is provided at the bottom layer and the pad electrode 110P is formed by pattern processing with regard to a conduction layer (not shown) which is formed to cover the formation region of both. That is, both are formed from the same layer.

In the wiring layer 110, the wiring 110H and the pad electrode 110P are formed by, for example, a metal conductive material such as aluminum. Then, the insulation film 110Z is formed using an insulation material such as a silicon oxide compound.

As shown in FIG. 3, an opening KK is provided in an upper surface side of the pad electrode 110P.

The opening KK is formed so as to penetrate through the reflection preventing film HT and the semiconductor layer 101 in the depth direction z in the pad section PAD. In addition, the opening KK is formed so that the upper surface of the pad electrode 110P is exposed in the wiring layer 110.

Then, in the pad electrode 110P, the bonding wire BW is provided in an upper surface which is exposed due to the opening KK as shown in FIG. 3, and an external component and the solid-state imaging device 1 are electrically connected.

In the embodiment, a convex section 111 which protrudes with a convex shape is provided only at a portion where the pad electrode 110P is formed in the pad section PAD in the lower surface of the wiring layer 110 as shown in FIG. 3. The convex section 111 is formed by the insulation film 110Z. A side surface of the convex section 111 is inclined so that the width is narrower in accompaniment with heading downward from the lower surface of the wiring layer 110.

Then, the adhesion layer 201 is formed so as to cover the lower surface of the wiring layer 110. Since, the convex section 111 is provided in only the pad section PAD in the lower surface of the wiring layer 110, in the insulation film 110Z, a thickness T111 between the pad electrode 110P and the adhesion layer 201 is thicker than a thickness T110 between the wiring later 110H which is the bottom layer and the adhesion layer 201.

Then, the support substrate SK is adhered to the lower surface of the wiring layer 110 using the adhesion layer 201.

Here, the lower surface of the wiring layer 110 opposes a planar upper surface of the support substrate SK and the adhesion layer 201 is interposed therebetween. Between the support substrate SK and the lower surface of the wiring layer 110 is narrower at portion where the convex section 111 is provided in the lower surface of the wiring layer 110 than other portions. As a result, in the lower surface of the wiring layer 110, a film thickness T2 of the adhesion layer 201 in the portion where the pad electrode 110P is provided is thinner than a film thickness T1 in other portions.

(C) Adhesion Layer 201

The adhesion layer 201 is provided at the lower surface side on the side which is opposite to the upper surface in the wiring layer 110 where the semiconductor layer 101 is formed as shown in FIG. 3.

The adhesion layer 201 is between the wiring layer 110 and the support substrate SK and attaches the support substrate SK to the lower surface of the wiring layer 110 as shown in FIG. 3.

In the embodiment, the adhesion layer 201 is provided so that the film thickness is thinner in the pad section PAD than each portion of the pixel region PA, the peripheral circuit section SC, and the scribe region LA as shown in FIG. 3.

The adhesion layer 201 is interposed between the lower surface in the wiring layer 110 where the convex section 111 is provided only in the pad section PAD and the planar upper surface of the support substrate SK as shown in FIG. 3. As a result, in the adhesion layer 201, the film thickness T2 at the portion where the pad electrode 110P is provided in the pad section PAD is thinner than the film thickness T1 in the other portions of the pixel region PA, the peripheral circuit section SC, and the scribe region LA.

It is appropriate if the adhesion layer 201 is formed by a material which is able to be cured at a temperature which is lower than the deterioration onset temperature (for example, 450° C.) of a material (for example, Al, Cu) used when forming the wiring 110H in the wiring layer 110 where the heat resistance properties are low.

For example, the adhesion layer 201 is formed by coating benzocyclobutene. When the benzocyclobutene is heated using heat treatment, the reflow properties are improved. As a result, in a case where benzocyclobutene is used, it is possible to improve the adhesion of the wiring layer 110 and the support substrate SK. That is, in the bonding surface, it is possible to suppress the generation of defects such as pores and voids.

Other than this, for example, the adhesion layer 201 may be provided using an inorganic SOG, an organic SOG, or a resist and polyimide, or an organic resin such as a polyaryl ether. In this case, it is possible to suppress a heat effect which is applied to the wiring layer 110 since there is curing at a temperature which is lower than the deterioration onset temperature (for example, 450° C.) of the wiring layer 110H.

Specifically, as the inorganic SOG, for example, it is possible to use a material such as hydro silsesquioxane (HSQ) and polysilazane (PSZ). In addition, as the organic SOG, for example, it is possible to use methyl silsesquioxane (MSQ) or a hybrid material of hydro silsesquioxane and methyl silsesquioxane. As the organic resin, for example, it is possible to use a resist which is a combination of a cyclized polyisoprene, a novolac resin, and a light sensitive agent or a resist which is a combination of a photoacid generator, a crosslinking agent, a PHS-based resin, a novolac resin, and a methacrylic resin as a chemical amplification resin. In addition, as the polyaryl ether, it is possible to use a material such as SiLK (product name) manufactured by the Dow Chemical Company or FLARE (product name) or GX-3 (product name) manufactured by Honeywell International Inc.

The thickness of the adhesion layer 201 is not particularly limited but is appropriately 0.5 to 10 μm. This is because, in a case of being thin, covering steps is difficult, and in the case of being thick, it is difficult to obtain sufficient strength.

(D) Support Substrate SK

The support substrate SK is provided at the surface (lower surface) of the wiring layer 110 on the side which is opposite to the surface (upper surface) on the side of the semiconductor layer 101 as shown in FIG. 3.

The support substrate SK is, for example, a silicon substrate and is bonded to the wiring layer 110 in order to secure overall strength. Here, the upper surface of the support substrate SK is planar and the adhesion layer 201 is provided between the planar surface and the lower surface of the wiring layer 110 and both are adhered.

[2] Manufacturing Method

The important parts of a manufacturing method where the solid-state imaging device 1 described above is manufactured will be described.

FIGS. 5 to 16 are diagrams illustrating a manufacturing method of a solid-state imaging device in the embodiment 1 of the present disclosure.

Figure 5:
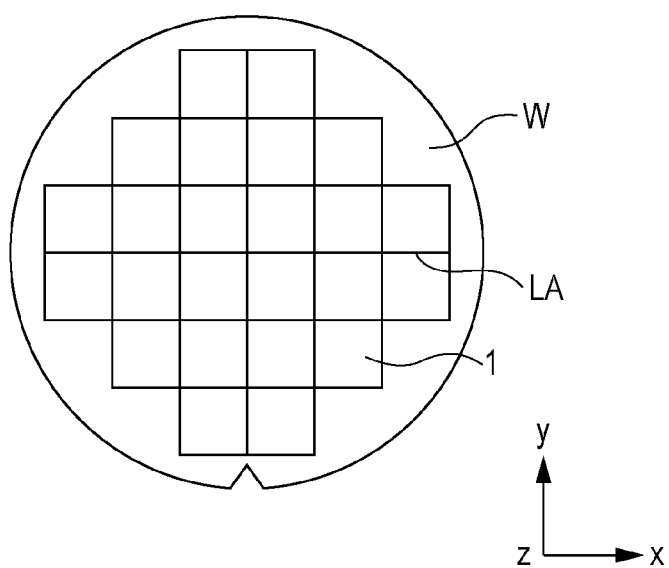
FIG. 5 is a diagram illustrating a manufacturing method of a solid-state imaging device in the embodiment 1 of the present disclosure.

Here, FIG. 5 shows an upper surface of a wafer W before being divided into the solid-state imaging devices 1 described above using a dicing process.

FIGS. 6 to 16 show a cross section of an X1-X2 portion and a cross section of an X3-X4 portion shown in FIG. 2 in the same manner as FIG. 3. That is, in FIGS. 6 to 16, the pixel region PA, the peripheral region section SC, the pad section PAD, and the scribe region LA are shown.

In the embodiment, a plurality of the solid-state imaging devices 1 are formed on the surface of the wafer W with a disk shape as shown in FIG. 5. Here, through each of the processes which are shown as (A) to (K) in FIGS. 6 to 15, the plurality of the solid-state imaging devices 1 are formed in the wafer W.

Figure 16:
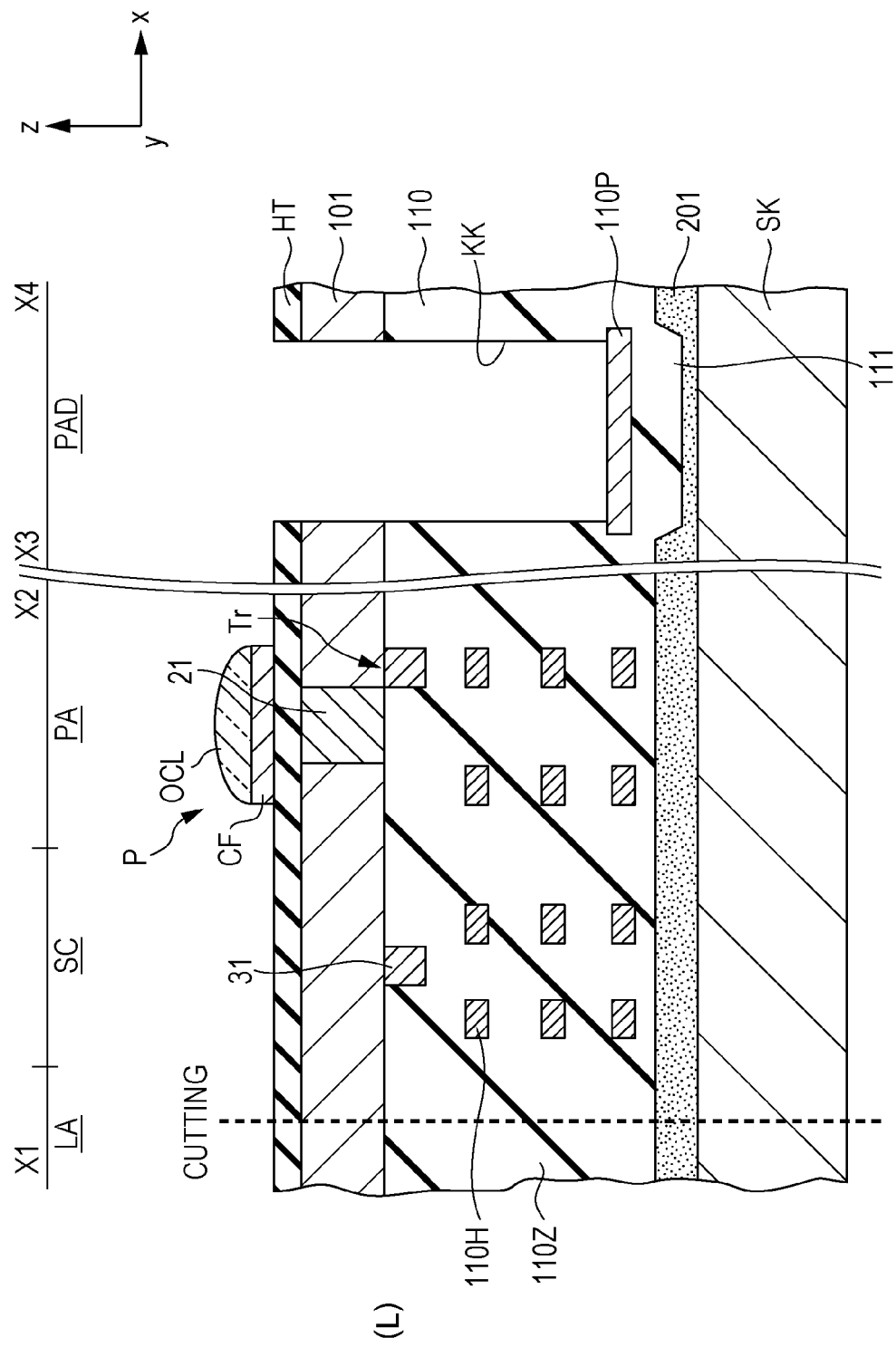
FIG. 16 is a diagram illustrating a manufacturing method of a solid-state imaging device in the embodiment 1 of the present disclosure.

After that, through a process shown as (L) in FIG. 16, the wafer W is divided up by dicing in the scribe region LA. Then, the solid-state imaging device 1 as shown in FIG. 3 is completed by each section being provided.

Through the following, each of the manufacturing process of the solid-state imaging device 1 will be sequentially described.

(A) Preparation of Wafer W

Figure 6A:
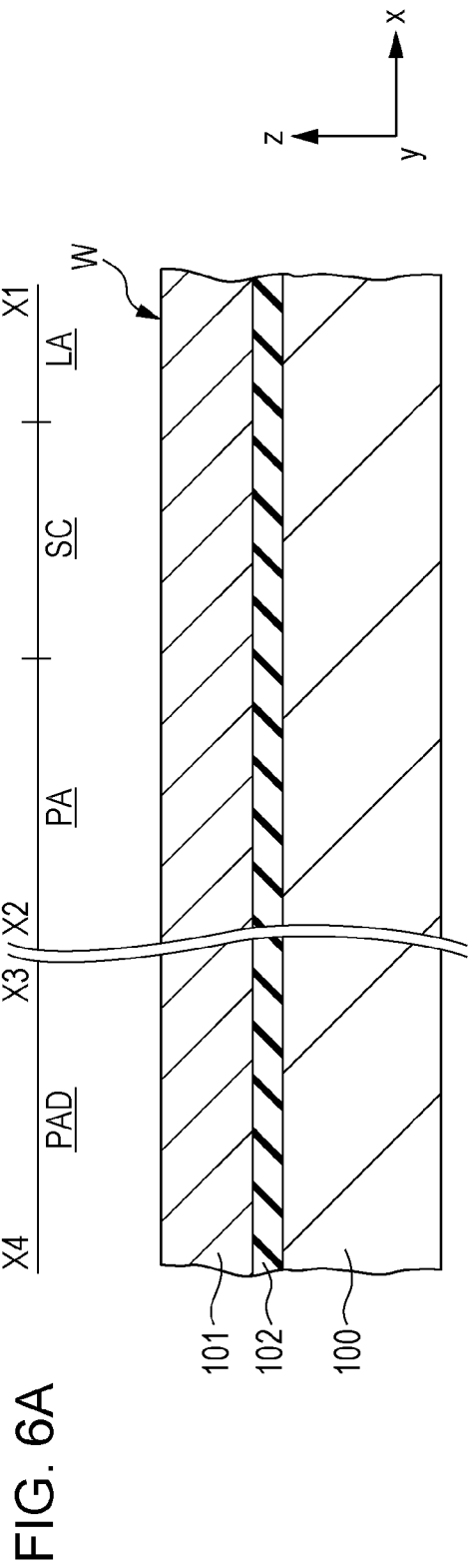
FIG. 6 is a diagram illustrating a manufacturing method of a solid-state imaging device in the embodiment 1 of the present disclosure.
Figure 6B:
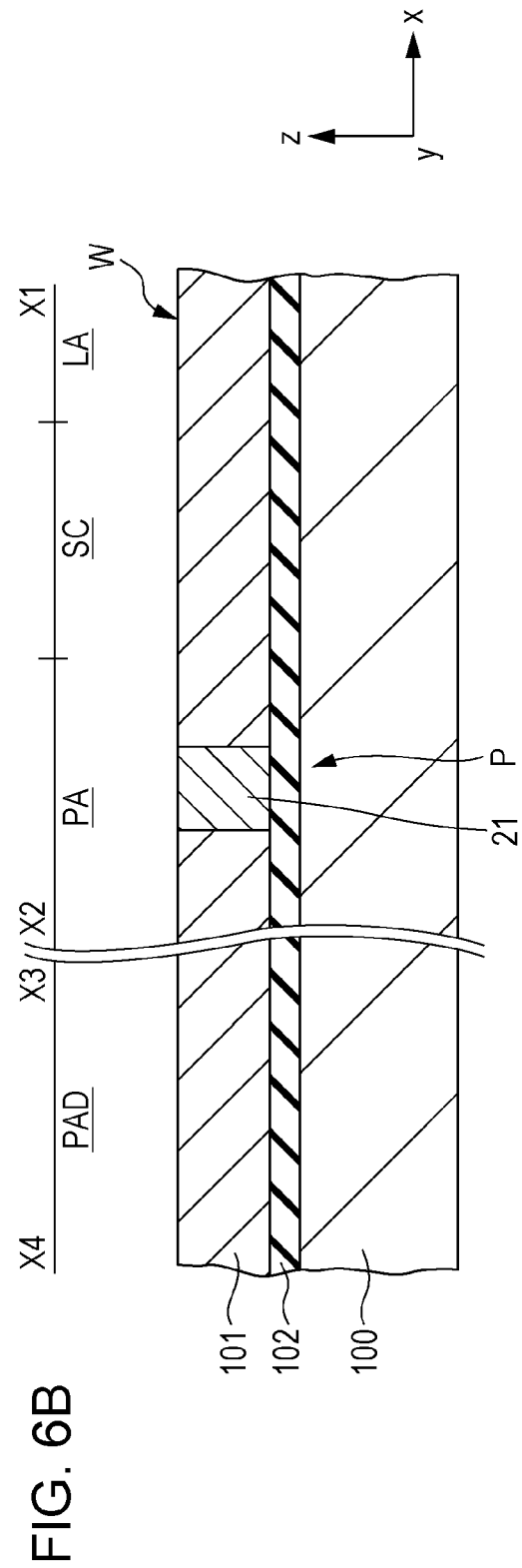

First, as shown in (A) of FIG. 6, the wafer W is prepared.

Here, the wafer W where the semiconductor layer 101 is provided on the upper surface of the semiconductor substrate 100 via an embedded oxide film 102 (so-called BOX layer).

Specifically, the semiconductor substrate 100 and the semiconductor layer 101 are single crystal silicon semiconductors and the embedded oxide film 102 is a silicon oxide film.

In this manner, a so-called SOI (silicon on insulator) substrate is prepared as the wafer W. Here, it is possible to appropriately set the film thickness with regard to the embedded oxide film 102 and the semiconductor layer 101.

Then, the wafer W is supported by a manufacturing device in a state where the surface (front surface) of the semiconductor layer 101 on the side which is opposite to the surface (rear surface) where the embedded oxide film 102 and the semiconductor layer 101 are provided is exposed.

(B) Forming of Photodiode 21

Next, as shown in (B) of FIG. 6, the photodiode 21 is formed.

Here, the photodiode 21 is provided so as to correspond to each of the plurality of pixels P which are arranged in the pixel region PA.

Specifically, an impurity is appropriately ion implanted in a portion where the photodiode 21 is formed in the semiconductor layer 101 from the upper surface side of the semiconductor layer 101. Due to this, the photodiode 21 is provided in the inner portion of the semiconductor layer 101.

(C) Forming of Pixel Transistor Tr and Peripheral Transistor 31

Next, as shown in (C) of FIG. 7, the pixel transistor Tr and the peripheral transistor 31 are formed.

Here, the pixel transistor Tr and the peripheral transistor 31 are formed in the upper surface (front surface) of the semiconductor layer 101 on the side which is opposite to the lower surface (rear surface) where the embedded oxide film 102 is formed.

The pixel transistor Tr is provided to correspond to the pixels P in the pixel region PA as shown in (C) of FIG. 7. The peripheral transistor 31 is provided in the peripheral circuit section SC.

Specifically, after a gate insulation film (not shown) is formed on the upper surface of the semiconductor layer 101, a gate electrode (not shown) is formed on the upper surface thereof. For example, after the gate insulation film (not shown) is formed using a silicon oxide film, for example, a polysilicon film is deposited. Then, the gate electrode is formed by pattern processing with regard to the polysilicon film. Then, for example, source and drain regions (not shown) are formed as a pair on the upper surface of the semiconductor layer 101.

By doing this, each of the pixel transistor Tr and the peripheral transistor 31 are formed.

(D) Forming of Wiring Layer 110

Next, as shown in (D) of FIG. 8, the wiring layer 110 is formed.

Here, the wiring layer 110 is provided in the upper surface (front surface) of the semiconductor layer 101 so as to cover the pixel transistor Tr of the pixel region PA and the peripheral transistor 31 of the peripheral circuit section SC.

Specifically, for example, after the insulation film 110Z is deposited so as to cover the pixel transistor Tr and the peripheral transistor 31 using an insulation material such as silicon oxide, a planarizing process is performed on the surface thereof. Then, a first layer (bottom layer) of the wiring 110H is formed by a conduction film (not shown) being deposited using a metal material such as Al on the planar surface thereof and the conduction film being pattern processed. Then, the second layer of the insulation film 110Z and the wiring 110H along with the third layer (top layer) of the insulation film 110Z and the wiring 110H are formed by these processes being repeatedly executed.

In the embodiment, the pad electrode 110P is also formed at the same time when forming the wiring layer 110.

Here, when the metal material is deposited on the formation portion of the third layer (top layer) of the wiring 110H, a conduction film is provided by the metal material being deposited also in the formation section of the pad electrode 110P at the same time. Then, at the same time as pattern processing is performed on the conduction film to become the third layer (top layer) of the wiring 110H, pattern processing is performed on the conduction film to become the pad electrode 110P. In this manner, both are formed from the same layer.

Then, the insulation film 110Z which is the top layer is deposited to cover the upper surface of the third layer (top layer) of the wiring 110H and the pad electrode 110P.

Due to this, the upper surface in the top layer of the insulation film 110Z is formed so that the portion where the third layer (top layer) of the wiring 110H and the pad electrode 110P is formed protrudes upwards with a convex shape. That is, the convex portion 111 is formed in the upper surface of the wiring layer 110 in the portion where the pad electrode 110P is formed in the pad section PAD. Along with this, a convex section 112 is formed in the upper surface of the wiring layer 110 in the portion where the third layer (top layer) of the wiring 110H is formed in the pixel region PA and the peripheral circuit section SC. The side surfaces of each of the convex sections 111 and 112 are formed so that the width is narrower in accompaniment with heading downward from the lower surface of the wiring layer 110.

Here, in each of the diagrams, the interfaces where the plurality of the insulation films 110Z is laminated are omitted from the diagram.

(E) Processing of Convex Section 112

Figure 9:
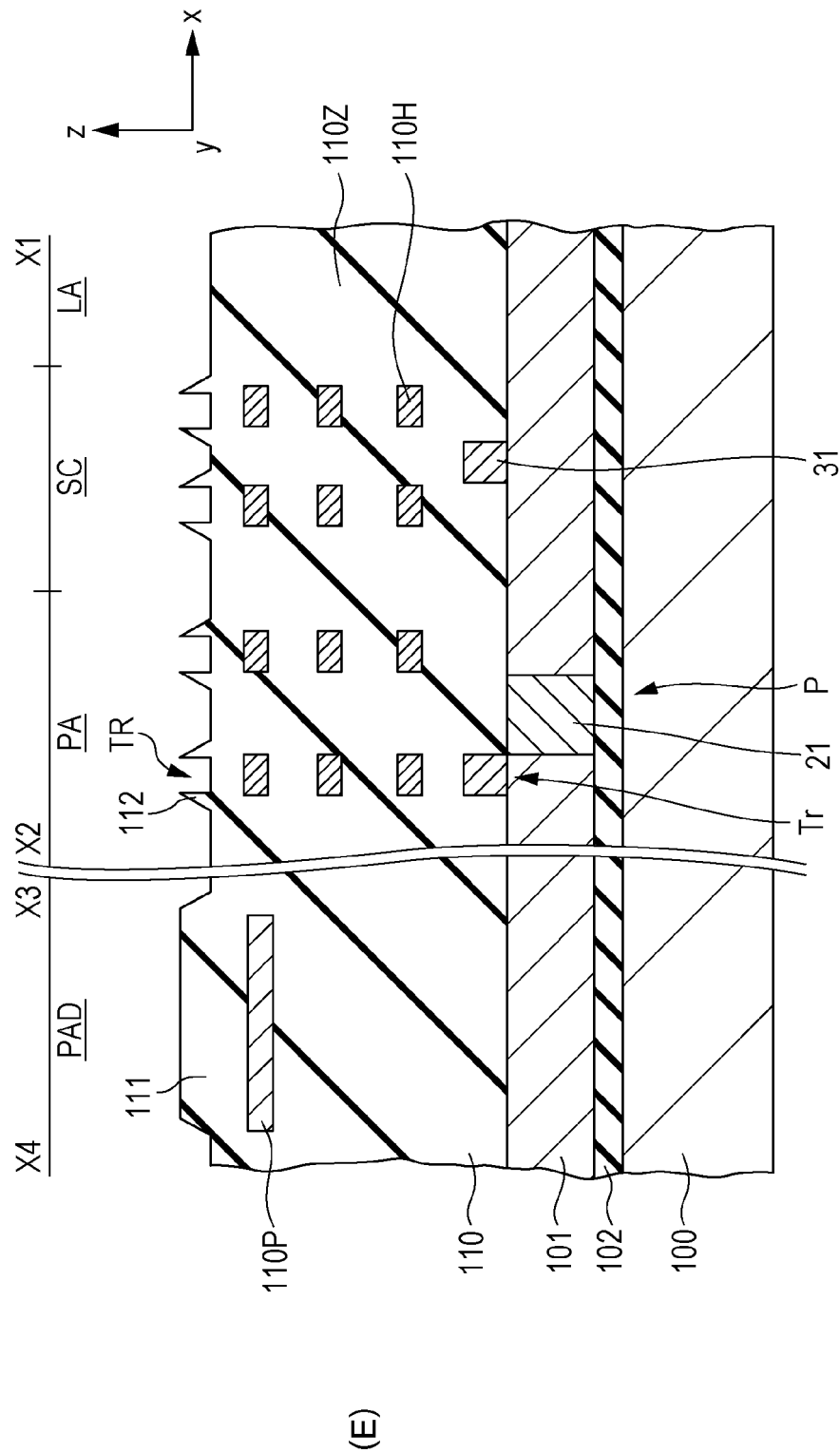
FIG. 9 is a diagram illustrating a manufacturing method of a solid-state imaging device in the embodiment 1 of the present disclosure.

Next, as shown in (E) of FIG. 9, the convex section 112 is processed.

Here, the convex section 112 which is formed in the pixel region PA and the peripheral circuit section SC in the upper surface of the wiring layer 110 is processed. The convex section 111 which is formed in the pad section PAD is not processed.

Specifically, a trench TR is provided in a portion which is positioned in the center of each of the convex section 112 which are formed in the pixel region PA and the peripheral circuit section SC. In the embodiment, the trench TR is provided in the convex section 112 so that the bottom surface of the trench TR corresponds to the height of the surfaces other than the portion in the upper surface of the wiring layer 110 where the third layer (top layer) of the wiring 110H and the pad electrode 110P are formed.

In this process, first, a photoresist (not shown) is deposited on the upper surface of the wiring layer 110. Then, a resist pattern film (not shown) is formed in the upper surface of the wiring layer 110 by the portion where the trench TR is formed being exposed and the photoresist (not shown) being pattern processed using a photolithography technique in a state where the other portions are covered. After that, the trench TR is provided in the convex section 112 by a dry etching process being executed with regard to the convex section 112 using the resist pattern (not shown) as a mask.

(F) Removal of Convex Section 112

Figure 10:
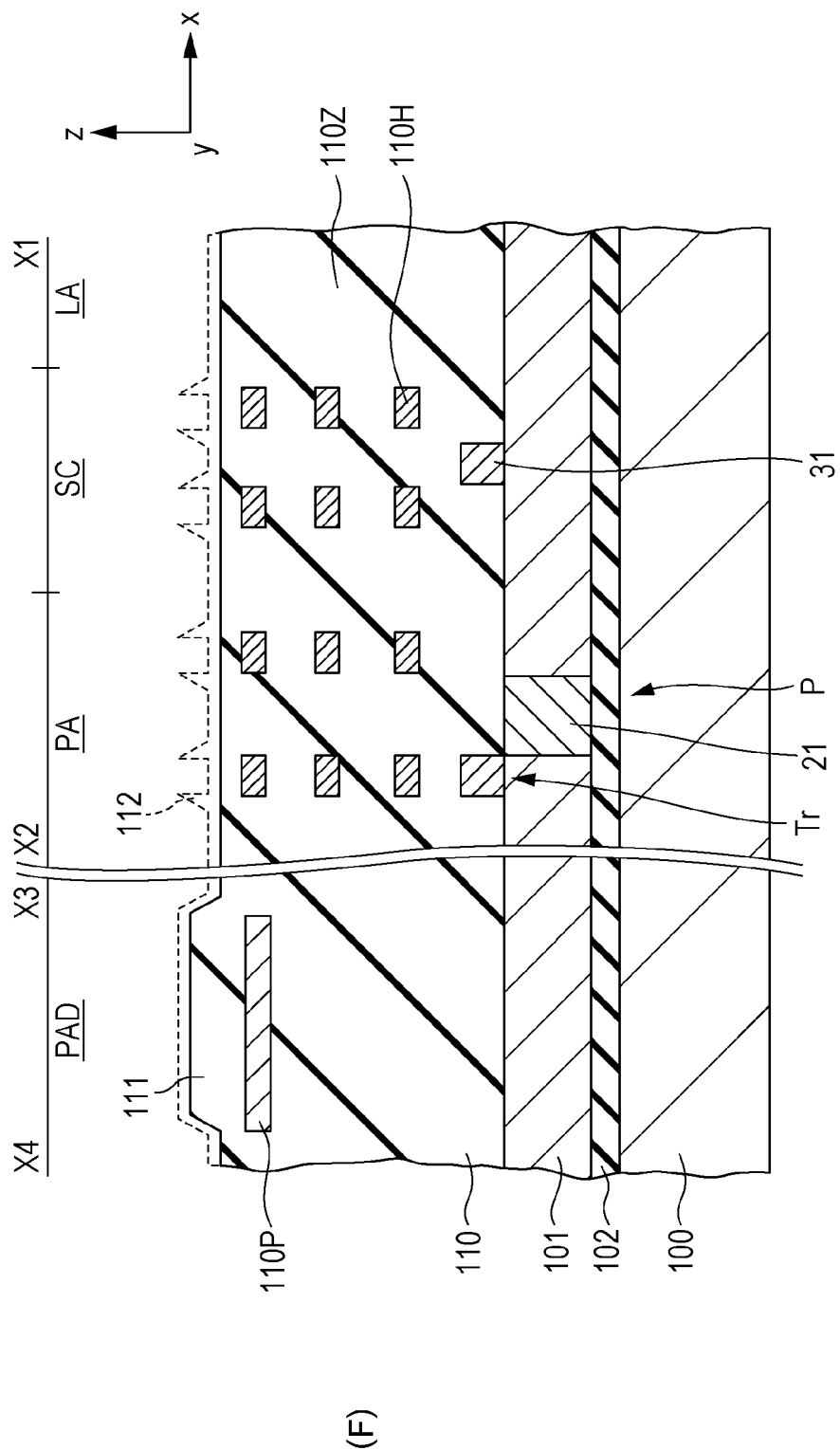
FIG. 10 is a diagram illustrating a manufacturing method of a solid-state imaging device in the embodiment 1 of the present disclosure.

Next, as shown in (F) of FIG. 10, the convex section 112 is removed.

Here, the convex section 112 (displayed as a dashed line), which is formed in the pixel region PA and the peripheral circuit section SC on the upper surface of the wiring layer 110, is removed.

Specifically, each of the convex sections 112 which are formed on the pixel region PA and the peripheral circuit section SC are removed. Due to this, the pixel region PA and the peripheral circuit section SC on the upper surface of the wiring layer 110 are planarized and the convex section 111 remains only on the pad section PAD.

For example, the planarization process such as a CMP process is executed with regard to the upper surface of the wiring layer 110. The planarization process shortens the polishing time. In addition, the planarization process is executed by using a soft polishing head. In the embodiment, the convex section 112 of the pixel region PA and the peripheral circuit section SC is smaller than the convex section 111 which is provided in the pad section PAD. As a result, it is possible for only the convex section 112 of the portion of the pixel region PA and the peripheral circuit section SC to be removed due to the execution of the planarization process and the convex section 111 to remain in the pad section PAD.

By doing this, the convex section 111 is provided in the portion where the pad electrode 110P is formed in the surface of the wiring layer 110 which opposes the support substrate SK.

(G) Disposing of Support Substrate SK

Figure 11:
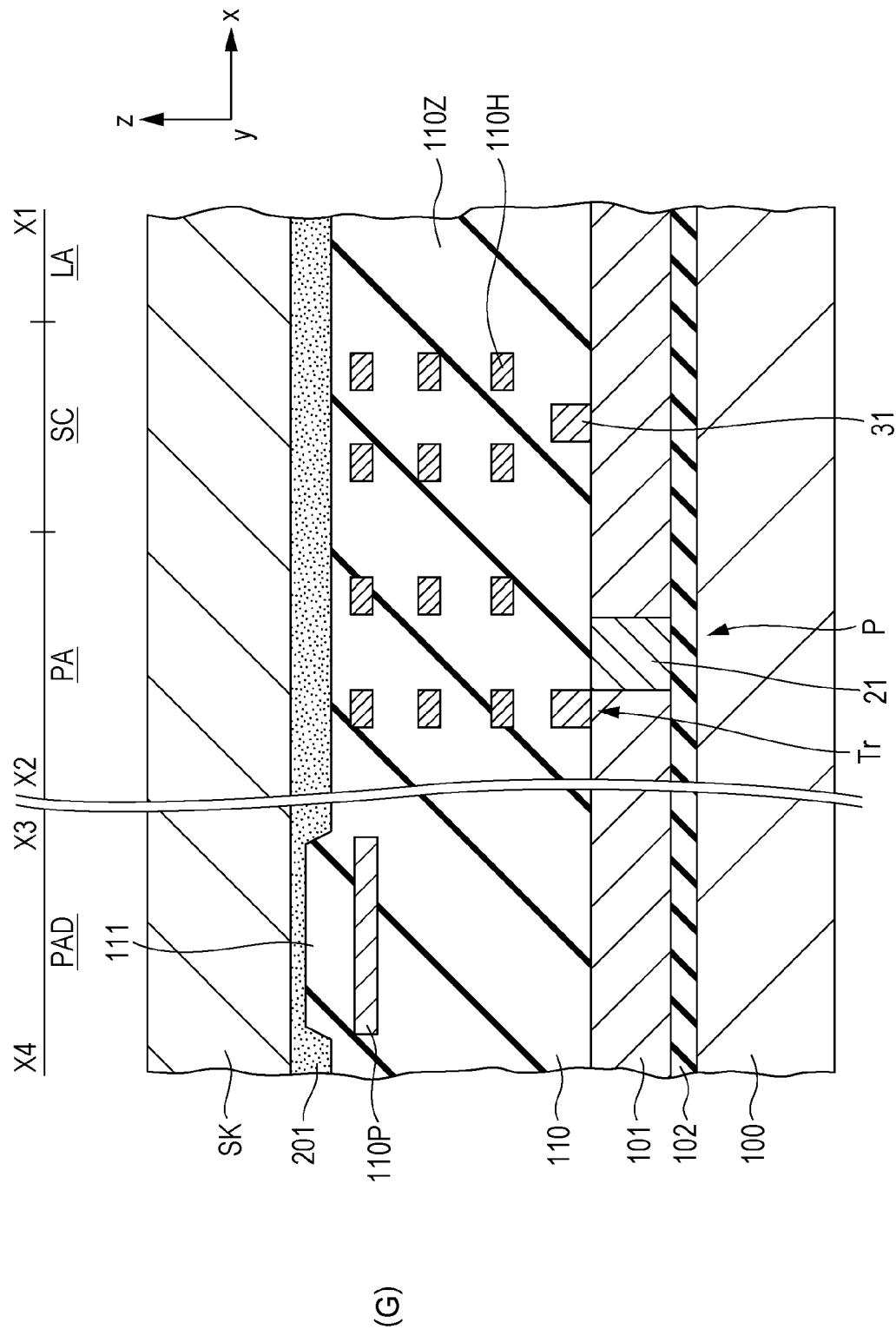
FIG. 11 is a diagram illustrating a manufacturing method of a solid-state imaging device in the embodiment 1 of the present disclosure.

Next, as shown in (G) of FIG. 11, the support substrate SK is disposed.

Here, the support substrate SK is disposed on the upper surface of the wiring layer 110 on the side which is opposite with regard to the lower surface on the side of the semiconductor layer 101.

In the embodiment, the support substrate SK which is a silicon semiconductor substrate is bonded by being attached the upper surface of the wiring layer 110 using the adhesion layer 201.

For example, the adhesion layer 201 is provided by benzocyclobutene being coated on the upper surface of the wiring layer 110 as an adhesive material. Then, the support substrate SK is disposed above the wiring layer 110 so that the upper surface of the wiring layer 110 and the lower surface of the support substrate SK are opposed and both are adhered.

Specifically, the opposing of the support substrate SK to the upper surface of the wiring layer 110 via the adhesion layer 201 is executed by a heating or pressurizing process in an inner portion of a vacuum chamber. For example, in a reduced-pressure atmosphere of $10^{-2}$ Torr, if heating is executed at a temperature of 350° C., there is pressurizing at a pressure of 1000 N for five minutes.

Due to this, the support substrate SK is adhered to the wiring layer 110.

The adhesion layer 201 is provided between the surface in the wiring layer 110 where the convex section 111 is provided only in the pad section PAD and the planar surface of the support substrate SK. As a result, in the adhesion layer 201, the portion where the pad electrode 110P is provided in the pad section PAD is thinner than the other portions of the pixel region PA, the peripheral circuit section SC, and the scribe region LA.

In the process, at the beginning, the curing of the adhesion layer 201 progresses at a low temperature region (150° C. to 200° C.). As a result, it is possible to prevent a heat effect being applied with regard to the wiring 110H which is formed from a material (for example, Al or Cu) which has low heat resistance before the process.

In addition, in the process, it is possible to improve the adhesion of the wiring substrate 110 and the support substrate SK without defects such as coating irregularities being generated since the adhesion layer 201 is spread out over a wide range on the upper surface of the wiring layer 110 due to fluidity in heat treatment and the like.

(H) Reversing of Semiconductor Substrate 100

Figure 12:
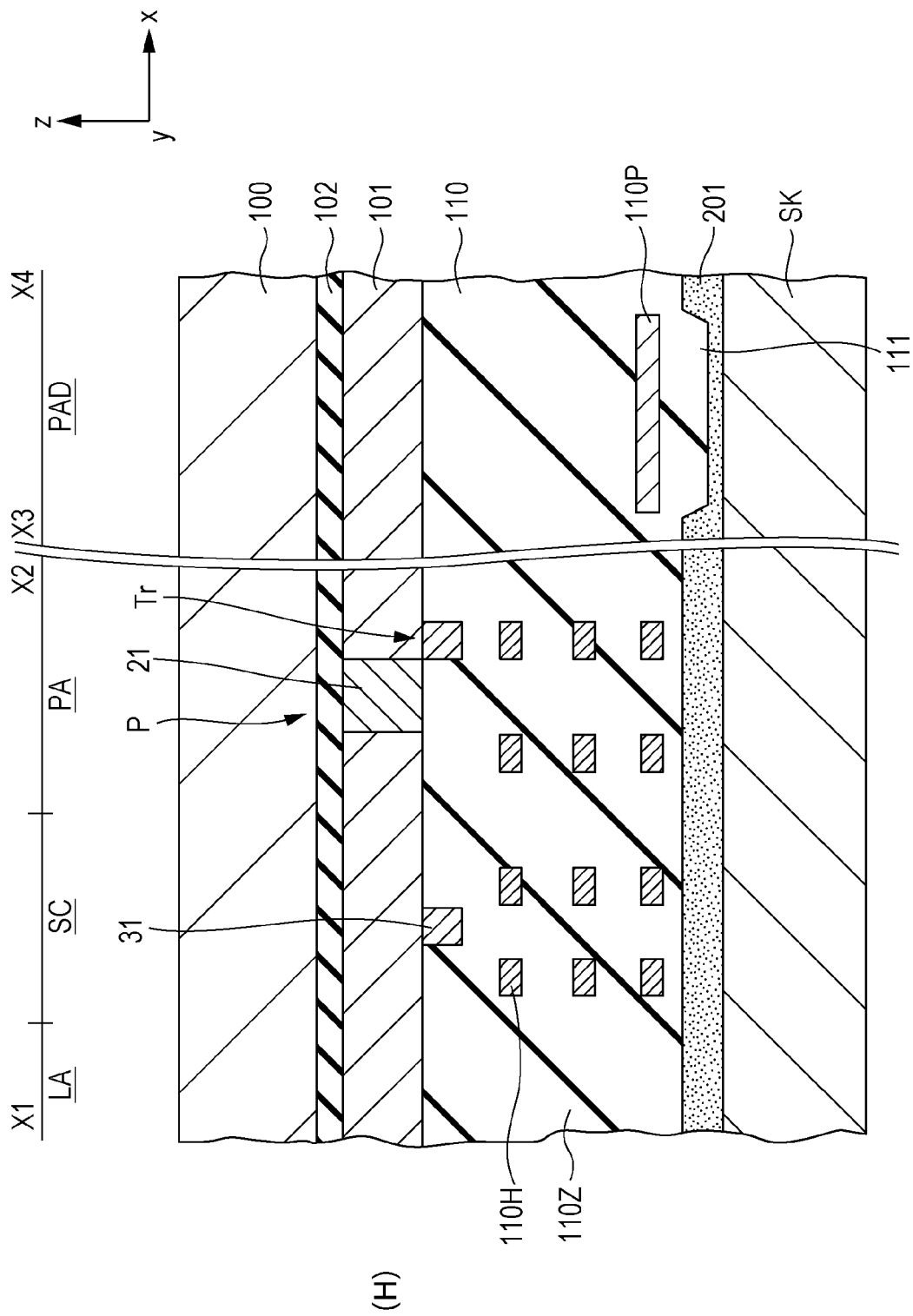
FIG. 12 is a diagram illustrating a manufacturing method of a solid-state imaging device in the embodiment 1 of the present disclosure.

Next, as shown in (H) of FIG. 12, the up and down of the semiconductor substrate 100 is reversed.

Here, the semiconductor substrate 100 is reversed so that the surface of the semiconductor substrate 100 which faced downwards faces upwards.

Specifically, the orientation is changed from a state (refer to FIG. 11) where the support substrate SK is positioned above and the semiconductor substrate 100 is positioned below to a state where the semiconductor substrate 100 is positioned above and the support substrate SK is positioned below. Due to this, the semiconductor substrate 100 is supported by the manufacturing device in a state where the rear surface on the side which is opposite to the front surface where the embedded oxide film 102 and the semiconductor layer 101 is exposed.

(I) Removal of Semiconductor Substrate 100 and Embedded Oxide Film 102

Figure 13:
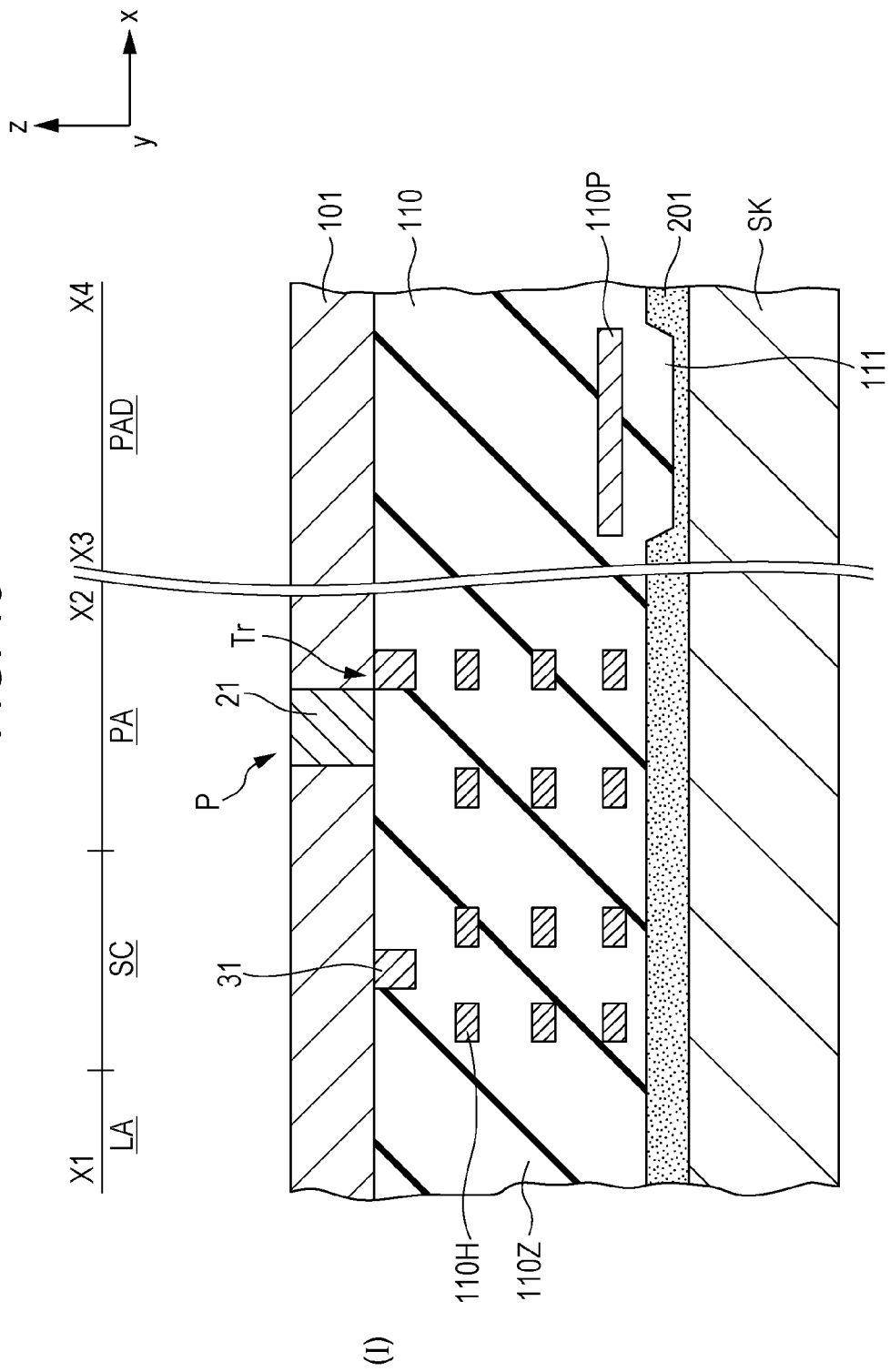
FIG. 13 is a diagram illustrating a manufacturing method of a solid-state imaging device in the embodiment 1 of the present disclosure.

Next, as shown in (I) of FIG. 13, the semiconductor substrate 100 and the embedded oxide film 102 are removed.

Here, the semiconductor substrate 100 and the embedded oxide film 102 which are provided on the upper surface (rear surface) of the semiconductor layer 101 are sequentially removed.

Specifically, the semiconductor substrate 100 (refer to FIG. 12) where the upper surface is exposed due to the previous process is removed from the upper surface side thereof using, for example, a back grinder method. In the same manner, the embedded oxide film 102 (refer to FIG. 12) is removed from the upper surface side thereof using the back grinder method. Due to this, the upper surface (rear surface) of the semiconductor layer 101 is exposed.

Here, other than the back grinder method, it is appropriate that the semiconductor substrate 100 and the embedded oxide film 102 may be also removed as described above by executing a process such as a CMP process or a wet etching process. For example, in a case where a wet etching process is executed, it is possible to prevent corrosion (etching) of the adhesion layer 201 due to a chemical solution since the chemical solution resistance properties of benzocyclobutene are high.

(J) Forming of Color Filter CF and ON-Chip Lens OCL

Figure 14:
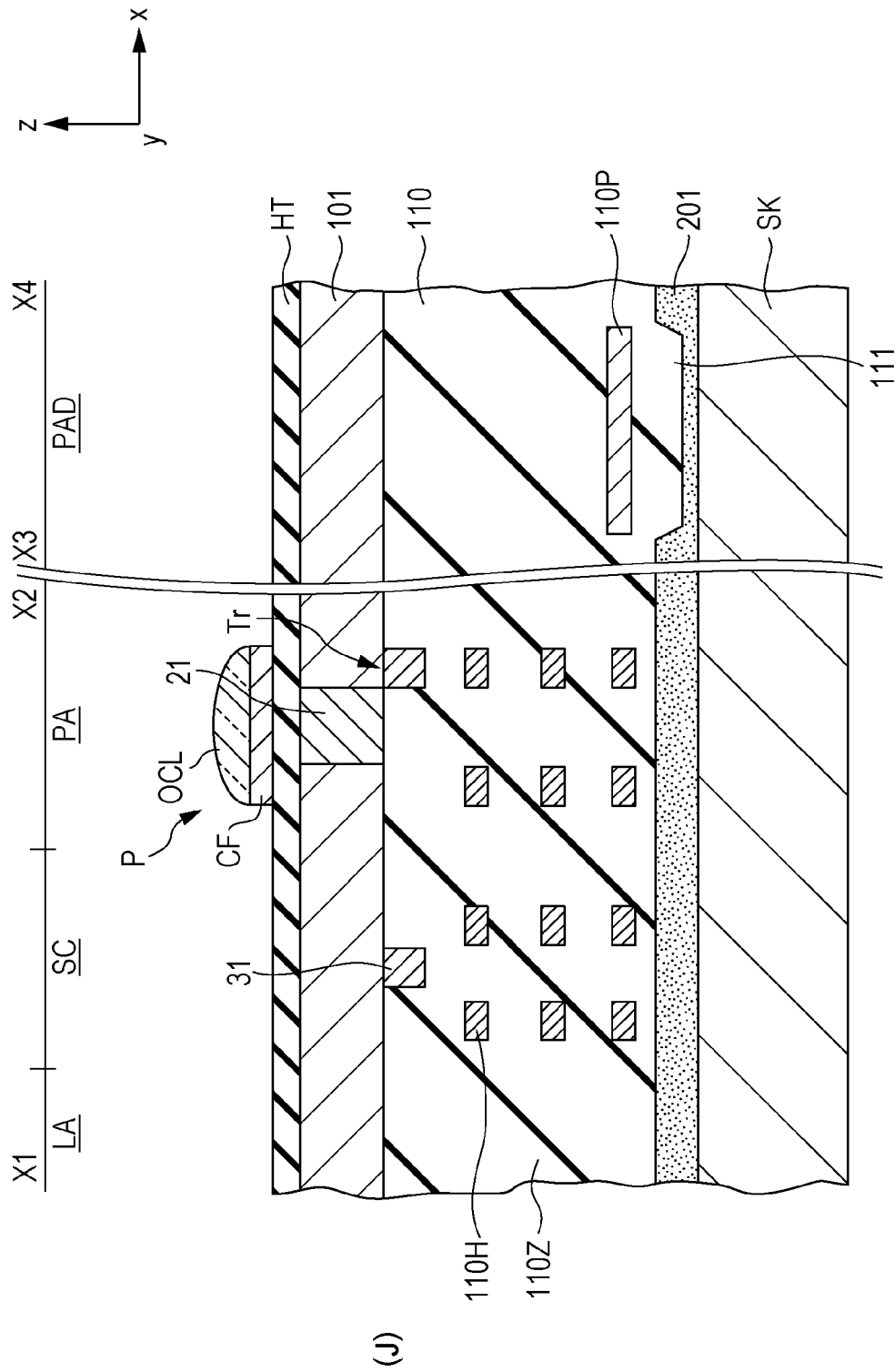
FIG. 14 is a diagram illustrating a manufacturing method of a solid-state imaging device in the embodiment 1 of the present disclosure.

Next, as shown in (J) of FIG. 14, the color filter CF and the on-chip lens OCL are formed.

Here, the color filter CF and the on-chip lens OCL are sequentially provided so as to correspond to the pixel P on the upper surface (rear surface) side of the semiconductor layer 101.

Specifically, the reflection preventing film HT is formed on the rear surface (upper surface) side of the semiconductor layer 101 using an insulation material. For example, the reflection preventing film HT is formed using an insulation material such as SiN or SiON. Other than the reflection preventing film HT, a planarizing film may be provided.

Then, the color filter CF is formed on the upper surface of the reflection preventing film HT. For example, the color filter CF is formed by three primary color filter layers (not shown) are disposed to correspond to each of the pixels P with a Bayer arrangement. When forming the color filter CF, for example, each color filter is formed due to a colorant layer (not shown) being formed by a coating liquid which includes a colorant and a resin according to each color being coated and the colorant layer being pattern processed using a lithography technique.

Then, the on-chip lens OCL is formed on the upper surface of the color filter CF.

When forming the on-chip lens OCL, for example, a lens material film (not shown) is formed by the lens material being deposited on the upper surface of the color filter CF and a photoresist film (not shown) is provided on the lens material film. Then, the on-chip lens OCL is formed by the photoresist film being pattern processed into a lens shape and an etch back process being executed with regard to the lens material film with the resist pattern in the lens shape as a mask.

(K) Forming of Opening KK

Figure 15:
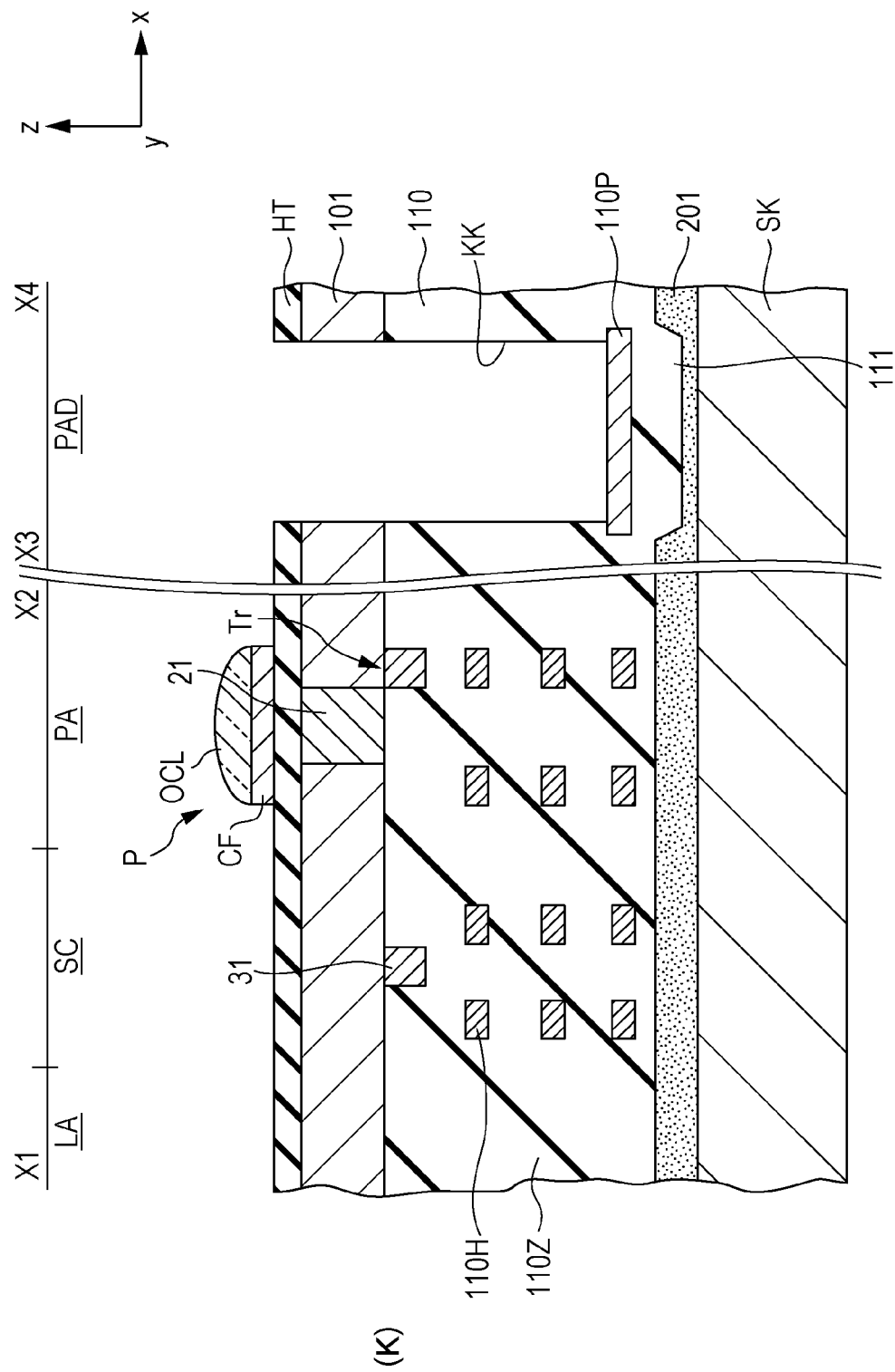
FIG. 15 is a diagram illustrating a manufacturing method of a solid-state imaging device in the embodiment 1 of the present disclosure.

Next, as shown in (K) of FIG. 15, the opening KK is formed.

Here, the opening KK is formed so that the upper surface of the pad electrode 110P which is provided in the wiring layer 110 in the pad section PAD is exposed.

Specifically, the opening KK is formed by an etching process being executed with regard to each layer which is provided above the pad electrode 110P.

That is, a portion of the reflection preventing film HT and the semiconductor layer 101 is removed so that the opening KK penetrates through the reflection preventing film HT and the semiconductor layer 101 in the depth direction z in the pad section PAD. Then, the opening KK is formed by a portion of the wiring layer 110 being removed so that the upper surface of the pad electrode 110P in the wiring layer 110 is exposed. Due to this, the opening KK is formed so that the upper surface on the side of the semiconductor layer 101 in the pad electrode 110P is exposed.

By doing this, the plurality of solid-state imaging devices 1 are formed on the surface of the wafer W as shown in FIG. 5.

(L) Cutting

Next, as shown in (L) of FIG. 16, cutting is executed.

Here, in the scribe region LA which is provided between the plurality of solid-state imaging devices 1 which are lined up to be adjacent, there is partitioning into the solid-state imaging devices 1 due to dicing using a blade (not shown). That is, there is partitioning into a plurality of chips by cutting between the plurality of solid-state imaging devices 1.

(M) Forming of Bonding Wire BW

Next, as shown in FIG. 3, the bonding wire BW is formed.

Here, the bonding wire BW is provided on the upper surface of the pad electrode 110P which is provided above the opening KK using wire bonding. For example, the bonding wire BW and the pad electrode 110P are electrically connected using gold (Au) wire as the bonding wire. That is, the bonding wire BW is provided on the upper surface of the pad electrode 110P which is exposed using the opening KK.

Due to this, the solid-state imaging device 1 which is a CMOS type image sensor of a rear surface illumination type is complete.

[3] Conclusion

As above, in the embodiment, the pixels P which include the photodiode 21 are formed in the pixel region PA of the semiconductor layer 101. In addition, the pixel transistor Tr and the peripheral transistor 31 are formed as semiconductor elements on the lower surface (front surface) side of the semiconductor layer 101 on the side which is opposite to the upper surface (rear surface) where the incident light H is incident toward the photodiode 21. Then, the wiring layer 110 is provided on the lower surface of the semiconductor layer 101 so that these optical elements are covered. In addition, the support substrate SK is provided so as to oppose the wiring layer 110 on the lower surface of the wiring layer 110 on the side which is opposite to the upper surface on the side of the semiconductor layer 101. Then, the adhesion layer 201 between the wiring layer 110 and the support substrate SK adheres the wiring layer 110 and the support substrate SK. In addition, the bonding wire BW is connected in the upper surface of the pad section 110P which is exposed using the opening KK.

Here, the wiring layer 110 includes the pad electrode 110P and the opening KK is formed so that the upper surface of the pad electrode 110P on the side of the semiconductor layer 101 is exposed. Then, the convex section 111 is provided in the portion where the pad electrode 110P is formed out of the lower surface of the wiring layer 110 which opposes the support substrate SK. The adhesion layer 201 is formed so that the portion where the pad section 110P is formed is thinner than at least the portion of the pixel region PA due to the convex section 111.

When the bonding wire BW is formed in the pad electrode 110P in the pad section PAD, mechanical shocks are applied to the pad electrode 110P. As a result, there are cases where small cracks are generated in the portion of the insulation film 110Z in the wiring layer 110 which is interposed between the pad electrode 110P and the adhesion layer 201.

However, in the embodiment, as shown in FIG. 3, the adhesion layer 201 which is a softer material than the insulation film 110Z and the support substrate SK is interposed between the lower surface of the wiring layer 110 where the convex section 111 is provided only in the pad section PAD and the planar surface of the support substrate SK. In the adhesion layer 201, the film thickness T2 at the portion where the pad electrode 110P is provided in the pad section PAD is thinner than the film thickness T1 in the other portions of the pixel region PA, the peripheral circuit section SC, and the scribe region LA.

In this manner, in the embodiment, the film thickness of the adhesion layer 201 below the pad electrode 110P where the mechanical shocks are applied from above is thinner than other portions.

As a result, the stress, which is applied to the insulation film 110Z which is interposed between the pad electrode 110P and the adhesion layer 201 in the wiring layer 110 due to mechanical shocks from the wire bonding, is alleviated.

When a shock is added to the portion where the insulation film 110Z which is a hard substance and the adhesion film 201 which is a soft substance are laminated, there are cases where cracks are generated since the concentration of stress in a bending direction is generated with regard to the insulation film 110Z which is a hard substance. However, when the adhesion film 201 which is a soft substance becomes thinner, the generation of cracks is reduced since the concentration of stress is reduced. That is, in a case where the thickness of the layer which is a soft substance is zero as an extreme case, the shock is transferred but the generation of cracks is reduced since it is difficult for the concentration of stress to be generated.

As such, in the embodiment, it is possible to prevent the generation of small cracks when mechanical shocks are applied in the case of executing wire bonding.

Figure 17:
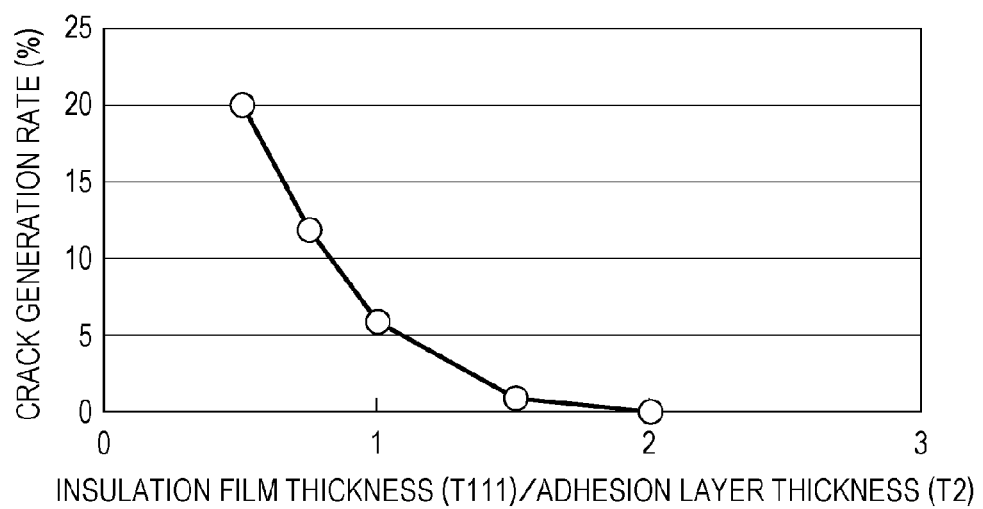
FIG. 17 is a diagram illustrating a crack generation rate in the embodiment 1 of the present disclosure.

FIG. 17 is a diagram illustrating a crack generation rate in the embodiment 1 of the present disclosure.

In FIG. 17, the horizontal axis is "thickness of insulation film"/"thickness of adhesion layer" and the vertical axis is the crack generation rate. Specifically, in FIG. 17, the "thickness of insulation film" is T111 in FIG. 3 and the thickness of the portion where the convex section 111 is provided in the top layer of the insulation film which configures the wiring layer 110 (bottom layer in FIG. 17). In addition, the "thickness of adhesion layer" is T2 in FIG. 3. In FIG. 17, the results are shown in a case where "thickness of insulation film is fixed and the "thickness of adhesion layer" is changed.

As shown in FIG. 17, as the value of "thickness of insulation film"/"thickness of adhesion layer" becomes smaller, the crack generation rate reduces. As is understood from this, it is possible to reduce the crack generation rate by making the adhesion layer 201 thinner.

In particular, in the embodiment, the convex section 111 is provided on the surface of the wiring layer 110 which opposes the support substrate SK. As a result, in the portion where the convex section 111 is formed, the thickness T111 of the insulation film 110Z which is interposed by the pad electrode 110P and the adhesion layer 201 is thicker than in other portions. As a result, it is possible to appropriately reduce the crack generation rate since the mechanical strength at this portion is increased. That is, when the thickness T111 becomes thicker, cracks are reduced since the relationship in FIG. 17 is exhibited by moving to the right.

In addition, in the embodiment, since stress which is applied to the insulation film 110Z is alleviated even with regard to shocks which are applied after the completion of the device other than shocks which are applied in the manufacturing process such as cases of executing the wire bonding, it is possible to reduce the crack generation rate even in this case.

In the case where the film thickness of the adhesion layer 201 is made to be thinner, there are cases where the generation of coating irregularities and voids are remarkable. As a result, the bonding quality is reduced and there are defects which are the reduction in product yield.

However, in the embodiment, the film thickness of the adhesion layer 201 only in the portion where mechanical shocks are applied is made to be thinner and the film thickness of the adhesion layer 201 is thicker in other portions.

As a result, in the portion where the mechanical shocks are not applied, it is possible to suppress the generation of coating irregularities and voids since the film thickness of the adhesion layer 201 is thick. Along with this, even in the portions where the film thickness of the adhesion layer 201 which mechanical shocks are applied is thin, it is possible to suppress the generation of coating irregularities and voids since the adhesion material comes around from the portion in the periphery thereof where the adhesion layer 201 is thick when coating.

Accordingly, in the embodiment, improvement in the product reliably and in the product yield and manufacturing with a high manufacturing efficiency is possible. Here, in order to suppress the generation of the coating irregularities, it is preferable that T2>0.5 μm and it is appropriate that T1/T2 is the range of 2 to 10 (refer to FIG. 3).

2. Embodiment 2

[1] Device Configuration and the Like

Figure 18:
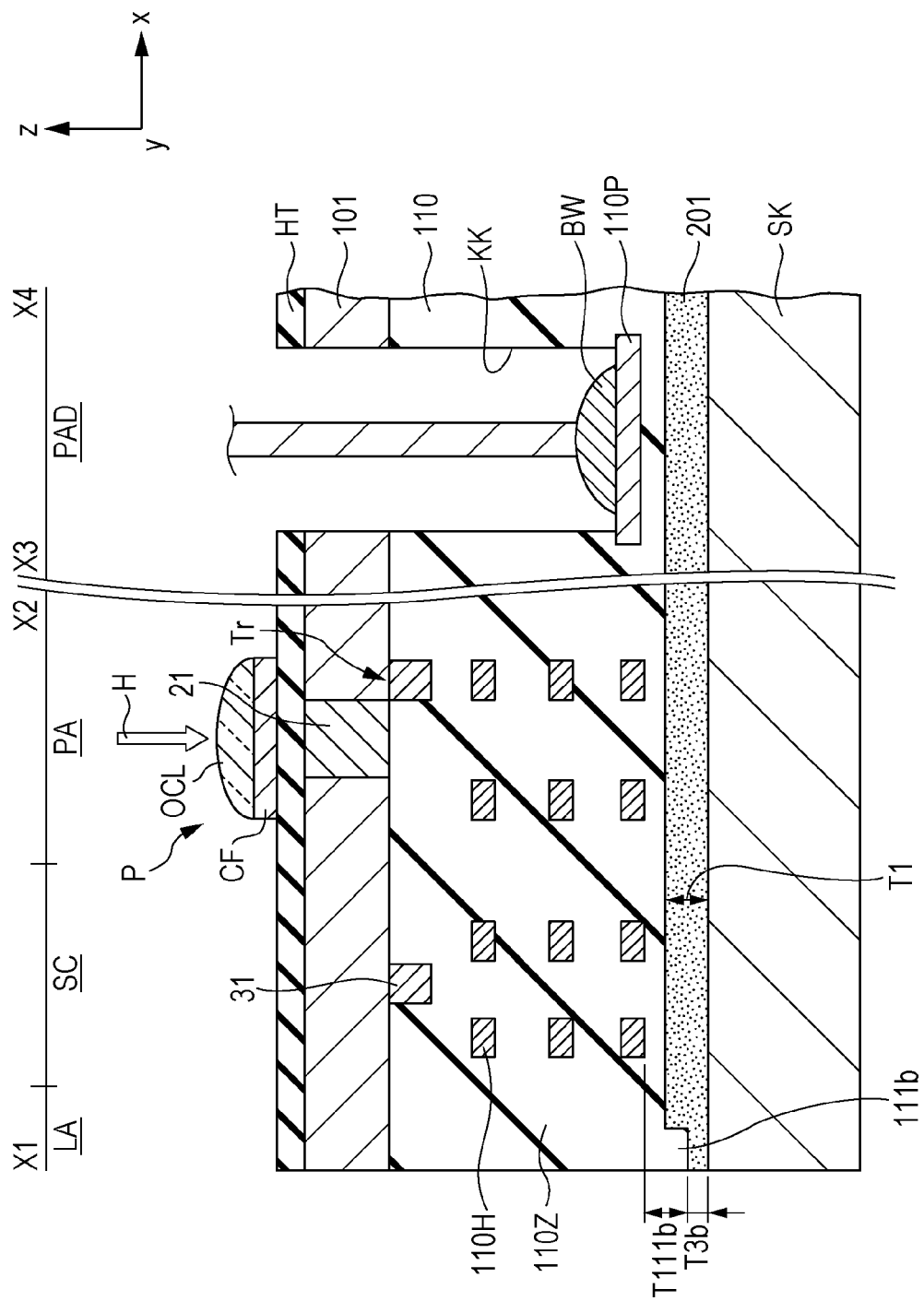
FIG. 18 is a diagram illustrating important parts of a solid-state imaging device in an embodiment 2 of the present disclosure.

FIG. 18 is a diagram illustrating important parts of a solid-state imaging device in an embodiment 2 of the present disclosure.

FIG. 18 shows a cross section of an X1-X2 portion and a cross section of an X3-X4 portion shown in FIG. 2 in the same manner as FIG. 3. That is, in FIG. 18, the pixel region PA, the peripheral region section SC, the pad section PAD, and the scribe region LA are shown.

As shown in FIG. 18, in the embodiment, the shape of the lower surface of the wiring layer 110 which opposes the support substrate SK is different to the embodiment 1. Excluding this point and other related points, the embodiment is the same as the embodiment 1. As a result, the description of the portions which overlap are omitted.

As shown in FIG. 18, in the lower surface of the wiring layer 110, a convex section 111b which protrudes downward in a convex shape is provided in the same manner as the embodiment 1. The convex section 111b is formed using the insulation film 110Z.

However, different to the case of the embodiment 1, the convex section 111b is provided in the scribe region LA and is not provided in the pad section PAD.

Then, the adhesion layer 201 is provided so as to cover the lower surface of the wiring layer 110 and the adhesion layer 201 adheres the support substrate SK to the wiring layer 110.

Here, the lower surface of the wiring layer 110 where the convex section 111b is provided is an opposing surface to the planar upper surface of the support substrate SK and the adhesion layer 201 is interposed between the wiring layer 110 and the support substrate SK. Between the portion in the lower surface of the wiring layer 110 where the convex section 111b is provided and the support substrate SK is narrower than other portions. As a result, in the adhesion layer 201, a thickness T3b of the portion where the convex section 111b is provided is thinner than the film thickness T1 in other portions.

[2] Manufacturing Method

The important parts of a manufacturing method where the solid-state imaging device described above is manufactured will be described.

FIGS. 19 to 26 are diagrams illustrating a manufacturing method of a solid-state imaging device in the embodiment 2 of the present disclosure.

FIGS. 19 to 26 show a cross section of an X1-X2 portion and a cross section of an X3-X4 portion shown in FIG. 2 in the same manner as FIG. 18. That is, in FIGS. 19 to 26, the pixel region PA, the peripheral region section SC, the pad section PAD, and the scribe region LA are shown.

Here, through each of the processes which are shown as (A) to (G) in FIGS. 19 to 25, as shown in FIG. 5, the plurality of the solid-state imaging devices 1 are formed in the wafer W.

Figure 26:
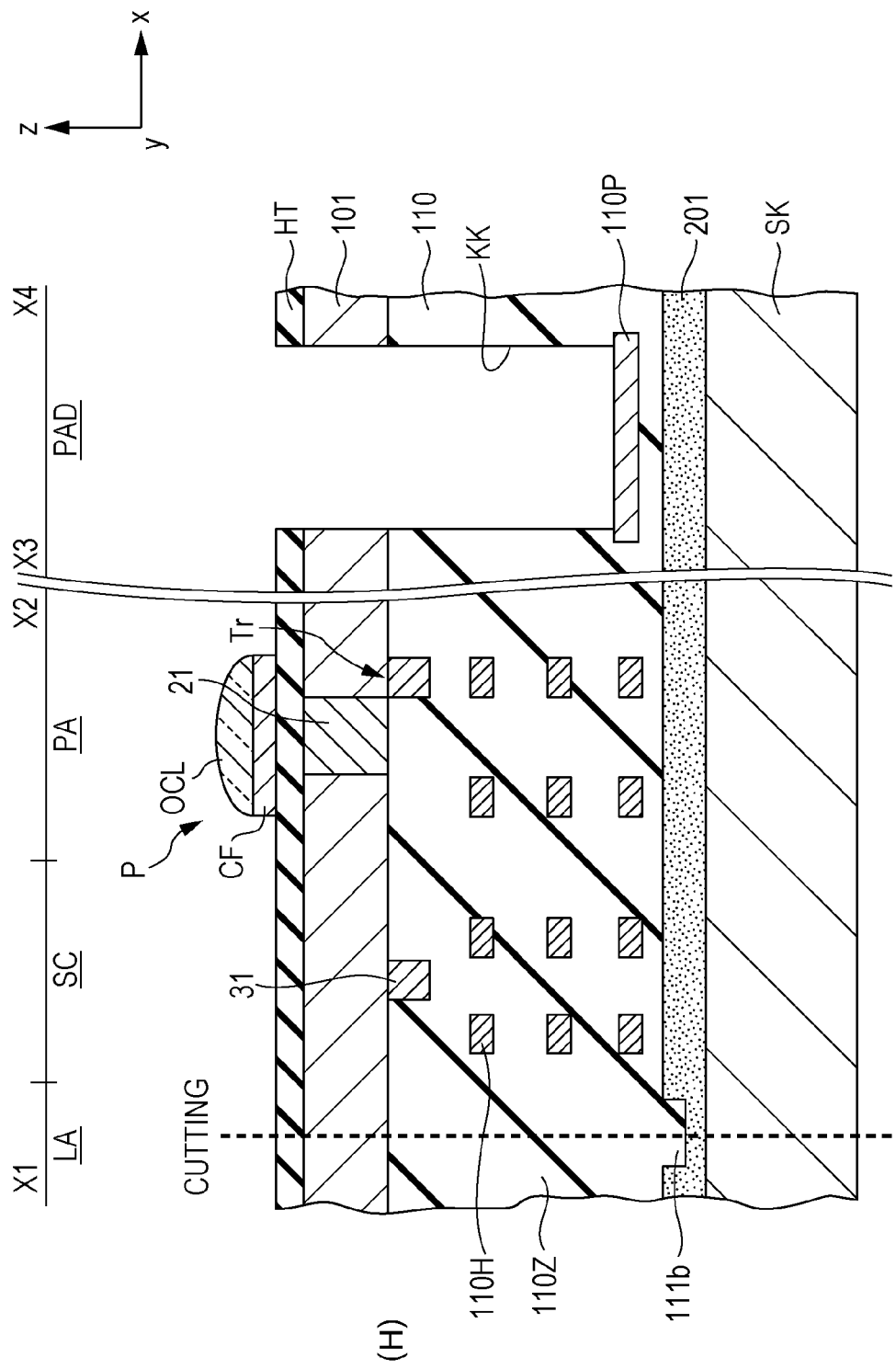
FIG. 26 is a diagram illustrating a manufacturing method of a solid-state imaging device in the embodiment 2 of the present disclosure.

After that, through a process shown as (H) in FIG. 26, the wafer W is divided up by dicing in the scribe region LA. Then, the solid-state imaging device as shown in FIG. 18 is completed by each section being provided.

Through the following, each of the manufacturing process of the solid-state imaging device will be sequentially described.

(A) Planarizing of Front Surface of Wiring Layer 110

Figure 19:
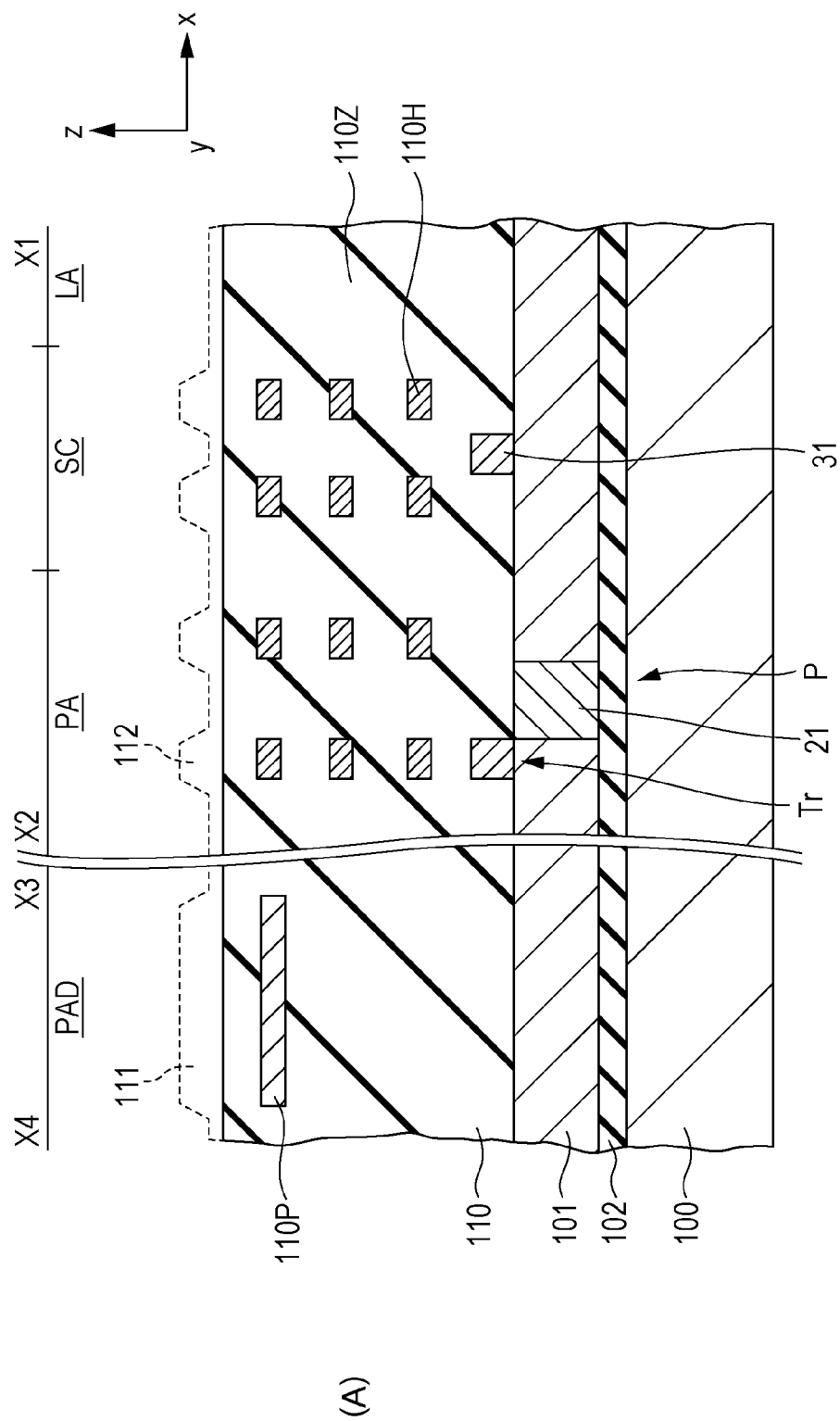
FIG. 19 is a diagram illustrating a manufacturing method of a solid-state imaging device in the embodiment 2 of the present disclosure.

First, as shown in (A) of FIG. 19, the upper surface (front surface) of the wiring layer 110 is planarized.

Before the execution of this process, each of the processes of (A) of FIG. 6, (B) of FIG. 6, (C) of FIG. 7, and (D) of FIG. 8 are executed.

That is, as shown in (A) of FIG. 6, the wafer W is prepared. Next, as shown in (B) of FIG. 6, the photodiode 21 is formed. Next, as shown in (C) of FIG. 7, the pixel transistor Tr and the peripheral transistor 31 are formed. Next, as shown in (D) of FIG. 8, the wiring layer 110 is formed.

Due to this, as shown in (D) of FIG. 8, the convex portion 111 is formed in the upper surface (front surface) of the wiring layer 110 on the side which is opposite to the lower surface (rear surface) where the semiconductor layer 101 is provided in the portion where the pad electrode 110P is formed in the pad section PAD. In addition, along with this, the convex section 112 is formed in the upper surface of the wiring layer 110 in the portion where the third layer (top layer) of the wiring 110H is formed in the pixel region PA and the peripheral circuit section SC.

Then, in this process, as shown in (A) of FIG. 19, the upper surface of the wiring layer 110 is planarized by each of the convex section 111 of the pad section PAD and the convex section 112 of the pixel region PA and the peripheral circuit section SC in the upper surface of the wiring layer 110 being removed.

For example, the convex sections 111 and 112 are removed from each of the pad section PAD and the pixel region PA and the peripheral circuit section SC (refer to the portion of dashed line in (A) of FIG. 19) by executing a planarization process such as a CMP process in the upper surface of the wiring layer 110. Due to this, the wiring layer 110 is formed so that the upper surface of the wiring layer 110 is parallel with the upper surface of the semiconductor layer 101.

(B) Processing of Convex Section 111b

Figure 20:
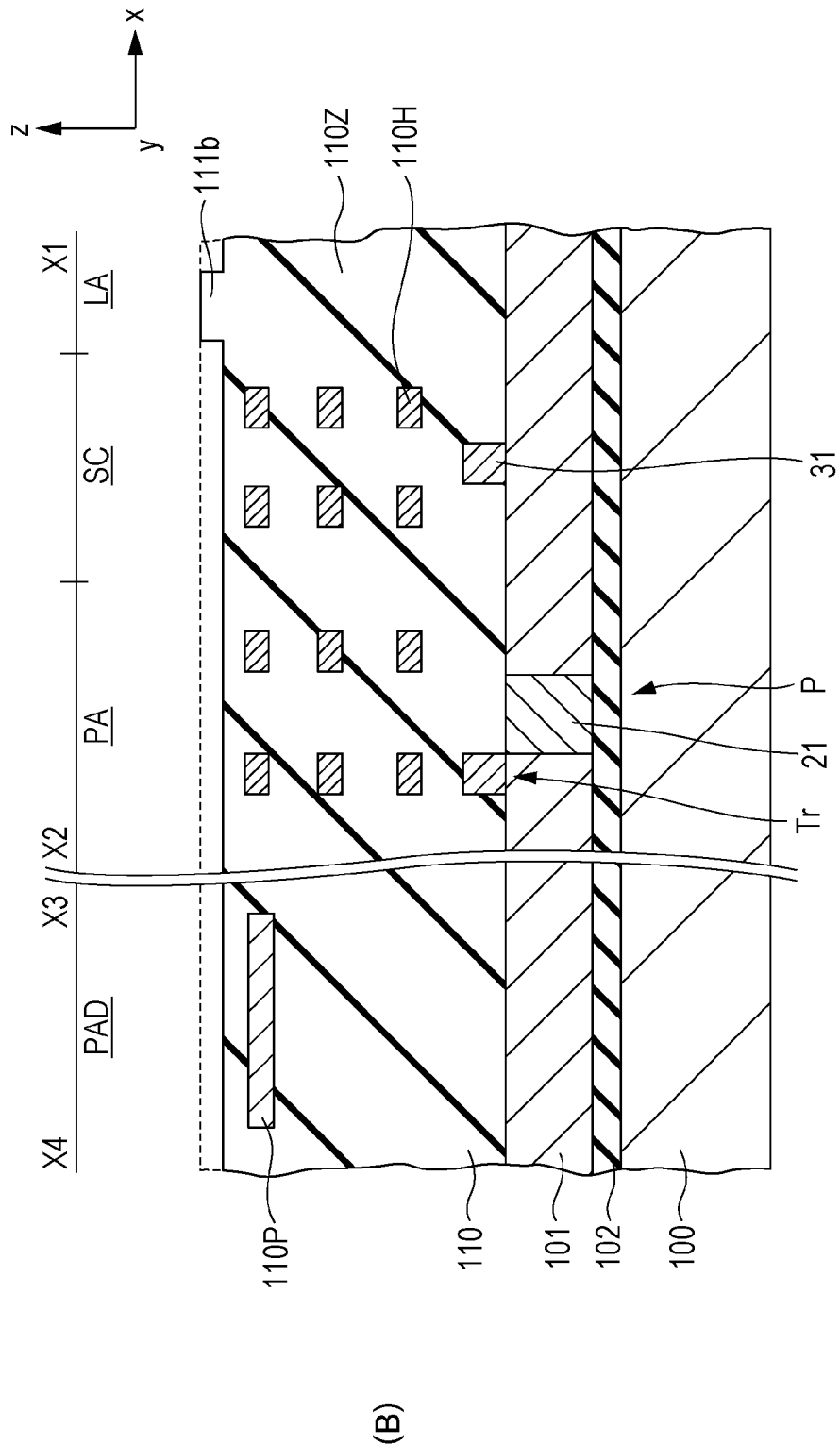
FIG. 20 is a diagram illustrating a manufacturing method of a solid-state imaging device in the embodiment 2 of the present disclosure.

Next, as shown in (B) of FIG. 20, the convex section 111b is formed.

Here, the convex section 111b is formed in the scribe region LA by the top layer of the insulation film 110Z which configures the wiring layer 110 in the upper surface (front surface) of the wiring layer 110 being processed.

Specifically, the convex section 111b is formed by a portion (portion of dashed line) in a region other than the region where the convex section 111b is formed in the top layer of the insulation film 110Z which configures the wiring layer 110 being removed.

For example, in this process, a photoresist film (not shown) is deposited on the upper surface of the wiring layer 110. Then, a resist pattern (not shown) is provided in the upper surface of the wiring layer 110 by the photoresist (not shown) being pattern processed using a photolithography technique so that there is a state where the portion where the convex section 111b is formed is covered and the other portions are exposed. After that, the convex section 111b is provided in the pad section PAD by a dry etching process being executed with regard to the insulation film 110Z where the wiring layer 110 is formed using the resist pattern (not shown) as a mask.

(C) Disposing of Support Substrate SK

Figure 21:
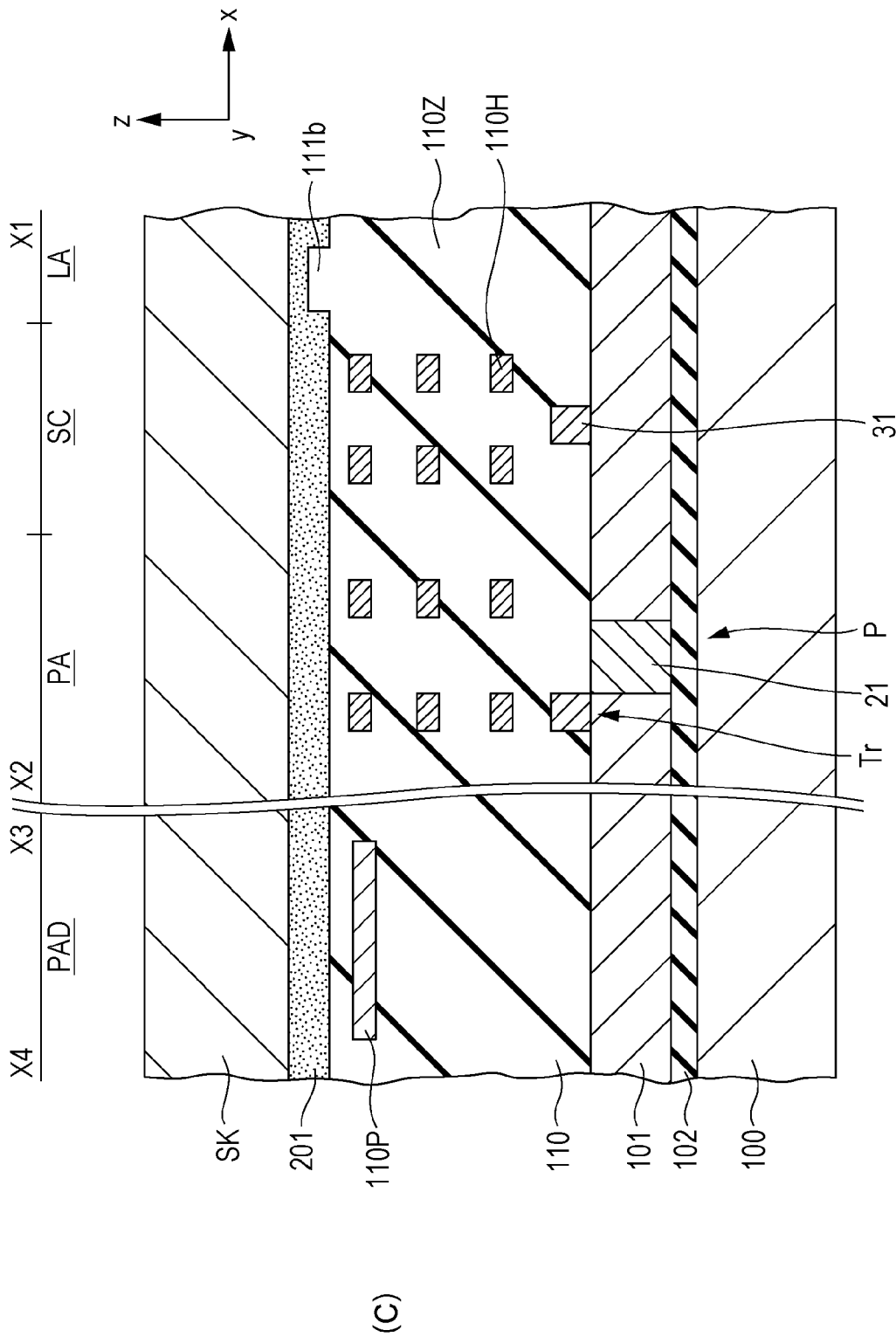
FIG. 21 is a diagram illustrating a manufacturing method of a solid-state imaging device in the embodiment 2 of the present disclosure.

Next, as shown in (C) of FIG. 21, the support substrate SK is disposed.

Here, the support substrate SK is disposed on the upper surface of the wiring layer 110 on the side which is opposite with regard to the lower surface on the side of the semiconductor layer 101.

In the embodiment, the support substrate SK which is a silicon semiconductor substrate is bonded by being attached the upper surface of the wiring layer 110 using the adhesion layer 201 in the same manner as the case of the embodiment 1.

In this process, the adhesion layer 201 is provided between the surface in the wiring layer 110 where the convex section 111b is provided only in the scribe region LA and the planar surface of the support substrate SK. As a result, in the adhesion layer 201, the portion where the convex section 111b is provided in the scribe region LA is thinner than the other portions of the pixel region PA, the peripheral circuit section SC, and the scribe region LA.

(D) Reversing of Semiconductor Substrate 100

Figure 22:
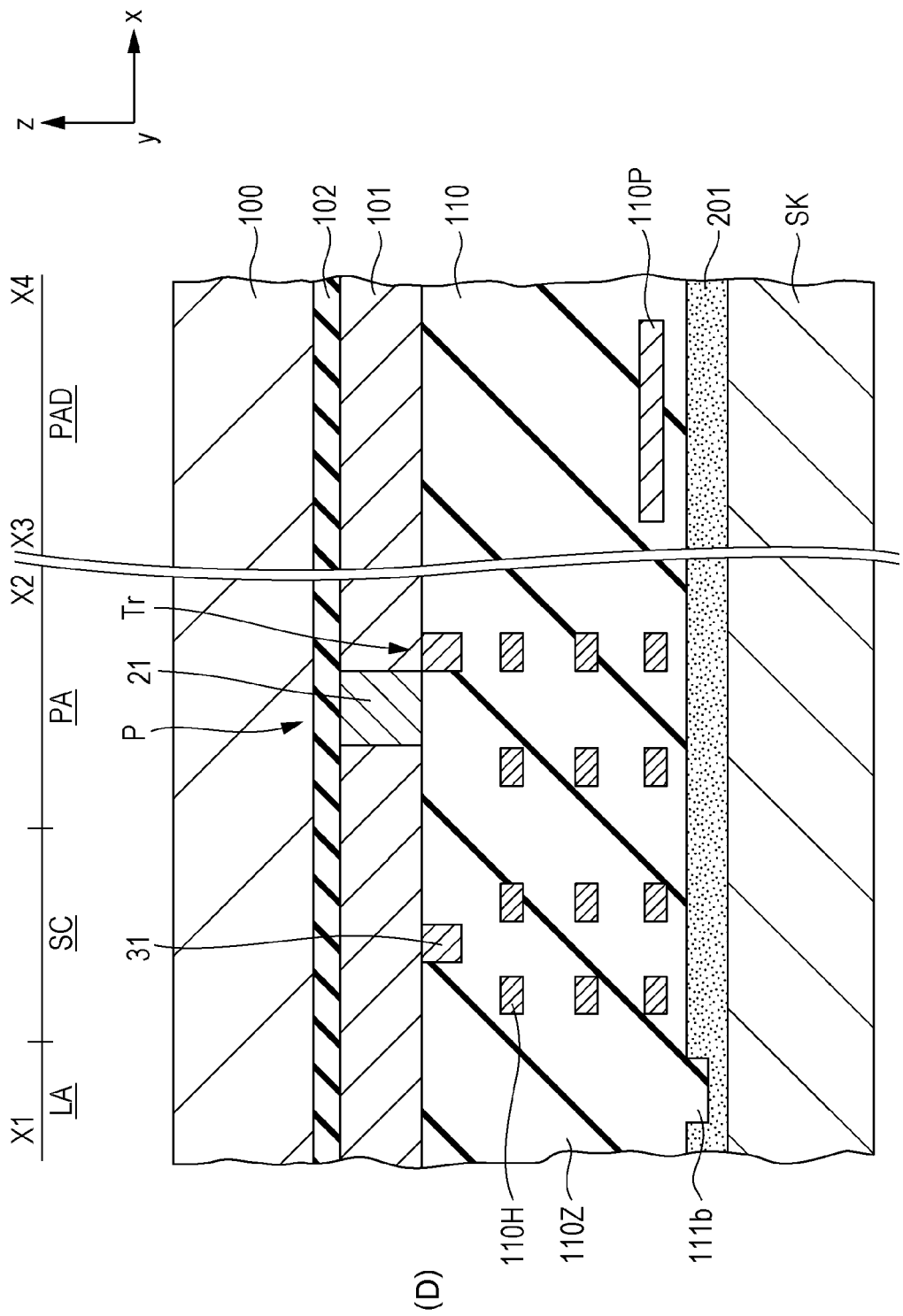
FIG. 22 is a diagram illustrating a manufacturing method of a solid-state imaging device in the embodiment 2 of the present disclosure.

Next, as shown in (D) of FIG. 22, the up and down of the semiconductor substrate 100 is reversed.

Here, the semiconductor substrate 100 is reversed so that the surface (refer to FIG. 22) of the semiconductor substrate 100 which faced downwards faces upwards in the same manner as the case of the embodiment 1.

(E) Removal of Semiconductor Substrate 100 and Embedded Oxide Film 102

Figure 23:
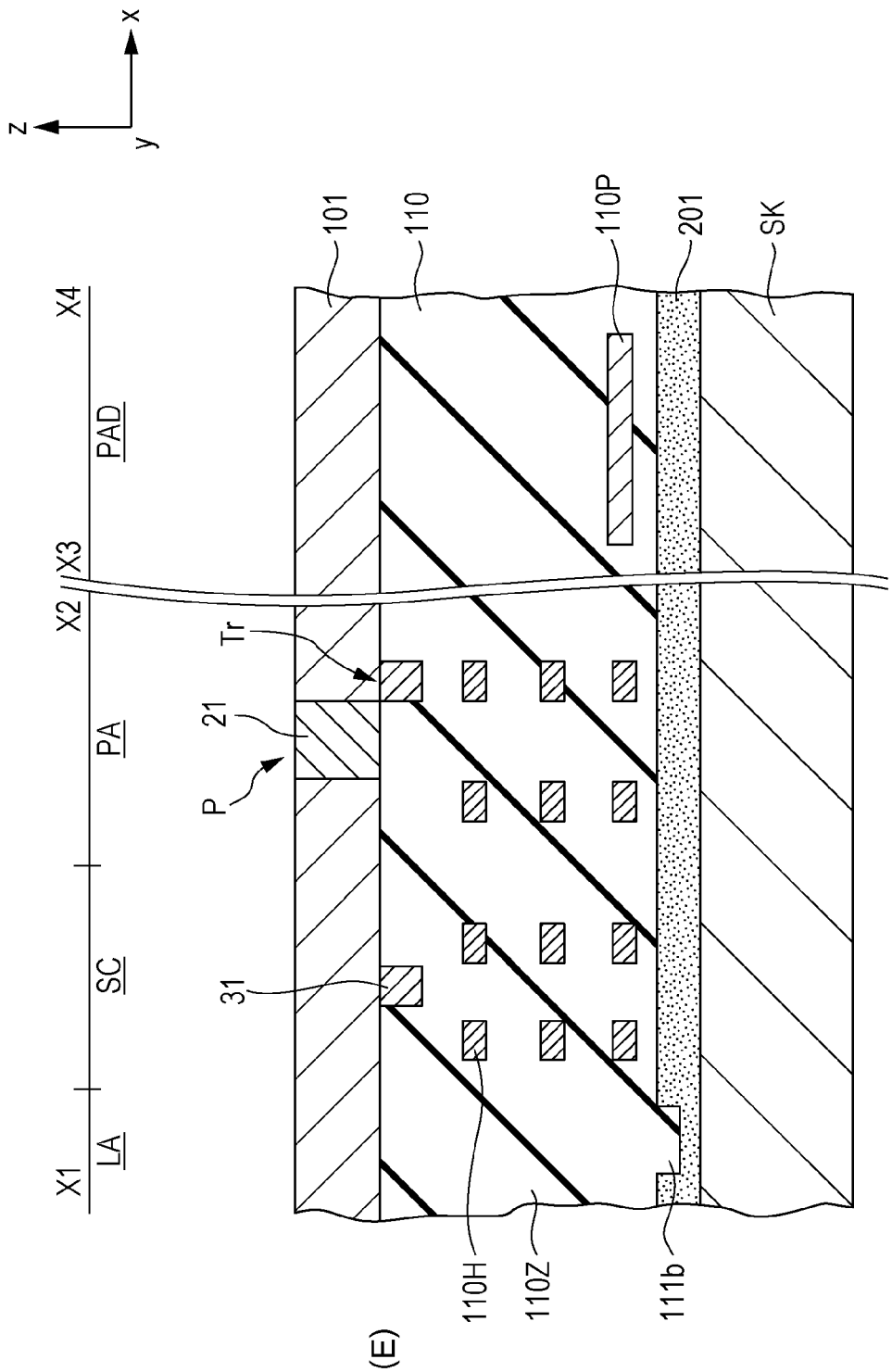
FIG. 23 is a diagram illustrating a manufacturing method of a solid-state imaging device in the embodiment 2 of the present disclosure.

Next, as shown in (E) of FIG. 23, the semiconductor substrate 100 and the embedded oxide film 102 are removed.

Here, the semiconductor substrate 100 and the embedded oxide film 102 which are provided on the upper surface (rear surface) of the semiconductor layer 101 are sequentially removed in the same manner as the case of the embodiment 1. Due to this, the upper surface (rear surface) of the semiconductor layer 101 is exposed.

(F) Forming of Color Filter CF and On-chip Lens OCL

Figure 24:
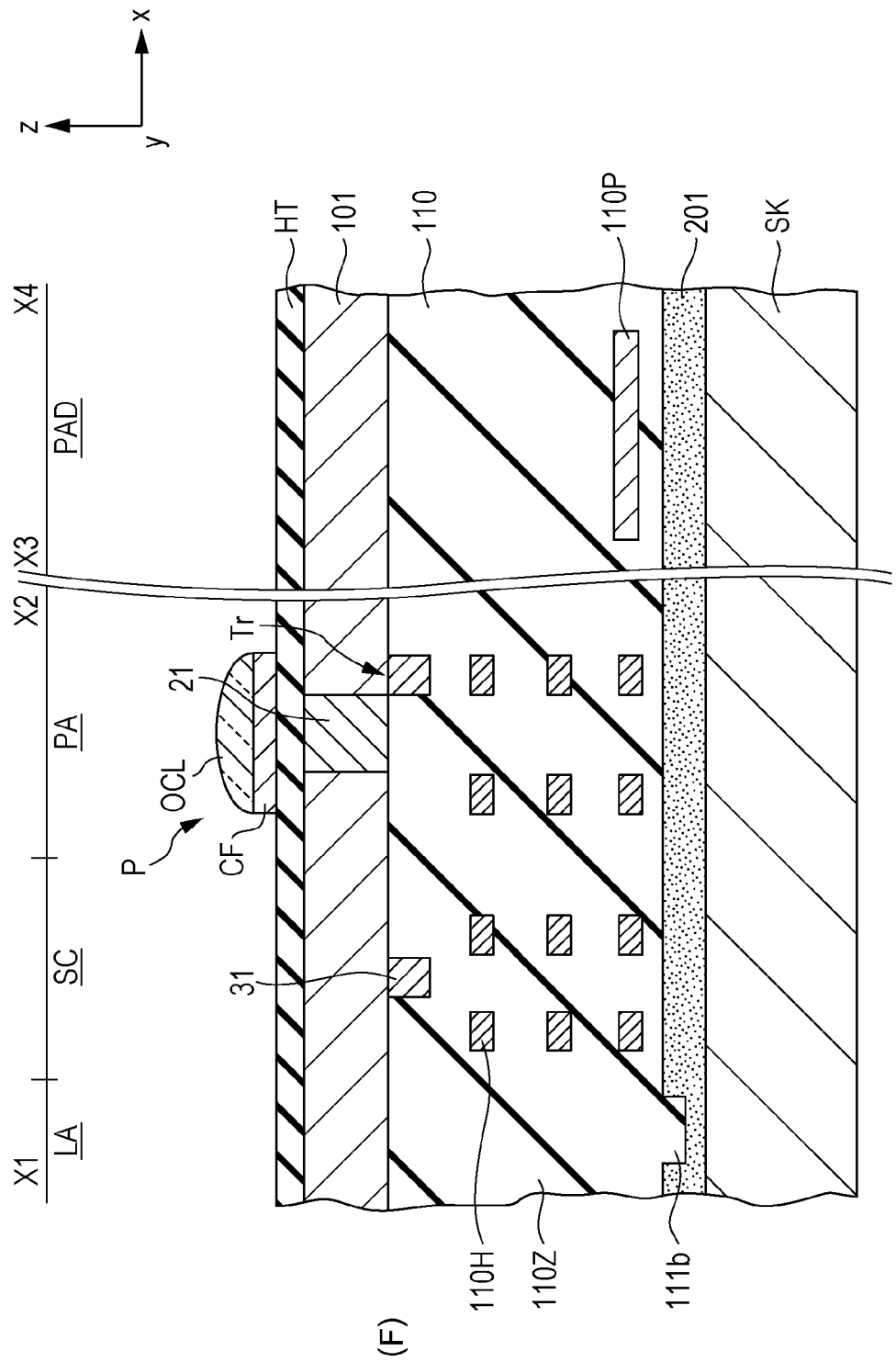
FIG. 24 is a diagram illustrating a manufacturing method of a solid-state imaging device in the embodiment 2 of the present disclosure.

Next, as shown in (F) of FIG. 24, the color filter CF and the on-chip lens OCL are formed.

Here, the color filter CF and the on-chip lens OCL are sequentially provided so as to correspond to the pixel P after the reflection preventing film HT is formed on the upper surface (rear surface) side of the semiconductor layer 101 in the same manner as the case of the embodiment 1.

(G) Forming of Opening KK

Figure 25:
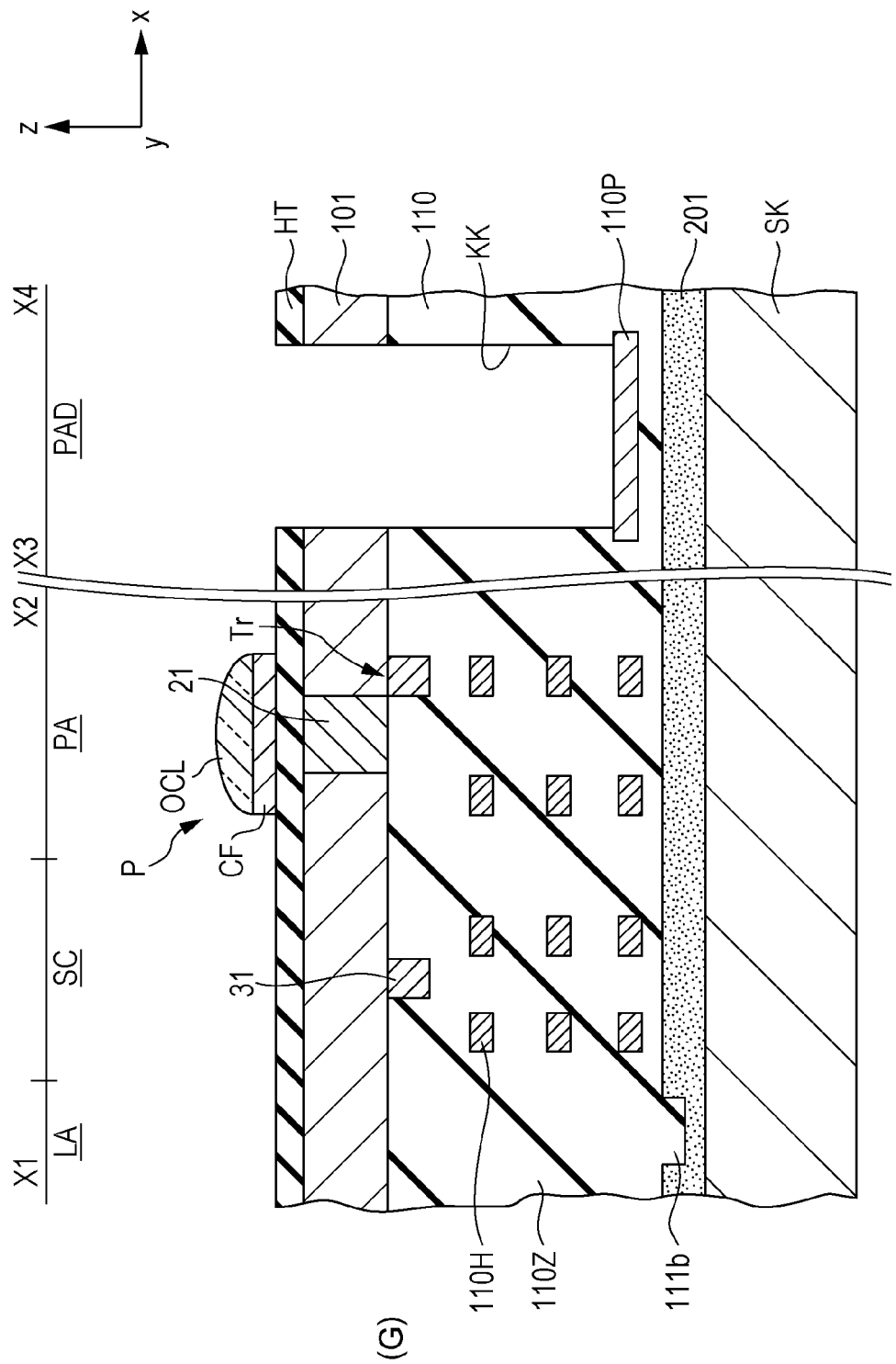
FIG. 25 is a diagram illustrating a manufacturing method of a solid-state imaging device in the embodiment 2 of the present disclosure.

Next, as shown in (G) of FIG. 25, the opening KK is formed.

Here, the opening KK is formed so that the upper surface of the pad electrode 110P which is provided in the wiring layer 110 in the pad section PAD is exposed in the same manner as the case of the embodiment 1.

By doing this, the plurality of solid-state imaging devices 1 is formed on the surface of the wafer W in the same manner as the case of FIG. 5.

(H) Cutting

Next, as shown in (H) of FIG. 26, cutting is executed.

Here, in the scribe region LA which is provided between the plurality of solid-state imaging devices 1 which are lined up to be adjacent, there is partitioning due to dicing using a blade (not shown) in the same manner as the case of the embodiment 1. That is, there is partitioning into a plurality of chips by cutting between the plurality of solid-state imaging devices.

(I) Forming of Bonding Wire BW

Next, as shown in FIG. 18, the bonding wire BW is formed.

Here, the bonding wire BW is provided on the upper surface of the pad electrode 110P which is provided above the opening KK using wire bonding in the same manner as the case of the embodiment 1. For example, the bonding wire BW and the pad electrode 110P are electrically connected using gold (Au) wire as the bonding wire BW.

Due to this, the solid-state imaging device which is a CMOS type image sensor of a rear surface illumination type is complete.

[3] Conclusion

As above, in the embodiment, the photodiode 21 is formed in the pixel region PA of the semiconductor layer 101 in the same manner as the embodiment 1. Then, the semiconductor elements such as the pixel transistor Tr are formed on the surface side of the semiconductor layer 101 on the side which is opposite to the surface where the incident light H is incident toward the photodiode 21. Then, the wiring layer 110 which includes the pad electrode 110P is formed on the surface of the semiconductor layer 101 on the side which is opposite to the surface where the incident light H is incident toward the photodiode 21 so as to cover the semiconductor elements. Then, the support substrate SK is disposed on the surface of the wiring layer 110 on the side which is opposite to the surface on the side of the semiconductor layer 101 via the adhesion layer 201 and the support substrate SK is adhered to the wiring layer 110 using the adhesion layer 201. Then, dicing is executed in the scribe region LA which is positioned in the periphery of the pixel region PA.

In the embodiment, different to the case of the embodiment 1, the convex section 111b is provided in the portion in the scribe region LA where dicing is performed in the lower surface of the wiring layer 110 which opposes the support substrate SK before the support substrate SK is disposed. Due to this, after the support substrate SK is disposed, the adhesion layer 201 between the wiring layer 110 and the support substrate SK is formed to be thinner in the portion in the scribe region LA which is cut by dicing than in the other portions due to the convex section 111b.

When partitioning by the execution of scribing, mechanical shocks are added. As a result, there are cases where small cracks are generated in the insulation film 110Z which configures the wiring layer 110 in the scribe region LA.

However, in the embodiment, the adhesion layer 201 is interposed between the lower surface of the wiring layer 110 where the convex section 111b is provided only in the scribe region LA and the planar surface of the support substrate SK. In the adhesion layer 201, the film thickness T3b of the scribe region LA is thinner than the film thickness T1 of the other portions (refer to FIG. 18).

As a result, in the embodiment, the stress which is applied to the insulation film 110Z of the wiring layer 110 due to the mechanical shocks from scribing is alleviated.

As such, in the embodiment, it is possible to prevent the generation of small cracks when mechanical shocks are applied as in the case of executing scribing.

Figure 27:
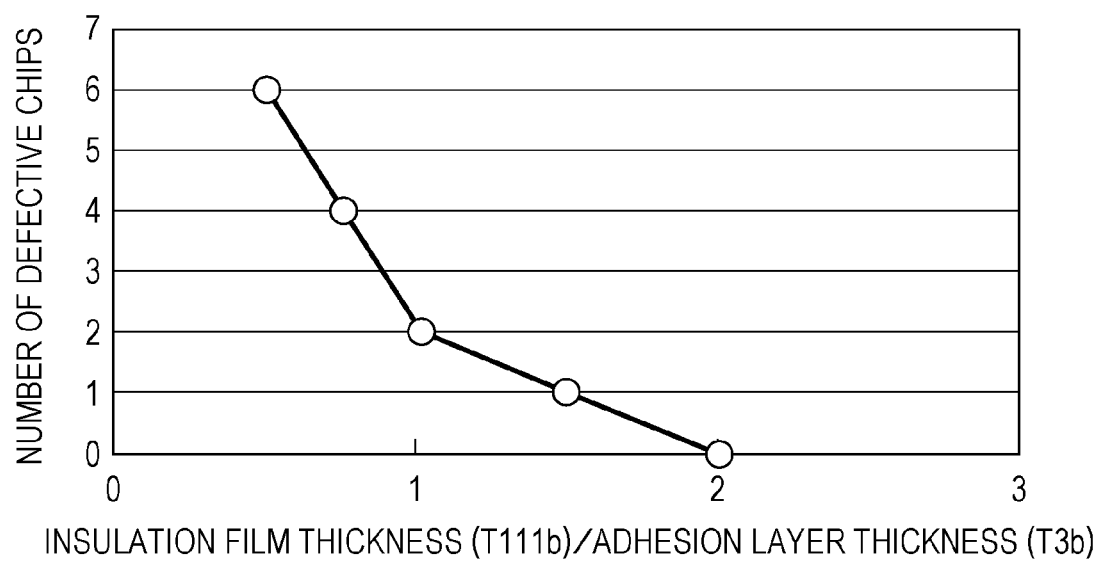
FIG. 27 is a diagram illustrating the number of defective chips in the embodiment 2 of the present disclosure.

FIG. 27 is a diagram illustrating the number of defective chips in the embodiment 2 of the present disclosure.

In FIG. 27, the horizontal axis is "thickness of insulation film"/"thickness of adhesion layer" and the vertical axis is the number of defective chips.

Specifically, in FIG. 27, the "thickness of insulation film" is T111b in FIG. 18. That is, the "thickness of insulation film" indicates the thickness of the portion where the convex section 111b is provided out of the top layer of the insulation film which configures the wiring layer 110 (the bottom layer in FIG. 18). In addition, the "thickness of adhesion layer" is T2 in FIG. 3. In addition, the "thickness of adhesion layer" is T3b in FIG. 18. In FIG. 27, the results are shown in a case where "thickness of insulation film is fixed and the "thickness of adhesion layer" is changed.

As shown in FIG. 27, as the value of "thickness of insulation film"/"thickness of adhesion layer" becomes smaller, the defects which accompany the crack generation during scribing are reduced and the number of defective chips per wafer is reduced. As is understood from this, it is possible to reduce the crack generation rate by making the adhesion layer 201 thinner.

In particular, in the embodiment, the convex section 111b is provided on the surface of the wiring layer 110 which opposes the support substrate SK. As a result, in the portion where the convex section 111b is formed, the thickness of the insulation film 110Z is thicker than in other portions. As a result, it is possible to more appropriately reduce the crack generation rate since the mechanical strength at this portion is increased.

As described above, in the case where the film thickness of the adhesion layer 201 is made to be thinner, there are cases where the generation of coating irregularities and voids are remarkable, and as a result, there are cases where the bonding quality is reduced and there are defects which are the reduction in product yield.

However, in the embodiment, the film thickness of the adhesion layer 201 only in the portion where mechanical shocks are applied is made to be thinner and the film thickness of the adhesion layer 201 is thicker in other portions in the same manner as the embodiment 1. As a result, in the portion where the mechanical shocks are not applied, it is possible to suppress the generation of coating irregularities and voids since the film thickness of the adhesion layer 201 is thick. Along with this, even in the portions where the film thickness of the adhesion layer 201 which mechanical shocks are applied is thin, it is possible to suppress the generation of coating irregularities and voids since the adhesion material comes around from the portion in the periphery thereof where the adhesion layer 201 is thick when coating.

Accordingly, in the embodiment, improvement in the product reliably and in the product yield and manufacturing with a high manufacturing efficiency is possible.

3. Embodiment 3

[1] Device Configuration and the Like

Figure 28:
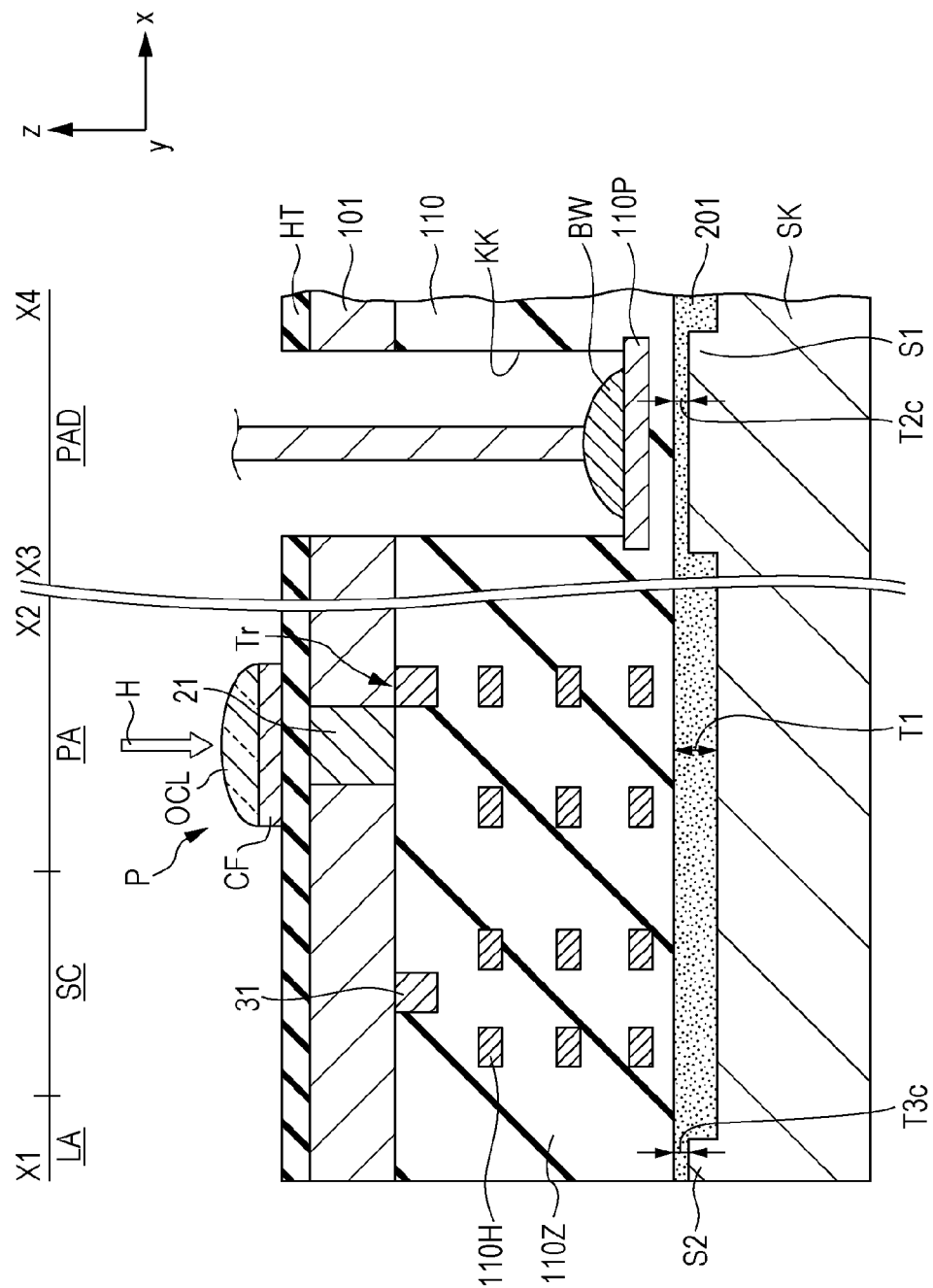
FIG. 28 is a diagram illustrating important parts of a solid-state imaging device in an embodiment 3 of the present disclosure.

FIG. 28 is a diagram illustrating important parts of a solid-state imaging device in an embodiment 3 of the present disclosure.

FIG. 28 shows a cross section of an X1-X2 portion and a cross section of an X3-X4 portion shown in FIG. 2 in the same manner as FIG. 3. That is, in FIG. 28, the pixel region PA, the peripheral region section SC, the pad section PAD, and the scribe region LA are shown.

As shown in FIG. 28, in the embodiment, the shape of the lower surface of the wiring layer 110 which opposes the support substrate SK is different to the embodiment 1. In addition, the shape of the upper surface of the support substrate SK which opposes the wiring layer 110 is different to the embodiment 1. Excluding this point and other related points, the embodiment is the same as the embodiment 1. As a result, the description of the portions which overlap are omitted.

As shown in FIG. 28, the lower surface of the wiring layer 110 is different to the case of the embodiment 1 and the entire surface is planar, and a convex section which protrudes downward with a convex shape is not provided.

With regard to this, as shown in FIG. 28, convex sections S1 and S2 which protrude upward with a convex shape are provided in the upper surface of the support substrate SK and all over the entire surface is not planar.

As shown in FIG. 28, the convex section S1 is provided in the portion in the upper surface of the support substrate SK where the pad electrode 110P is formed in the pad section PAD. Along with this, the convex section S2 is provided in the portion in the upper surface of the support substrate SK which corresponds to the scribe region LA. Each of the convex sections S1 and S2 are formed by the support substrate SK being processed.

Then, the adhesion layer 201 is provided between the upper surface of the support substrate SK and the lower surface of the wiring layer 110 and both are adhered.

Here, the planar lower surface of the wiring layer 110 opposes the upper surface of the support substrate SK where the convex sections S1 and S2 are provided and the adhesion layer 201 is provided therebetween. Between the lower surface of the wiring layer 110 and the portion in the upper surface of the support substrate SK where the convex sections S1 and S2 are provided is narrower than the other portions.

As a result, a film thickness T2c of the adhesion layer 201 in the portion of the upper surface of the support substrate SK where the pad electrode 110P is provided is thinner than the film thickness T1 of the portion in the pixel region PA and the peripheral circuit section SC. Furthermore, the film thickness T3c of the adhesion layer 201 in the portion of the upper surface of the support substrate SK which corresponds to the scribe region LA is thinner than the film thickness T1 of the portion in the pixel region PA and the peripheral circuit section SC. That is, the film thicknesses T2c and T3c of the adhesion layer 201 in the portion of the upper surface of the support substrate SK where the pad electrode 110P is provided and in the portion of the upper surface of the support substrate SK which corresponds to the scribe region LA is thinner than the film thickness T1 of the other portions.

[2] Manufacturing Method

The important parts of a manufacturing method where the solid-state imaging device described above is manufactured will be described.

FIGS. 29 to 34 are diagrams illustrating a manufacturing method of a solid-state imaging device in the embodiment 3 of the present disclosure.

FIGS. 29 to 34 show a cross section of an X1-X2 portion and a cross section of an X3-X4 portion shown in FIG. 2 in the same manner as FIG. 28. That is, in FIGS. 29 to 34, the pixel region PA, the peripheral region section SC, the pad section PAD, and the scribe region LA are shown.

Here, through each of the processes which are shown as (A) to (E) in FIGS. 29 to 33, the plurality of the solid-state imaging devices 1 as shown in FIG. 5 are formed in the wafer W.

Figure 34:
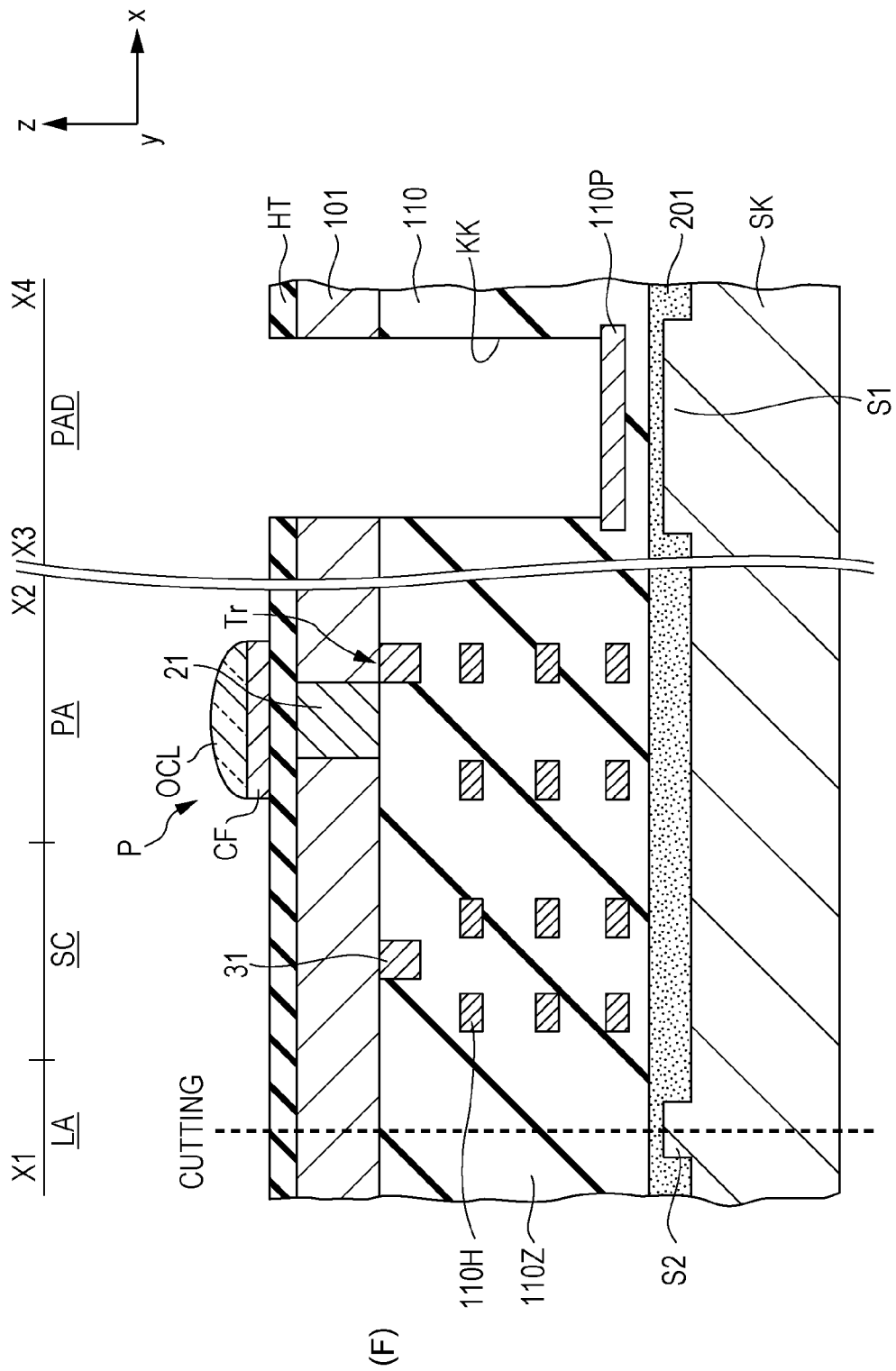
FIG. 34 is a diagram illustrating a manufacturing method of a solid-state imaging device in the embodiment 3 of the present disclosure.

After that, through a process shown as (F) in FIG. 34, the wafer W is divided up by dicing in the scribe region LA. Then, the solid-state imaging device as shown in FIG. 28 is completed by each section being provided.

Through the following, each of the manufacturing process of the solid-state imaging device will be sequentially described.

(A) Disposing of Support Substrate SK

Figure 29:
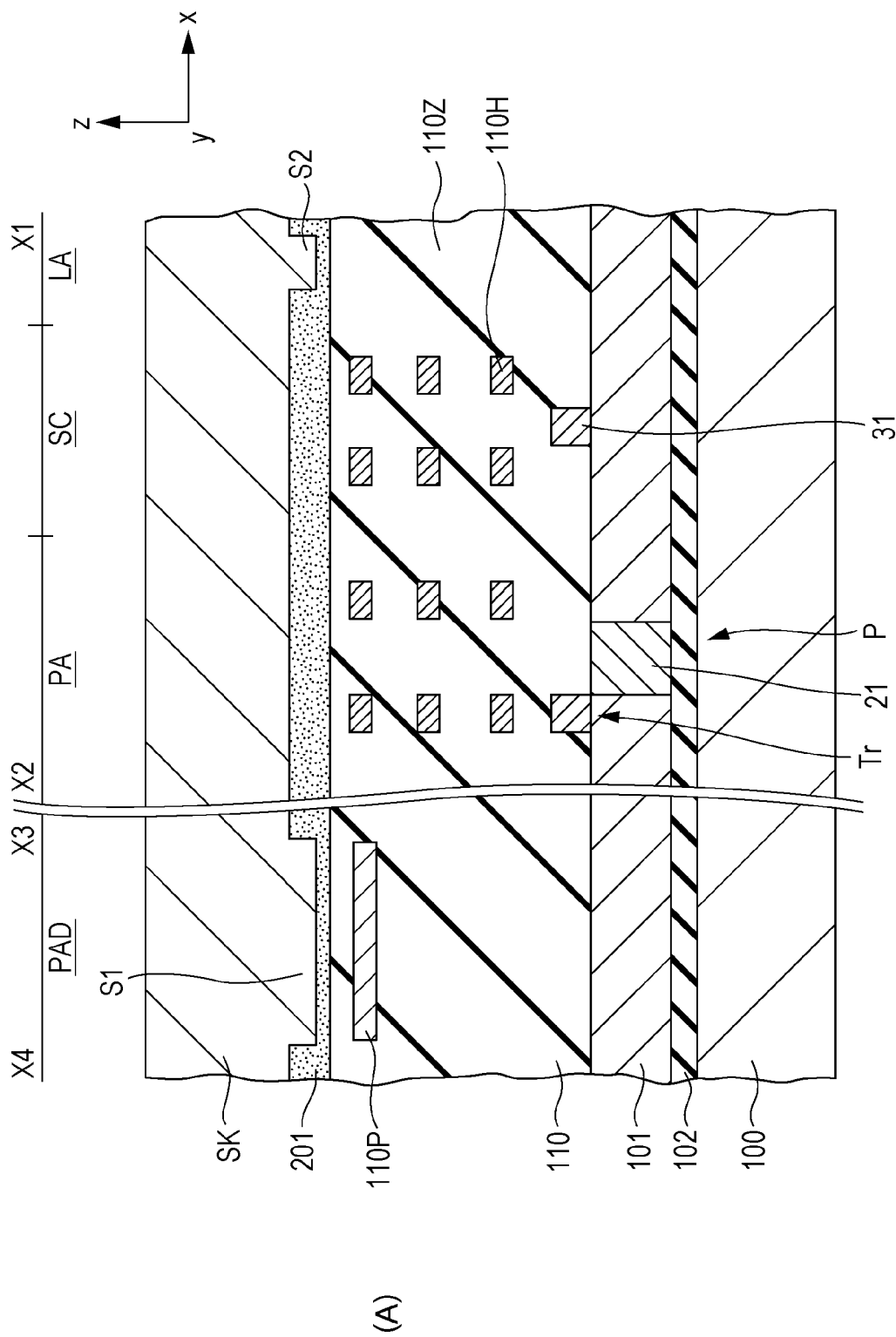
FIG. 29 is a diagram illustrating a manufacturing method of a solid-state imaging device in the embodiment 3 of the present disclosure.

First, as shown in (A) of FIG. 29, the support substrate SK is disposed.

Before the execution of this process, each of the processes of (A) of FIG. 6, (B) of FIG. 6, (C) of FIG. 7, and (D) of FIG. 8 are executed in the same manner as the embodiment 1. Then, the process shown in (A) of FIG. 19 is executed in the same manner as the embodiment 2.

That is, as shown in (A) of FIG. 6, the wafer W is prepared. Next, as shown in (B) of FIG. 6, the photodiode 21 is formed. Next, as shown in (C) of FIG. 7, the pixel transistor Tr and the peripheral transistor 31 are formed. Next, as shown in (D) of FIG. 8, the wiring layer 110 is formed. Then, as shown in (A) of FIG. 19, the upper surface of the wiring layer 110 is planarized by each of the convex section 111 of the pad section PAD and the convex section 112 of the pixel region PA and the peripheral circuit section SC in the upper surface of the wiring layer 110 being removed.

After that, as shown in (A) of FIG. 29, the support substrate SK is disposed on the upper surface of the wiring layer 110.

Here, the support substrate SK which is a silicon semiconductor substrate is bonded by being attached the upper surface of the wiring layer 110 using the adhesion layer 201 in the same manner as the case of the embodiment 1.

In the embodiment, the support substrate SK is prepared so that the convex section S1 is provided in the portion of the lower surface of the support substrate SK which corresponds to the pad section PAD and the convex section S2 is provided in the scribe region LA.

Then, after the adhesion layer 201 is coated on the upper surface of the wiring layer 110, the lower surface of the support substrate SK where the convex sections S1 and S2 are provided and the planar upper surface of the wiring layer 110 are bonded so as to oppose each other. As a result, in the adhesion layer 201, the portion where the convex section S1 is provided in the pad section PAD is thinner than the other portions of the pixel region PA and the peripheral circuit section SC. In addition, in the adhesion layer 201, the portion where the convex section S2 is provided in the scribe region LA is thinner than the other portions of the pixel region PA and the peripheral circuit section SC.

(B) Reversing of Semiconductor Substrate 100

Figure 30:
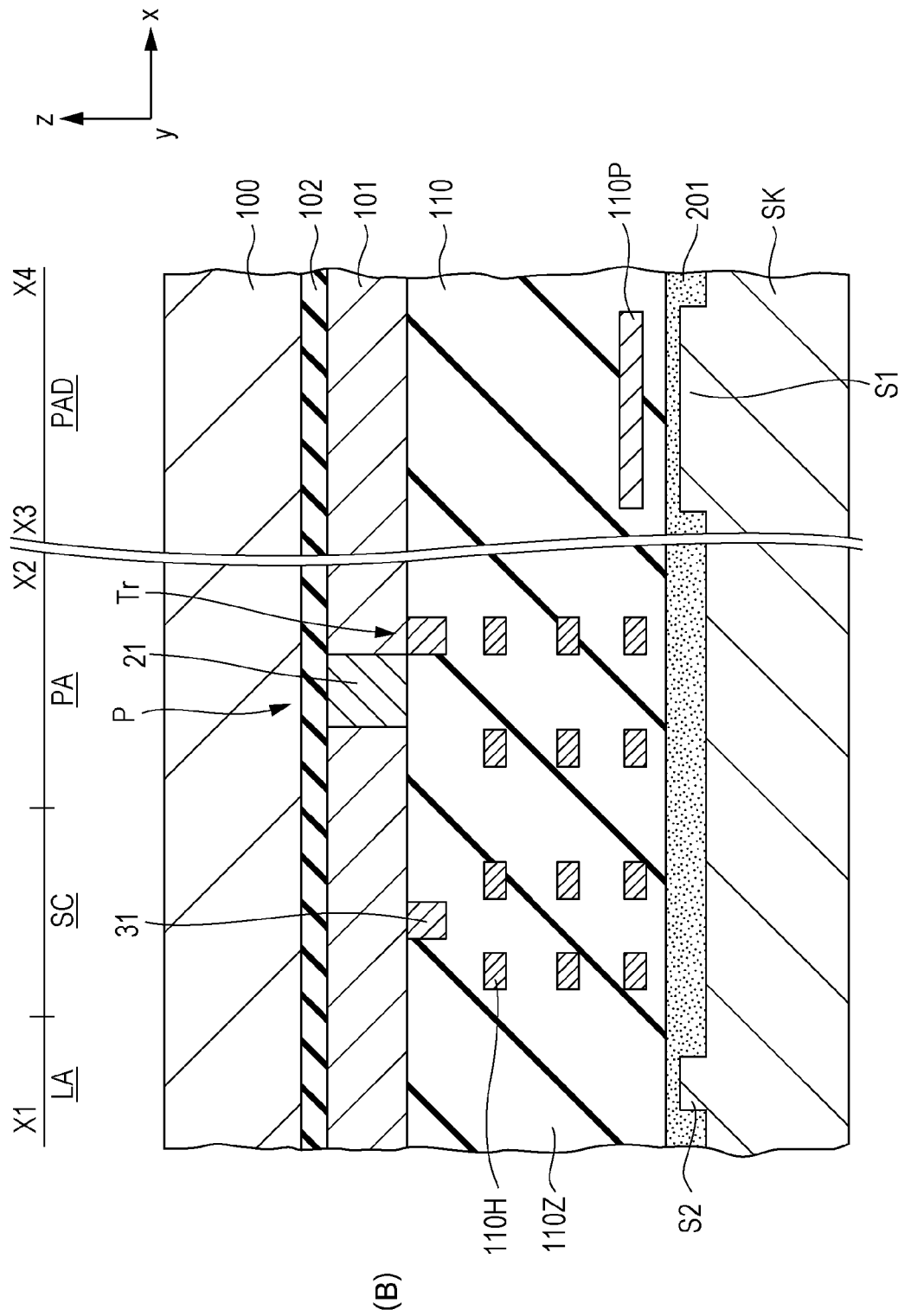
FIG. 30 is a diagram illustrating a manufacturing method of a solid-state imaging device in the embodiment 3 of the present disclosure.

Next, as shown in (B) of FIG. 30, the up and down of the semiconductor substrate 100 is reversed.

Here, the semiconductor substrate 100 is reversed so that the surface of the semiconductor substrate 100 which faced downwards faces upwards in the same manner as the case of the embodiment 1.

(C) Removal of Semiconductor Substrate 100 and Embedded Oxide Film 102

Figure 31:
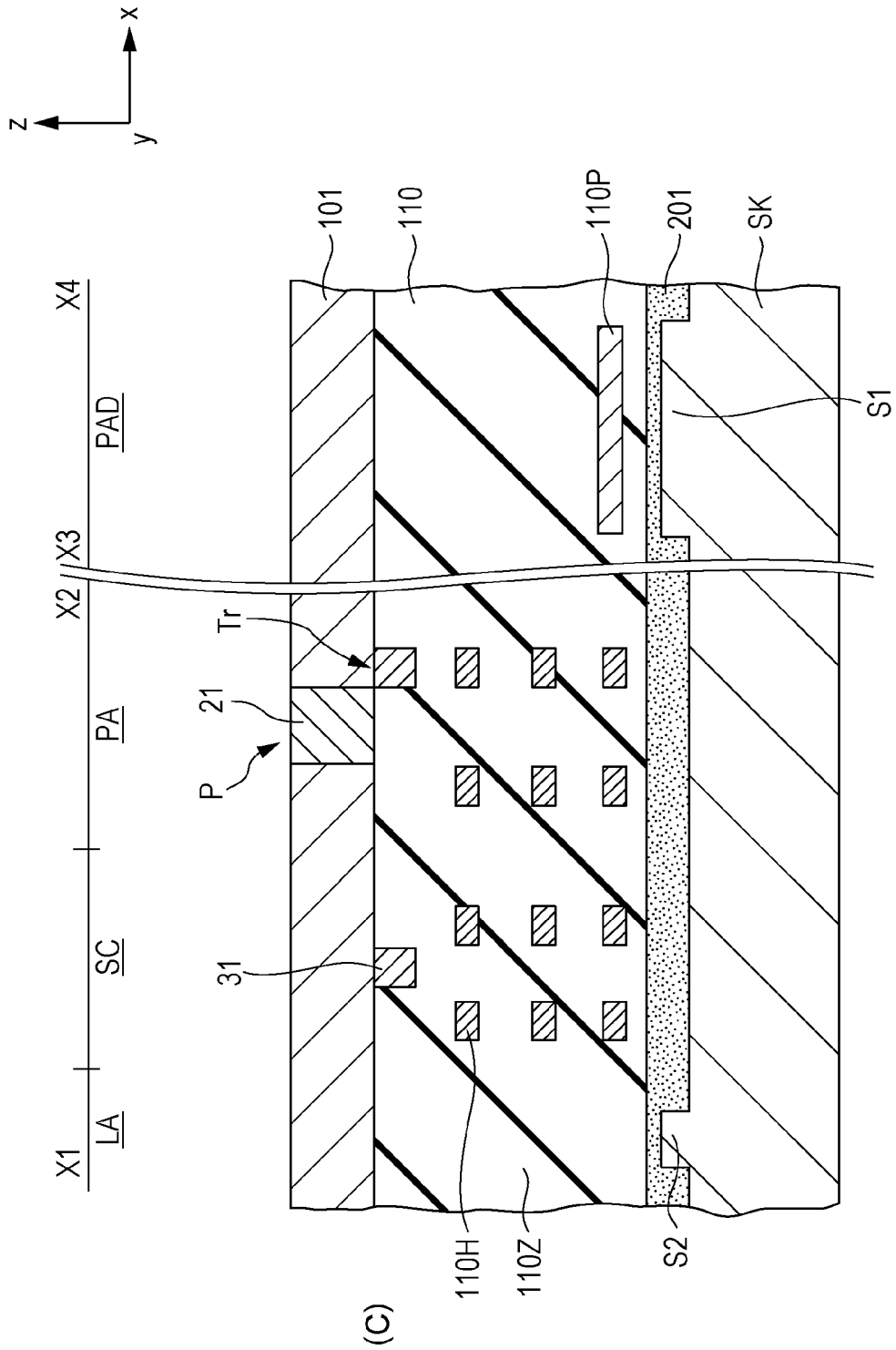
FIG. 31 is a diagram illustrating a manufacturing method of a solid-state imaging device in the embodiment 3 of the present disclosure.

Next, as shown in (C) of FIG. 31, the semiconductor substrate 100 and the embedded oxide film 102 are removed.

Here, the semiconductor substrate 100 and the embedded oxide film 102 which are provided on the upper surface (rear surface) of the semiconductor layer 101 are sequentially removed in the same manner as the case of the embodiment 1. Due to this, the upper surface (rear surface) of the semiconductor layer 101 is exposed.

(D) Forming of Color Filter CF and On-chip Lens OCL

Figure 32:
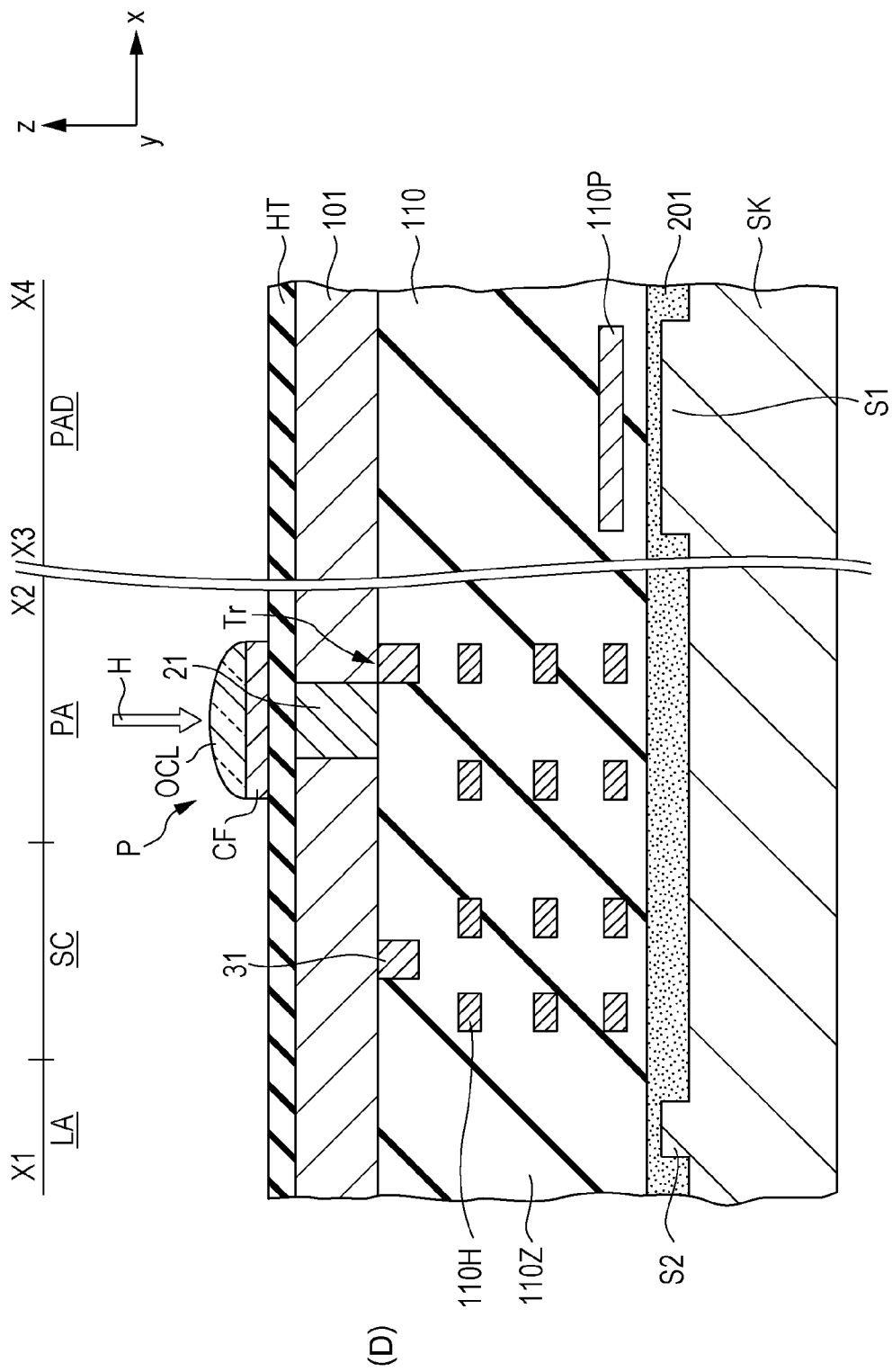
FIG. 32 is a diagram illustrating a manufacturing method of a solid-state imaging device in the embodiment 3 of the present disclosure.

Next, as shown in (D) of FIG. 32, the color filter CF and the on-chip lens OCL are formed.

Here, the color filter CF and the on-chip lens OCL are sequentially provided so as to correspond to the pixel P after the reflection preventing film HT is formed on the upper surface (rear surface) side of the semiconductor layer 101 in the same manner as the case of the embodiment 1.

(E) Forming of Opening KK

Figure 33:
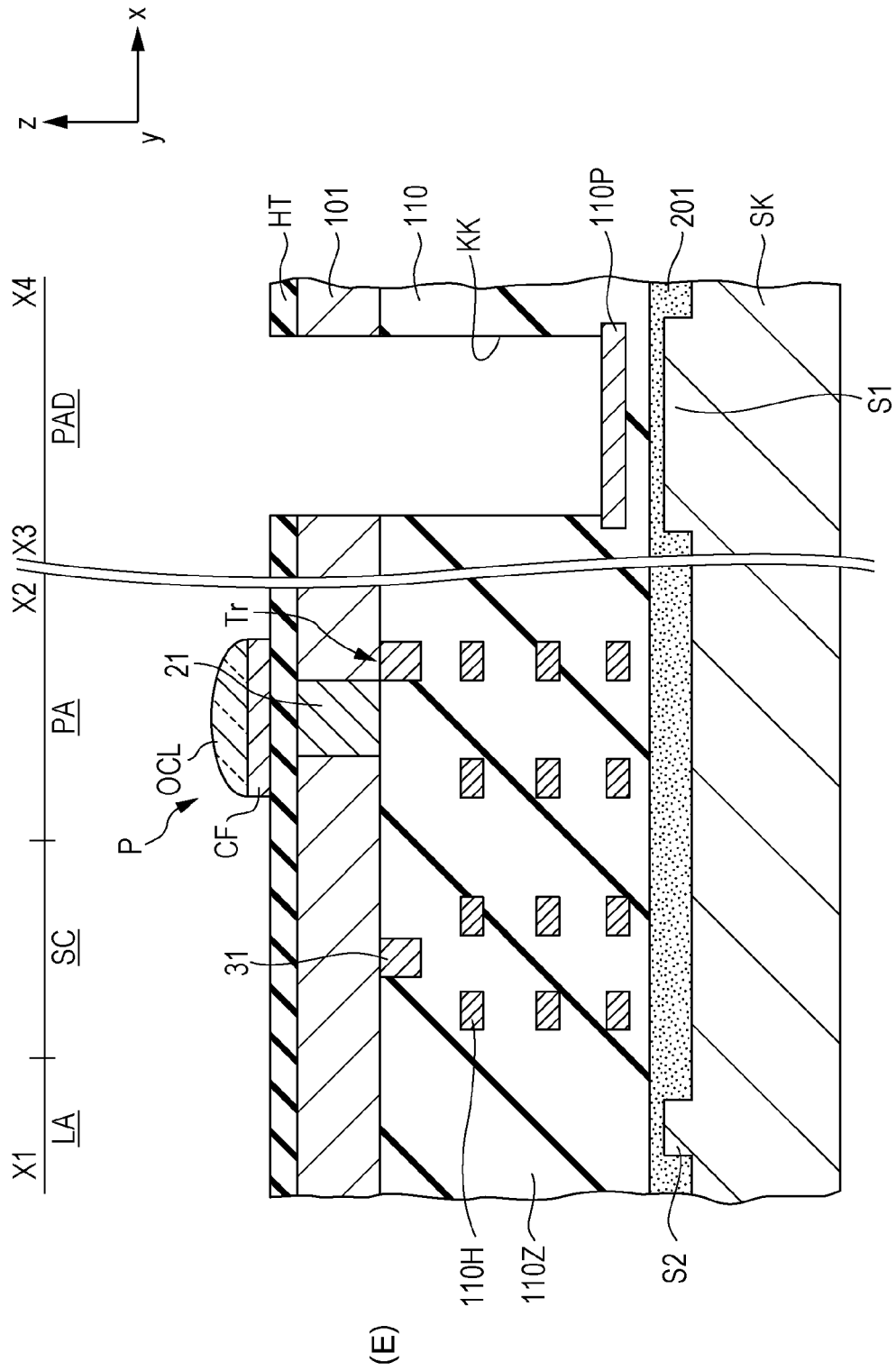
FIG. 33 is a diagram illustrating a manufacturing method of a solid-state imaging device in the embodiment 3 of the present disclosure.

Next, as shown in (E) of FIG. 33, the opening KK is formed.

Here, the opening KK is formed so that the upper surface of the pad electrode 110P which is provided in the inner portion of the wiring layer 110 in the pad section PAD is exposed in the same manner as the case of the embodiment 1.

By doing this, the plurality of solid-state imaging devices 1 is formed on the surface of the wafer W in the same manner as the case of FIG. 5.

(F) Cutting

Next, as shown in (F) of FIG. 34, cutting is executed.

Here, in the scribe region LA which is provided between the plurality of solid-state imaging devices which are lined up to be adjacent, there is partitioning due to dicing using a blade (not shown) in the same manner as the case of the embodiment 1. That is, there is partitioning into a plurality of chips by cutting between the plurality of solid-state imaging devices.

(G) Forming of Bonding Wire BW

Next, as shown in FIG. 28, the bonding wire BW is formed.

Here, the bonding wire BW is provided on the upper surface of the pad electrode 110P which is provided above the opening KK using wire bonding in the same manner as the case of the embodiment 1. For example, the bonding wire BW and the pad electrode 110P are electrically connected using gold (Au) wire as the bonding wire BW.

Due to this, the solid-state imaging device which is a CMOS type image sensor of a rear surface illumination type is complete.

[3] Conclusion

As above, in the embodiment, the photodiode 21 is formed in the pixel region PA of the semiconductor layer 101 in the same manner as the embodiment 1. Then, the semiconductor elements such as the pixel transistor Tr are formed on the surface side of the semiconductor layer 101 on the side which is opposite to the surface where the incident light H is incident toward the photodiode 21. Then, the wiring layer 110 which includes the pad electrode 110P is formed on the surface of the semiconductor layer 101 on the side which is opposite to the surface where the incident light H is incident toward the photodiode 21 so as to cover the semiconductor elements. Then, the support substrate SK is disposed on the surface of the wiring layer 110 on the side which is opposite to the surface on the side of the semiconductor layer 101 via the adhesion layer 201 and the support substrate SK is adhered to the wiring layer 110 using the adhesion layer 201. Then, the opening KK is formed so that the surface of the pad electrode 110P on the side of the semiconductor layer 101 is exposed. Then, the bonding wire BW is provided on the surface of the pad electrode 110P which is exposed by the opening KK. Then, dicing is executed in the scribe region LA which is positioned in the periphery of the pixel region PA.

In the embodiment, different to the case of the embodiment 1, the convex section S1 is provided in the portion where the pad electrode 110P is formed in the surface of the support substrate SK which opposes the wiring layer 110 before the support substrate SK is disposed. Along with this, the convex section S2 is provided in the portion in the scribe region LA which is cut during dicing in the surface of the support substrate SK which opposes the wiring layer 110.

As a result, after the disposing of the support substrate SK, in the adhesion layer 201, the film thickness $T2c$ of the portion where the pad electrode 110P is provided in the pad section PAD is thinner than the film thickness T1 in the other portions of the pixel region PA and the peripheral circuit section SC (refer to FIG. 28). That is, below the pad electrode 110P where mechanical shocks are applied from above, the film thickness of the adhesion layer 201 is thinner than the portions of the pixel region PA and the peripheral circuit section SC in the same manner as the case of the embodiment 1. As a result, the stress, which is applied to the insulation film 110Z which is interposed between the pad electrode 110P and the adhesion layer 201 in the wiring layer 110 due to mechanical shocks from the wire bonding, is alleviated.

Along with this, in the embodiment, in the adhesion layer 201, the film thickness $T3c$ in the scribe region LA is thinner than the film thickness T1 of the other portion in the pixel region PA and the peripheral circuit section SC (refer to FIG. 28). That is, the film thickness of the adhesion layer 201 in the scribe region LA where the mechanical shocks are applied is thinner than the portion in the pixel region PA and the peripheral circuit section SC in the same manner as the embodiment 2. As a result, the stress, which is applied to the insulation film 110Z in the wiring layer 110 due to mechanical shocks from the scribing, is alleviated.

As such, in the embodiment, it is possible to prevent the generation of small cracks when mechanical shocks are applied as in the case of executing wiring bonding or scribing.

In addition, in the embodiment, the film thickness of the adhesion layer 201 is thinner only in the portions where mechanical shocks are applied and the film thickness of the adhesion layer 201 is thicker in other portions in the same manner as the cases of the other embodiments. As a result, in the portions where mechanical shocks are not applied, it is possible to suppress the generation of coating irregularities and voids since the film thickness of the adhesion layer 201 is thick. Along with this, even in the portions where the film thickness of the adhesion layer 201 which mechanical shocks are applied is thin, it is possible to suppress the generation of coating irregularities and voids since the adhesion material comes around from the portion in the periphery thereof where the adhesion layer 201 is thick when coating.

Accordingly, in the embodiment, improvement in the product reliably and in the product yield and manufacturing with a high manufacturing efficiency is possible.

In particular, in the embodiment, the convex sections S1 and S2 are provided only in the surface of the support substrate SK which opposes the wiring layer 110 and are not provided in the surface of the wiring layer 110.

4. Embodiment 4

[1] Device Configuration and the Like

Figure 35:
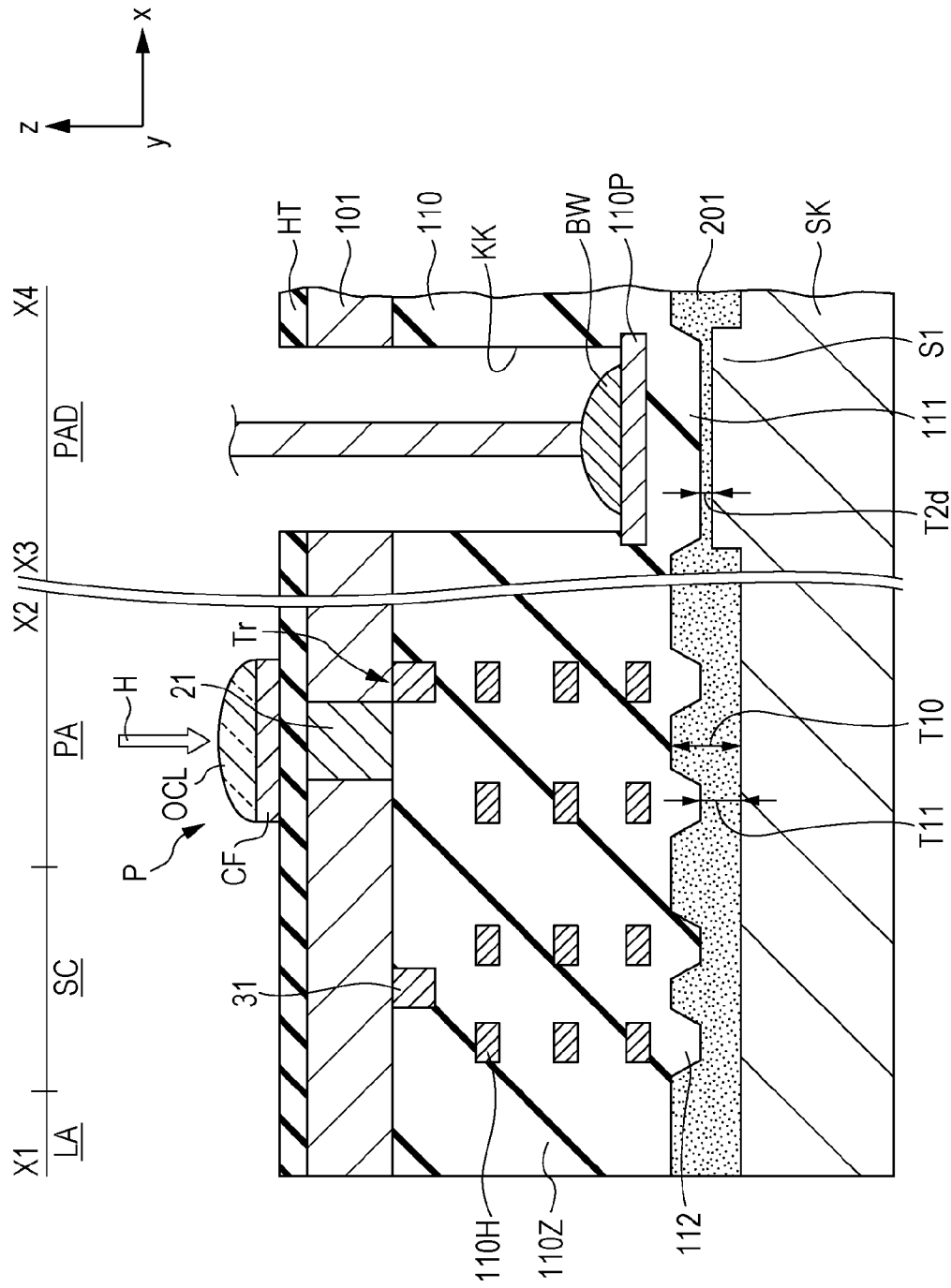
FIG. 35 is a diagram illustrating important parts of a solid-state imaging device in an embodiment 4 of the present disclosure.

FIG. 35 is a diagram illustrating important parts of a solid-state imaging device in an embodiment 4 of the present disclosure.

FIG. 35 shows a cross section of an X1-X2 portion and a cross section of an X3-X4 portion shown in FIG. 2 in the same manner as FIG. 3. That is, in FIG. 35, the pixel region PA, the peripheral region section SC, the pad section PAD, and the scribe region LA are shown.

As shown in FIG. 35, in the embodiment, the shape of the lower surface of the wiring layer 110 which opposes the support substrate SK is different to the embodiment 1. In addition, the shape of the upper surface of the support substrate SK which opposes the wiring layer 110 is different to the embodiment 1. Excluding this point and other related points, the embodiment is the same as the embodiment 1. As a result, the description of the portions which overlap are omitted.

As shown in FIG. 35, the convex sections 111 and 112 which protrude downward with a convex shape are provided in the lower surface of the wiring layer 110.

Specifically, the convex portion 111 is formed in the lower surface of the wiring layer 110 in the portion where the pad electrode 110P is formed in the pad section PAD. Along with this, the convex section 112 is formed where the third layer (bottom layer in FIG. 35) of the wiring 110H is formed in the pixel region PA and the peripheral circuit section SC. The side surfaces of each of the convex sections 111 and 112 are formed so that the width is narrower in accompaniment with heading downward from the lower surface of the wiring layer 110.

With regard to this, as shown in FIG. 35, the convex section S1 which protrudes upward with a convex shape is provided in the upper surface of the support substrate SK.

Specifically, the convex section S1 is provided in the upper surface of the support substrate SK in the portion where the pad electrode 110P is formed in the pad section PAD. The convex section S1 is formed by the support substrate SK being processed.

Then, the adhesion layer 201 is provided between the upper surface of the support substrate SK and the lower surface of the wiring layer 110 and the support substrate 110 is adhered to the support substrate SK.

Here, the lower surface of the wiring layer 110 where the convex sections 111 and 112 are provided opposes the upper surface of the support substrate SK where the convex section S1 is provided and the adhesion layer 201 is provided therebetween. Between the portion of the upper surface of the support substrate SK where the convex section S1 is provided and the portion of the lower surface of the wiring layer 110 where the convex sections 111 and 112 are provided in the pad section PAD, the gap with the lower surface of the wiring layer 110 is narrower than other portions.

As a result, a film thickness T2d of the adhesion layer 201 in the portion of the upper surface of the support substrate SK where the pad electrode 110P is provided is thinner than a film thickness T10 in the pixel region PA, the peripheral circuit section SC, and the scribe region LA. Specifically, the film thickness T2d of this portion is thinner than the film thickness T10 of the portion where the convex section 112 is not provided in the pixel region PA and the peripheral circuit section SC. Furthermore, the film thickness T2d of this portion is thinner than the film thickness T11 of the portion where the convex section 112 is provided in the pixel region PA and the peripheral circuit section SC.

[2] Manufacturing Method

The important parts of a manufacturing method where the solid-state imaging device described above is manufactured will be described.

Figure 36:
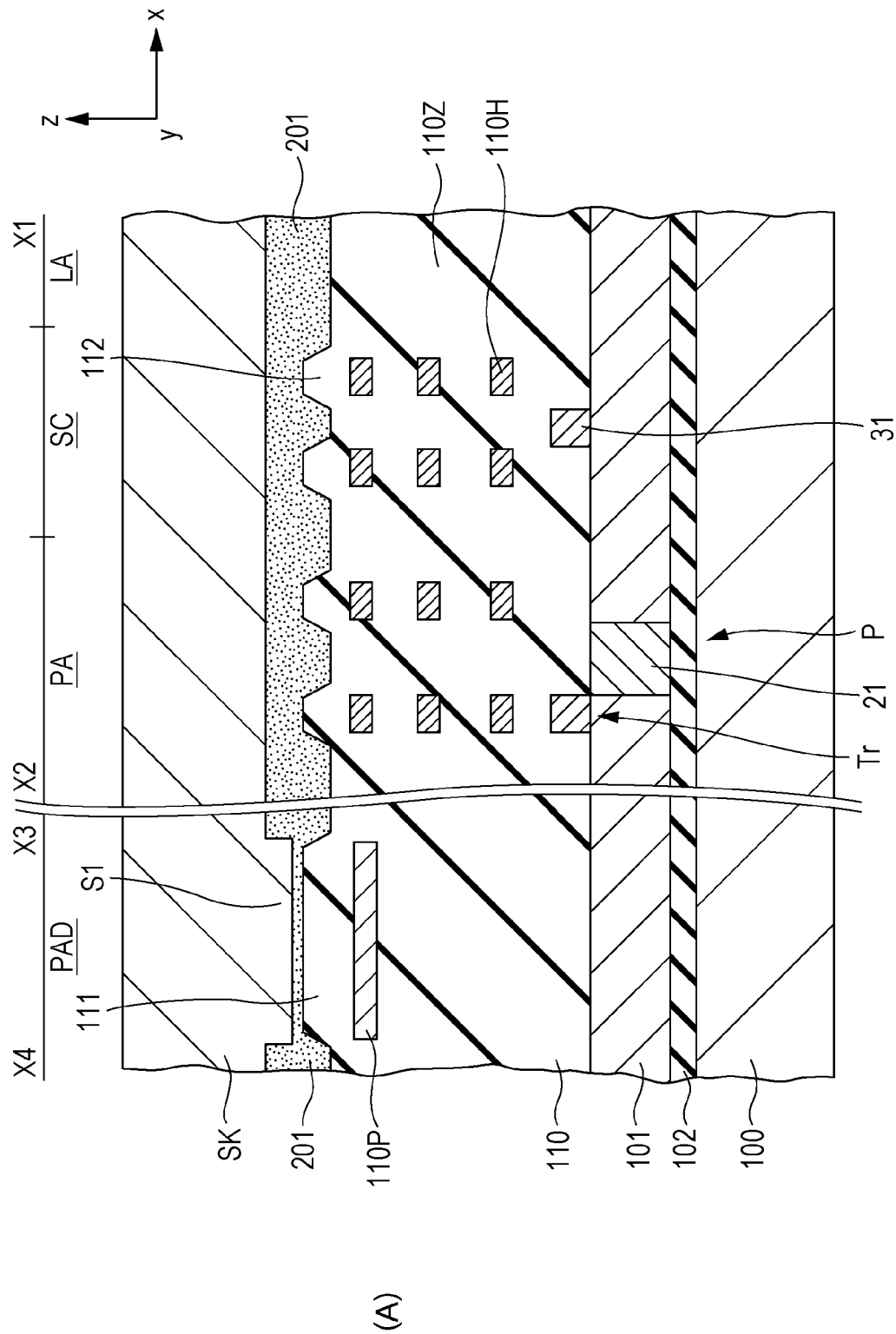
FIG. 36 is a diagram illustrating a manufacturing method of a solid-state imaging device in the embodiment 4 of the present disclosure.
Figure 37:
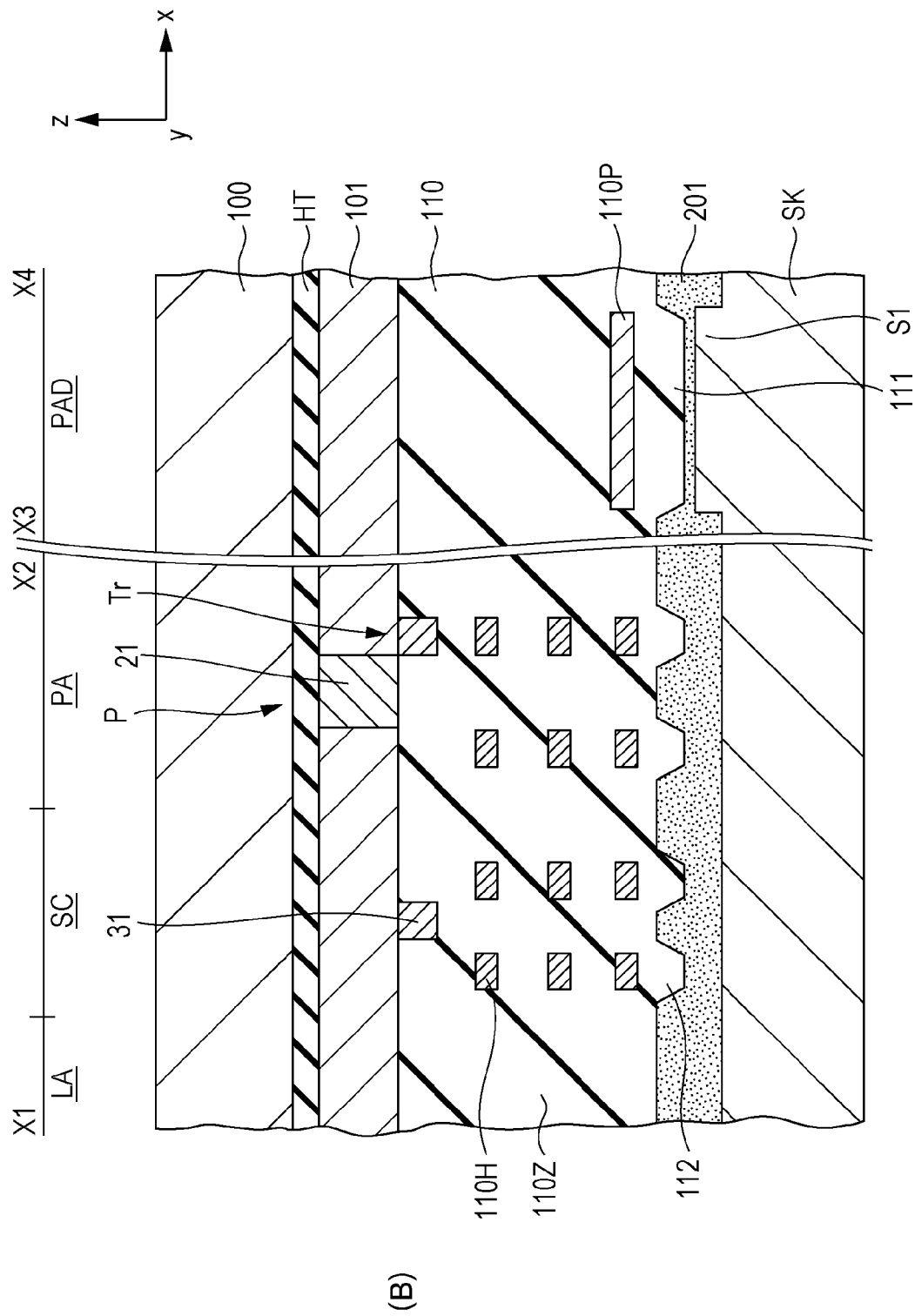
FIG. 37 is a diagram illustrating a manufacturing method of a solid-state imaging device in the embodiment 4 of the present disclosure.

FIGS. 36 and 37 are diagrams illustrating a manufacturing method of a solid-state imaging device in the embodiment 4 of the present disclosure.

FIGS. 36 and 37 show a cross section of an X1-X2 portion and a cross section of an X3-X4 portion shown in FIG. 2 in the same manner as FIG. 35. That is, in FIGS. 36 and 37, the pixel region PA, the peripheral region section SC, the pad section PAD, and the scribe region LA are shown.

Here, through each of the processes which are shown as (A) and (B) in FIGS. 36 and 37, the plurality of the solid-state imaging devices 1 as shown in FIG. 5 are formed in the wafer W.

After that, after the wafer W is divided up by dicing in the scribe region LA, the solid-state imaging device as shown in FIG. 35 is completed by each section being provided.

Through the following, each of the manufacturing process of the solid-state imaging device will be sequentially described.

(A) Disposing of Support Substrate SK

First, as shown in (A) of FIG. 36, the support substrate SK is disposed.

Before the execution of this process, each of the processes of (A) of FIG. 6, (B) of FIG. 6, (C) of FIG. 7, and (D) of FIG. 8 are executed in the same manner as the embodiment 1.

That is, as shown in (A) of FIG. 6, the wafer W is prepared. Next, as shown in (B) of FIG. 6, the photodiode 21 is formed. Next, as shown in (C) of FIG. 7, the pixel transistor Tr and the peripheral transistor 31 are formed. Next, as shown in (D) of FIG. 8, the wiring layer 110 is formed.

Due to this, in the wiring layer 110, the convex section 111 is formed in the portion where the pad electrode 110P is formed in the pad section PAD and the convex section 112 is formed in the portion where the third layer (top layer) of the wiring 110H is formed in the pixel region PA and the peripheral circuit section SC.

After that, as shown in (A) of FIG. 36, the support substrate SK is disposed on the upper surface of the wiring layer 110.

Here, the support substrate SK which is a silicon semiconductor substrate is bonded by being attached the upper surface of the wiring layer 110 using the adhesion layer 201 in the same manner as the case of the embodiment 1.

In the embodiment, the support substrate SK is prepared so that the convex section S1 is provided in the portion of the lower surface of the support substrate SK which corresponds to the pad section PAD.

Then, after the adhesion layer 201 is coated on the upper surface of the wiring layer 110, the lower surface of the support substrate SK where the convex section S1 is provided and the planar upper surface of the wiring layer 110 are bonded so as to oppose each other. As a result, in the adhesion layer 201, the portion where the convex section S1 is provided in the pad section PAD is thinner than the other portions of the pixel region PA and the peripheral circuit section SC.

(B) Reversing of Semiconductor Substrate 100

Next, as shown in (B) of FIG. 37, the up and down of the semiconductor substrate 100 is reversed.

Here, the semiconductor substrate 100 is reversed so that the surface of the semiconductor substrate 100 which faced downwards faces upwards in the same manner as the case of the embodiment 1.

(M) Forming of Each Section

Next, as shown in FIG. 35, the solid-state imaging device is completed by each section being formed.

Here, the removal of the semiconductor substrate 100 and the embedded oxide film 102 is executed (refer to FIG. 13) in the same manner as the embodiment 1. Next, the formation of the color filter CF and the on-chip lens OCL is executed (refer to FIG. 14) in the same manner as the embodiment 1. Next, the formation of the opening KK is executed (refer to FIG. 15) in the same manner as the embodiment 1. Next, the cutting is executed (refer to FIG. 16) in the same manner as the embodiment 1.

After this, as shown in FIG. 35, the forming of the bonding wire BW is executed in the same manner as the embodiment 1. Here, using wire bonding, the bonding wire BW is provided on the upper surface of the pad electrode 110P above where the opening KK is provided.

Due to this, the solid-state imaging device which is a CMOS type image sensor of a rear surface illumination type is complete.

[3] Conclusion

As above, in the embodiment, the photodiode 21 is formed in the pixel region PA of the semiconductor layer 101 in the same manner as the embodiment 1. Then, the semiconductor elements such as the pixel transistor Tr are formed on the surface side of the semiconductor layer 101 on the side which is opposite to the surface where the incident light H is incident toward the photodiode 21. Then, the wiring layer 110 which includes the pad electrode 110P is formed on the surface of the semiconductor layer 101 on the side which is opposite to the surface where the incident light H is incident toward the photodiode 21 so as to cover the semiconductor elements. Then, the support substrate SK is disposed on the surface of the wiring layer 110 on the side which is opposite to the surface on the side of the semiconductor layer 101 via the adhesion layer 201 and the support substrate SK is adhered to the wiring layer 110 using the adhesion layer 201. Then, the opening KK is formed so that the surface of the pad electrode 110P on the side of the semiconductor layer 101 is exposed. Then, the bonding wire BW is provided on the surface of the pad electrode 110P which is exposed by the opening KK. Then, dicing is executed in the scribe region LA which is positioned in the periphery of the pixel region PA.

In the embodiment, different to the case of the embodiment 1, the convex section S1 is provided in the portion where the pad electrode 110P is formed in the surface of the support substrate SK which opposes the wiring layer 110 before the support substrate SK is disposed. When the support substrate SK is disposed, the surface of the wiring layer 110, where the convex section 111 is formed in the formation portion of the pad electrode 110P and the convex section 112 is formed in the formation portion of the bottom layer of the wiring 110H, opposes the surface of the support substrate SK where the convex section S1 is formed via the adhesion layer 201.

Due to this, after the disposing of the support substrate SK, in the adhesion layer 201, the film thickness T2d of the portion where the pad electrode 110P is provided in the pad section PAD is thinner than film thicknesses T10 and T11 in the other portions of the pixel region PA, the peripheral circuit section SC, and the scribed region LA (refer to FIG. 35). That is, the support substrate SK is disposed so that the film thickness T2d of the adhesion layer 201 in the formation portion of the pad electrode 110P is thinner than the film thicknesses T11 which is the thinnest portion of the pixel region PA, the peripheral circuit section SC, and the scribed region LA.

In this manner, in the embodiment, below the pad electrode 110P where mechanical shocks are applied from above, the adhesion layer 201 is thinner than the portions of the pixel region PA and the peripheral circuit section SC in the same manner as the case of the embodiment 1. As a result, the stress, which is applied to the insulation film 110Z which is interposed between the pad electrode 110P and the adhesion layer 201 in the wiring layer 110 due to mechanical shocks from the wire bonding, is alleviated.

As such, in the embodiment, it is possible to prevent the generation of small cracks when mechanical shocks are applied as in the case of executing wiring bonding.

In addition, in the embodiment, the film thickness of the adhesion layer 201 is thinner only in the portions where mechanical shocks are applied and the film thickness of the adhesion layer 201 is thicker in other portions in the same manner as the cases of the embodiment 1. As a result, in the portions where mechanical shocks are not applied, it is possible to suppress the generation of coating irregularities and voids since the film thickness of the adhesion layer 201 is thick. Along with this, even in the portions where the film thickness of the adhesion layer 201 which mechanical shocks are applied is thin, it is possible to suppress the generation of coating irregularities and voids since the adhesion material comes around from the portion in the periphery thereof where the adhesion layer 201 is thick when coating.

Accordingly, in the embodiment, improvement in the product reliably and in the product yield and manufacturing with a high manufacturing efficiency is possible.

In particular, in the embodiment, the convex sections 111, 112, and S1 are provided in each of the surface of the wiring layer 110 which opposes the support substrate SK and the surface of the support substrate SK which opposes the wiring layer 110.

5. Other

The realizing of the present disclosure is not limited to the embodiments described above and it is possible to adopt various modifications.

In the embodiments described above, a case was described where the convex section is provided in the forming portion of the pad electrode in the surface of the wiring layer which opposes the support substrate so that the adhesion layer is thinner in the formation portion of the pad electrode than at least in the portion of the pixel region. In addition, a case was described where the convex section is provided in the forming portion of the pad electrode in the surface of the support substrate which opposes the wiring layer. Furthermore, a case was described where the convex section is provided in the forming portion of the pad electrode in both of the surface of the wiring layer described above and the surface of the support substrate described above.

Along with this, a case was described where the convex section is provided in the portion which is cut by dicing in the surface of the wiring layer which opposes the support substrate so that the adhesion layer is thinner in the portion which is cut by dicing in the scribe region than at least in the portion of the pixel region. In addition, a case was described where the convex section is provided in the portion which is cut by dicing in the surface of the support substrate which opposes the wiring layer.

Other than these cases, a convex section may be provided in the portion which is cut by dicing in both of the surface of the wiring layer described above and the surface of the support substrate described above. That is, it is possible for the operation and the effect of the present disclosure to be achieved by providing the convex section in the portion which is cut by dicing in the scribe region in at least either of the surface of the support substrate which opposes the wiring layer or the surface of the support substrate which opposes the wiring layer.

In the embodiments described above, a case was described where the wiring layer is formed by laminating three wirings in the depth direction via the insulation layers, but the present disclosure is not limited to this. The present disclosure may be applied in a case of laminating more than three wirings in the depth direction via the insulation layers, a case of laminating two wirings in the depth direction via the insulation layer, or a case of a single layer of wiring.

In the embodiments described above, a case was described where four types of the transfer transistor, the amplification transistor, the selection transistor, and the reset transistor are provided as the pixel transistors, but the present disclosure is not limited to this. For example, the present disclosure may be applied to a case where the three types of the transfer transistor, the amplification transistor, and the reset transistor are provided as the pixel transistors.

In the embodiments described above, a case was described where the transfer transistor, the amplification transistor, the selection transistor, and the reset transistor are each provided one at a time with regard to one of the photodiodes, but the present disclosure is not limited to this. For example, the present disclosure may be applied to a case where the amplification transistor, the selection transistor, and the reset transistor are each provided one at a time with regard to a plurality of the photodiodes.

In addition, in the embodiments described above, a case was described where the present disclosure is applied to a camera, but the present disclosure is not limited to this. The present disclosure may be applied to another electronic apparatus which is provided with the solid-state imaging device such as a scanner or a copier.

In addition, in the embodiments described above, a case was described of manufacturing the solid-state imaging device from a SOI substrate, but the present disclosure is not limited to this. The present disclosure may be applied to a case of manufacturing the solid-state imaging device from a semiconductor substrate which is not a SOI substrate such as a silicon substrate.

In addition, the present disclosure may be applied to a case of a CCD type image sensor other than a CMOS image sensor as necessary. Other than this, the present disclosure may be applied to a case of various semiconductor devices without being limited to the solid-state image device.

Figure 38:
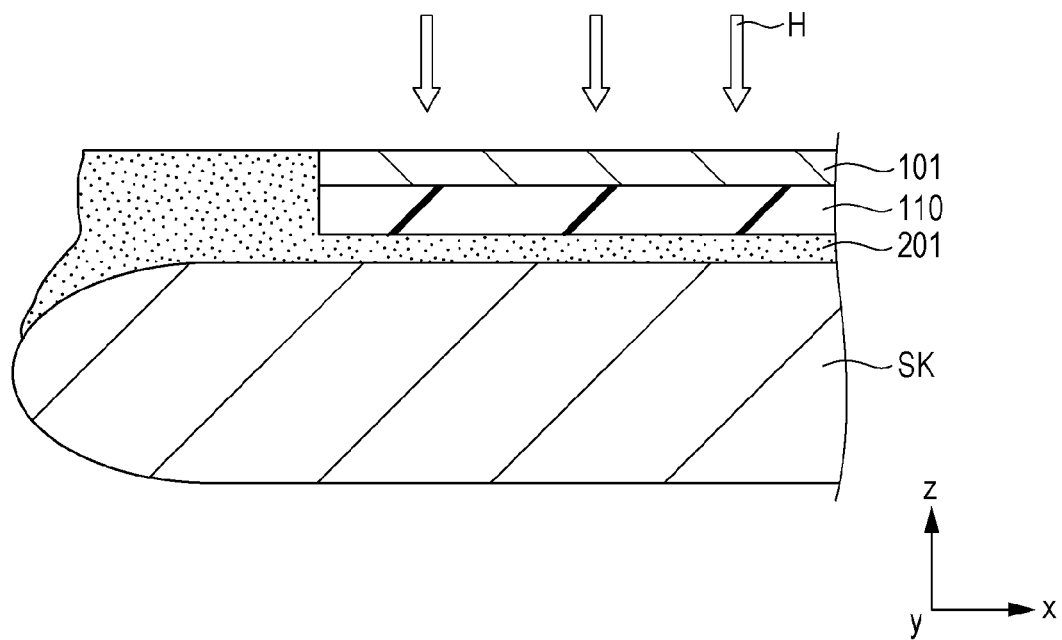
FIG. 38 is a cross-sectional diagram illustrating a partial cross section of a solid-state imaging device in the embodiments of the present disclosure.
Figure 39:
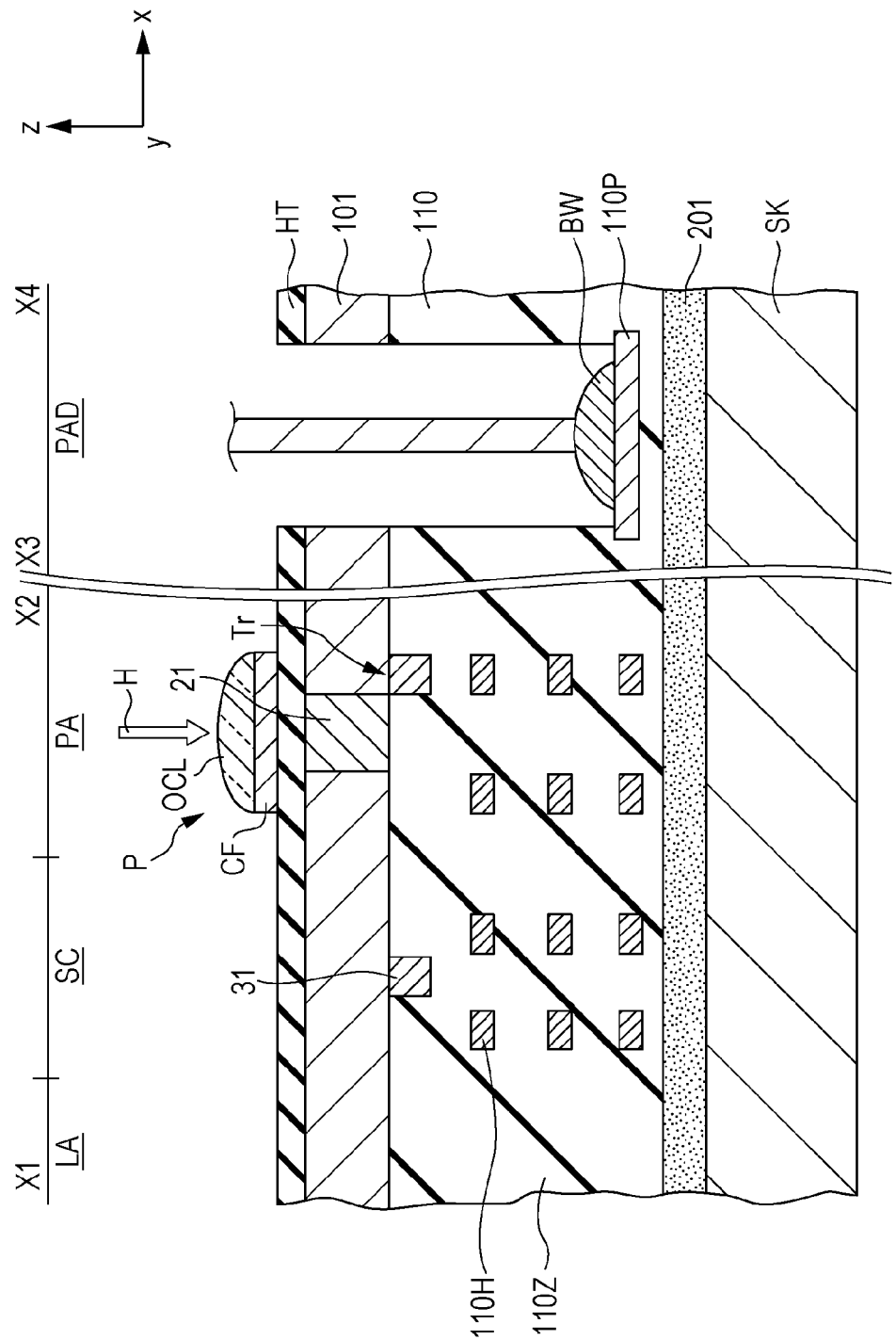
FIG. 39 is a cross-sectional diagram illustrating important parts of a CMOS type image sensor chip of a "rear surface illumination type".

FIG. 38 is a cross-sectional diagram illustrating a partial cross section of a solid-state imaging device in the embodiments of the present disclosure.

As shown in FIG. 38, there may be a configuration where the adhesion layer 201 is covered by a side surface of the semiconductor layer 101 and the wiring layer 110 which configure the solid-state imaging device 1.

In this case, for example, an edge portion of a wafer (the semiconductor layer 101) is processed as shown in FIG. 38 by a grinding process using diamond grinding before the disposing of the support substrate SK (during or before FIGS. 10 and 11) in the embodiment 1. Then, each section is formed in the same manner as the embodiment 1. Due to this, it is possible to prevent a knife edge form when removing the embedded oxide film 102 using a back grinding method in FIG. 13.

Here, in the embodiments described above, the solid-state imaging device 1 is equivalent to the solid-state imaging device and the semiconductor device of the present disclosure. In addition, in the embodiments described above, the photodiode 21 is equivalent to the photoelectric conversion element of the present disclosure. In addition, in the embodiments described above, the peripheral transistor 31 is equivalent to the semiconductor element and the peripheral transistor of the present disclosure. In addition, in the embodiments described above, the camera 40 is equivalent to the electronic apparatus of the present disclosure. In addition, in the embodiments described above, the semiconductor layer 101 is equivalent to the semiconductor layer of the present disclosure. In addition, in the embodiments described above, the wiring layer 110 is equivalent to the wiring layer of the present disclosure. In addition, in the embodiments described above, the pad electrode 110P is equivalent to the pad electrode of the present disclosure. In addition, in the embodiments described above, the convex section 111, 111b, 112, S1, and S2 are equivalent to the convex section of the present disclosure. In addition, in the embodiments described above, the adhesion layer 201 is equivalent to the adhesion layer of the present disclosure. In addition, in the embodiments described above, the bonding wire BW is equivalent to the bonding wire of the present disclosure. In addition, in the embodiments described above, the incident light H is equivalent to the incident light of the present disclosure. In addition, in the embodiments described above, the opening KK is equivalent to the opening of the present disclosure. In addition, in the embodiments described above, the scribe region LA is equivalent to the scribe region of the present disclosure. In addition, in the embodiments described above, the pixel P is equivalent to the pixel of the present disclosure. In addition, in the embodiments described above, the pixel region PA is equivalent to the pixel region of the present disclosure. In addition, in the embodiments described above, the peripheral region SA is equivalent to the peripheral region of the present disclosure. In addition, in the embodiments described above, the support substrate SK is equivalent to the support substrate of the present disclosure. In addition, in the embodiments described above, the pixel transistor Tr is equivalent to the semiconductor element and the pixel transistor of the present disclosure.

The present disclosure contains subject matter related to that disclosed in Japanese Priority Patent Application JP 2011-038836 filed in the Japan Patent Office on Feb. 24, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic apparatus comprising:
   an optical system arranged such that light is concentrated toward an imaging surface of a solid-state imaging device, the solid state imaging device comprising:
      a semiconductor layer including a photoelectric conversion element formed in a pixel region and a semiconductor element formed in a surface side opposite to a surface through which light enters;
      a wiring layer provided over a surface of the semiconductor layer so as to cover the semiconductor element;

a support substrate provided over the wiring layer at an opposite side of the semiconductor layer;

a bonding layer provided between the wiring layer and the support substrate, wherein the wiring layer includes a pad electrode and an opening formed so that a surface of the pad electrode is exposed; and first and second convex sections provided in a region where the pad electrode is formed, the first convex section provided at a surface of the wiring layer which opposes the support substrate and the second convex section provided at a surface of the support substrate which opposes the wiring layer, wherein the first and second convex sections are formed between a portion of the pad electrode and the support substrate.

2. An electronic apparatus comprising:

an optical system arranged such that light is concentrated toward an imaging surface of a solid-state imaging device, the solid-state imaging device comprising:

a semiconductor layer including a photoelectric conversion element formed in a pixel region and a semiconductor element formed in a surface side opposite to a surface through which light enters;

a wiring layer, having a first convex section, provided over a surface of the semiconductor layer so as to cover the semiconductor element;

a support substrate, having a second convex section, provided over the wiring layer at an opposite side of the semiconductor layer;

a bonding layer provided between the wiring layer and the support substrate, wherein the wiring layer includes a pad electrode and an opening formed so that a surface of the pad electrode is exposed;

wherein the first and second convex sections are provided in a region where the pad electrode is formed, the first convex section is provided at a surface of the wiring layer which opposes the support substrate, the second convex section is provided at a surface of the support substrate which opposes the wiring layer, and the first and second convex sections are formed in a same vertical plane between a portion of the pad electrode and the support substrate.

3. A semiconductor device comprising:

a semiconductor layer which has a semiconductor element formed on a surface thereof;

a wiring layer provided over a surface of the semiconductor layer so as to cover the semiconductor element;

a support substrate provided over the wiring layer at an opposite side of the semiconductor layer; and a bonding layer provided between the wiring layer and the support substrate, wherein the wiring layer includes a pad electrode and an opening formed so that a surface of the pad electrode is exposed;

wherein the first and second convex sections are provided in a region where the pad electrode is formed, the first convex section is provided at the wiring layer which opposes the support substrate, the second convex section is provided at a surface of the support substrate which opposes the wiring layer, and the first and second convex sections are formed in a same vertical plane between a portion of the pad electrode and the support substrate.

4. The solid-state imaging device according to claim 1, wherein a bonding wire is connected on a surface of the pad electrode which is exposed due to the opening.

5. The solid-state imaging device according to claim 1, wherein a pixel transistor which reads out an electrical charge which is generated by the photoelectric conversion element is formed in the pixel region as the semiconductor element, a peripheral transistor which configures a peripheral circuit which drives the pixel is formed in a peripheral region which is positioned in the periphery of the pixel region as the semiconductor element, and the bonding layer is thinner in a portion where the pad electrode is formed than in a portion where the peripheral circuit is formed in the peripheral region.

6. The solid-state imaging device according to claim 5, further comprising:

a third convex section provided in a region which is cut in a scribe region and positioned in the periphery of the peripheral region in at least either of the surface of the wiring layer which opposes the support substrate or the surface of the support substrate which opposes the wiring layer, wherein the bonding layer is thinner in the portion which is cut in the scribe region than at least in the portion of the pixel region.

7. The electronic apparatus according to claim 2, wherein a bonding wire is connected on a surface of the pad electrode which is exposed due to the opening.

8. The electronic apparatus according to claim 2, wherein a pixel transistor which reads out an electrical charge which is generated by the photoelectric conversion element is formed in the pixel region as the semiconductor element, a peripheral transistor which configures a peripheral circuit which drives the pixel is formed in a peripheral region which is positioned in the periphery of the pixel region as the semiconductor element, and the bonding layer is thinner in a portion where the pad electrode is formed than in a portion where the peripheral circuit is formed in the peripheral region.

9. The electronic apparatus according to claim 8, further comprising:

a third convex section provided in a region which is cut in a scribe region and positioned in the periphery of the peripheral region in at least either of the surface of the wiring layer which opposes the support substrate or the surface of the support substrate which opposes the wiring layer, wherein the bonding layer is thinner in the portion which is cut in the scribe region than at least in the portion of the pixel region.

10. The semiconductor device according to claim 3, wherein a bonding wire is connected on a surface of the pad electrode which is exposed due to the opening.

11. The semiconductor device according to claim 3, wherein a pixel transistor which reads out an electrical charge which is generated by the photoelectric conversion element is formed in the pixel region as the semiconductor element, a peripheral transistor which configures a peripheral circuit which drives the pixel is formed in a peripheral region which is positioned in the periphery of the pixel region as the semiconductor element, and the bonding layer is thinner in a portion where the pad electrode is formed than in a portion where the peripheral circuit is formed in the peripheral region.

12. The semiconductor device according to claim 11, further comprising:

a third convex section provided in a region which is cut in a scribe region and positioned in the periphery of the peripheral region in at least either of the surface of the wiring layer which opposes the support substrate or the surface of the support substrate which opposes the wiring layer, wherein the bonding layer is thinner in the portion which is cut in the scribe region than at least in the portion of the pixel region.

13. The solid-state imaging device according to claim 1, wherein the bonding layer comprises an adhesive.

14. The electronic apparatus according to claim 2, wherein the bonding layer comprises an adhesive.

* * * * *